(12) United States Patent
Lin et al.

(10) Patent No.: US 8,535,985 B2
(45) Date of Patent: Sep. 17, 2013

(54) METHOD OF MAKING A SEMICONDUCTOR CHIP ASSEMBLY WITH A BUMP/BASE HEAT SPREADER AND AN INVERTED CAVITY IN THE BUMP

(75) Inventors: Charles W. C. Lin, Singapore (SG); Chia-Chung Wang, Hsinchu (TW)

(73) Assignee: Bridge Semiconductor Corporation, Taipei (TW)

( * ) Notice: Subject to any disclaimer, the term of this patent is extended or adjusted under 35 U.S.C. 154(b) by 0 days.

(21) Appl. No.: 13/052,073

(22) Filed: Mar. 20, 2011

(65) Prior Publication Data

US 2011/0171785 A1    Jul. 14, 2011

Related U.S. Application Data

(60) Division of application No. 13/050,934, filed on Mar. 18, 2011, which is a continuation-in-part of application No. 12/911,729, filed on Oct. 26, 2010, now Pat. No. 8,314,438, said application No. 12/911,729 is a continuation-in-part of application No. 12/616,773, filed on Nov. 11, 2009, now Pat. No. 8,067,784, and a continuation-in-part of application No. 12/616,775, filed on Nov. 11, 2009, now abandoned, said application No. 12/616,773 is a continuation-in-part of application No. 12/616,775, which is a continuation-in-part of application No. 12/557,540, filed on Sep. 11, 2009, now Pat. No. 8,378,372, and a continuation-in-part of application No. 12/557,541, filed on Sep. 11, 2009, now Pat. No. 7,948,076, said application No. 12/557,540 is a continuation-in-part of application No. 12/557,541, which is a continuation-in-part of application No. 12/406,510, filed on Mar. 18, 2009.

(60) Provisional application No. 61/429,455, filed on Jan. 4, 2011, provisional application No. 61/350,036, filed on Jun. 1, 2010, provisional application No. 61/330,318, filed on May 1, 2010, provisional application No. 61/071,589, filed on May 7, 2008, provisional application No. 61/071,588, filed on May 7, 2008, provisional application No. 61/071,072, filed on Apr. 11, 2008, provisional application No. 61/064,748, filed on Mar. 25, 2008, provisional application No. 61/150,980, filed on Feb. 9, 2009.

(51) Int. Cl.
*H01L 21/00* (2006.01)

(52) U.S. Cl.
USPC ........................................................ 438/122

(58) Field of Classification Search
USPC ........................................................ 438/122
See application file for complete search history.

(56) References Cited

U.S. PATENT DOCUMENTS

| 3,689,993 A | 9/1972 | Tolar ............................ 438/380 |
| 3,969,199 A | 7/1976 | Berdan et al. ................. 205/177 |

(Continued)

FOREIGN PATENT DOCUMENTS

JP    2005-166775    6/2005

*Primary Examiner* — Charles Garber
*Assistant Examiner* — Ron Pompey
(74) *Attorney, Agent, or Firm* — Jackson IPG PLLC

(57) ABSTRACT

A method of making a semiconductor chip assembly includes providing a bump and a ledge, mounting an adhesive on the ledge including inserting the bump into an opening in the adhesive, mounting a conductive layer on the adhesive including aligning the bump with an aperture in the conductive layer, then flowing the adhesive between the bump and the conductive layer, solidifying the adhesive, then providing a conductive trace that includes a pad, a terminal and a selected portion of the conductive layer, then mounting a semiconductor device on the bump opposite a cavity in the bump, wherein a heat spreader includes the bump and a base that includes a portion of the ledge adjacent to the bump, electrically connecting the semiconductor device to the conductive trace and thermally connecting the semiconductor device to the heat spreader.

32 Claims, 42 Drawing Sheets

(56) References Cited

U.S. PATENT DOCUMENTS

| | | | |
|---|---|---|---|
| 4,420,767 A | 12/1983 | Hodge et al. ............... 257/713 |
| 4,509,096 A | 4/1985 | Baldwin et al. ............ 257/706 |
| 5,012,386 A | 4/1991 | McShane et al. ........... 361/386 |
| 5,102,829 A | 4/1992 | Cohn ........................... 437/217 |
| 5,379,187 A * | 1/1995 | Lee et al. .................... 361/707 |
| 5,457,605 A | 10/1995 | Wagner et al. .............. 361/720 |
| 5,543,586 A | 8/1996 | Crane, Jr. et al. ........... 174/262 |
| 5,644,163 A * | 7/1997 | Tsuji ............................. 257/706 |
| 5,991,156 A | 11/1999 | Bond et al. .................. 361/707 |
| 6,057,601 A | 5/2000 | Lau et al. ..................... 257/738 |
| 6,107,683 A | 8/2000 | Castro et al. ................ 257/700 |
| 6,160,705 A | 12/2000 | Stearns et al. ............... 361/704 |
| 6,162,664 A | 12/2000 | Kim .............................. 438/126 |
| 6,281,568 B1 | 8/2001 | Glenn et al. ................. 257/684 |
| 6,297,959 B1 * | 10/2001 | Ueno et al. .................. 361/704 |
| 6,313,525 B1 | 11/2001 | Sasano .......................... 257/704 |
| 6,453,549 B1 | 9/2002 | Bhatt et al. ..................... 29/837 |
| 6,495,914 B1 | 12/2002 | Sekine et al. ................ 257/723 |
| 6,498,355 B1 | 12/2002 | Harrah et al. ................... 257/99 |
| 6,507,102 B2 | 1/2003 | Juskey et al. ................ 257/406 |
| 6,528,882 B2 | 3/2003 | Ding et al. ................... 257/738 |
| 6,541,832 B2 | 4/2003 | Coyle ........................... 257/415 |
| 6,583,444 B2 | 6/2003 | Fjelstad .......................... 257/82 |
| 6,603,209 B1 | 8/2003 | DiStefano et al. ........... 257/781 |
| 6,608,376 B1 | 8/2003 | Liew et al. ................... 257/698 |
| 6,625,028 B1 | 9/2003 | Dove et al. ................... 361/707 |
| 6,670,219 B2 | 12/2003 | Lee et al. ..................... 438/107 |
| 6,683,795 B1 | 1/2004 | Yoo ............................... 361/816 |
| 6,720,651 B2 * | 4/2004 | Gaku et al. ................... 257/707 |
| 6,744,135 B2 | 6/2004 | Hasebe et al. ............... 257/712 |
| 6,861,750 B2 | 3/2005 | Zhao et al. ................... 257/739 |
| 6,885,033 B2 | 4/2005 | Andrews ........................ 257/79 |
| 6,900,535 B2 | 5/2005 | Zhao ............................. 257/707 |
| 6,906,414 B2 | 6/2005 | Zhao et al. ................... 257/707 |
| 6,936,855 B1 | 8/2005 | Harrah ............................ 257/88 |
| 6,964,877 B2 | 11/2005 | Chen et al. ..................... 438/20 |
| 7,009,286 B1 | 3/2006 | Kirloskar et al. ............ 257/684 |
| 7,038,311 B2 * | 5/2006 | Woodall et al. .............. 257/706 |
| 7,196,403 B2 | 3/2007 | Karim ........................... 257/675 |
| 7,202,559 B2 | 4/2007 | Zhao et al. ................... 257/707 |
| 7,335,522 B2 | 2/2008 | Wang et al. .................... 438/26 |
| 7,470,935 B2 | 12/2008 | Lee et al. ........................ 257/98 |
| 7,495,322 B2 | 2/2009 | Hashimoto et al. .......... 257/676 |
| 7,582,951 B2 | 9/2009 | Zhao et al. ................... 257/660 |
| 7,642,137 B2 | 1/2010 | Lin et al. ...................... 438/127 |
| 7,679,172 B2 | 3/2010 | Huang et al. ................. 257/678 |
| 7,690,817 B2 | 4/2010 | Sanpei et al. ................ 362/294 |
| 7,741,158 B2 | 6/2010 | Leung et al. ................. 438/122 |
| 7,781,266 B2 | 8/2010 | Zhao et al. ................... 438/123 |
| 7,808,087 B2 | 10/2010 | Zhao et al. ................... 257/670 |
| 7,812,360 B2 | 10/2010 | Yano ............................... 257/98 |
| 7,956,372 B2 | 6/2011 | Kamada et al. ................ 257/98 |
| 8,030,676 B2 | 10/2011 | Lin .................................. 257/99 |
| 8,034,645 B2 * | 10/2011 | Lin et al. ........................ 438/26 |
| 8,071,998 B2 | 12/2011 | Chen ............................... 257/99 |
| 2003/0189830 A1 | 10/2003 | Sugimoto et al. ............ 362/294 |
| 2004/0061433 A1 | 4/2004 | Izuno et al. .................. 313/498 |
| 2004/0065894 A1 | 4/2004 | Hashimoto et al. .......... 257/100 |
| 2005/0024834 A1 | 2/2005 | Newby .......................... 361/719 |
| 2005/0135105 A1 | 6/2005 | Teixeira et al. .............. 362/294 |
| 2005/0185880 A1 | 8/2005 | Asai ................................. 385/14 |
| 2005/0274959 A1 | 12/2005 | Kim et al. ....................... 257/79 |
| 2006/0012967 A1 | 1/2006 | Asai et al. .................... 361/764 |
| 2006/0054915 A1 | 3/2006 | Chang ........................... 257/100 |
| 2006/0109632 A1 | 5/2006 | Berlin et al. ................. 361/719 |
| 2006/0131735 A1 * | 6/2006 | Ong et al. ..................... 257/706 |
| 2007/0063213 A1 | 3/2007 | Hsieh et al. .................... 257/99 |
| 2007/0077416 A1 | 4/2007 | Ito et al. ........................ 428/339 |
| 2007/0090522 A1 | 4/2007 | Alhayek et al. .............. 257/723 |
| 2007/0252166 A1 | 11/2007 | Chang et al. ................... 257/98 |
| 2007/0267642 A1 | 11/2007 | Erchak et al. .................. 257/98 |
| 2007/0290322 A1 | 12/2007 | Zhao et al. ................... 257/690 |
| 2008/0019133 A1 | 1/2008 | Kim et al. .................... 362/294 |
| 2008/0099770 A1 | 5/2008 | Mendendorp et al. ......... 257/79 |
| 2008/0102631 A1 | 5/2008 | Andryushchenko et al. .. 438/686 |
| 2008/0128739 A1 * | 6/2008 | Sanpei et al. ................... 257/99 |
| 2008/0173884 A1 | 7/2008 | Chitnis et al. .................. 257/98 |
| 2008/0180824 A1 | 7/2008 | Endoh et al. ................. 359/894 |
| 2009/0309213 A1 | 12/2009 | Takahashi et al. ........... 257/707 |
| 2010/0149756 A1 | 6/2010 | Rowcliffe et al. ............ 361/714 |
| 2010/0291737 A1 | 11/2010 | Ikeguchi et al. ............. 438/108 |
| 2011/0133204 A1 | 6/2011 | Lai .................................. 257/76 |

\* cited by examiner

METHOD OF MAKING A SEMICONDUCTOR CHIP ASSEMBLY WITH A BUMP/BASE HEAT SPREADER AND AN INVERTED CAVITY IN THE BUMP

CROSS-REFERENCE TO RELATED APPLICATIONS

This application is a divisional of U.S. application Ser. No. 13/050,934 filed Mar. 18, 2011, which is a continuation-in-part of U.S. application Ser. No. 12/911,729 filed Oct. 26, 2010 now U.S. Pat. No. 8,314,438, which is incorporated by reference. U.S. application Ser. No. 13/050,934 filed Mar. 18, 2011 also claims the benefit of U.S. Provisional Application Ser. No. 61/429,455 filed Jan. 4, 2011, which is incorporated by reference.

U.S. application Ser. No. 12/911,729 filed Oct. 26, 2010 is a continuation-in-part of U.S. application Ser. No. 12/616,773 filed Nov. 11, 2009 now U.S. Pat. No. 8,067,784 and a continuation-in-part of U.S. application Ser. No. 12/616,775 filed Nov. 11, 2009 now abandoned, each of which is incorporated by reference. U.S. application Ser. No. 12/911,729 filed Oct. 26, 2010 also claims the benefit of U.S. Provisional Application Ser. No. 61/350,036 filed Jun. 1, 2010 and U.S. Provisional Application Ser. No. 61/330,318 filed May 1, 2010, each of which is incorporated by reference.

U.S. application Ser. No. 12/616,773 filed Nov. 11, 2009 and U.S. application Ser. No. 12/616,775 filed Nov. 11, 2009 are each a continuation-in-part of U.S. application Ser. No. 12/557,540 filed Sep. 11, 2009 now U.S. Pat. No. 8,378,372 and a continuation-in-part of U.S. application Ser. No. 12/557,541 filed Sep. 11, 2009 now U.S. Pat. No. 7,948,076.

U.S. application Ser. No. 12/557,540 filed Sep. 11, 2009 and U.S. application Ser. No. 12/557,541 filed Sep. 11, 2009 are each a continuation-in-part of U.S. application Ser. No. 12/406,510 filed Mar. 18, 2009, which claims the benefit of U.S. Provisional Application Ser. No. 61/071,589 filed May 7, 2008, U.S. Provisional Application Ser. No. 61/071,588 filed May 7, 2008, U.S. Provisional Application Ser. No. 61/071,072 filed Apr. 11, 2008, and U.S. Provisional Application Ser. No. 61/064,748 filed Mar. 25, 2008, each of which is incorporated by reference. U.S. application Ser. No. 12/557,540 filed Sep. 11, 2009 and U.S. application Ser. No. 12/557,541 filed Sep. 11, 2009 also claim the benefit of U.S. Provisional Application Ser. No. 61/150,980 filed Feb. 9, 2009, which is incorporated by reference.

BACKGROUND OF THE INVENTION

1. Field of the Invention

The present invention relates to semiconductor chip assembly, and more particularly to a semiconductor chip assembly with a semiconductor device, a conductive trace, an adhesive and a heat spreader and its method of manufacture.

2. Description of the Related Art

Semiconductor devices such as packaged and unpackaged semiconductor chips have high voltage, high frequency and high performance applications that require substantial power to perform the specified functions. As the power increases, the semiconductor device generates more heat. Furthermore, the heat build-up is aggravated by higher packing density and smaller profile sizes which reduce the surface area to dissipate the heat.

Semiconductor devices are susceptible to performance degradation as well as short life span and immediate failure at high operating temperatures. The heat not only degrades the chip, but also imposes thermal stress on the chip and surrounding elements due to thermal expansion mismatch. As a result, the heat must be dissipated rapidly and efficiently from the chip to ensure effective and reliable operation. A high thermal conductivity path typically requires heat conduction and heat spreading to a much larger surface area than the chip or a die pad it is mounted on.

Light emitting diodes (LEDs) have recently become popular alternatives to incandescent, fluorescent and halogen light sources. LEDs provide energy efficient, cost effective, long term lighting for medical, military, signage, signal, aircraft, maritime, automotive, portable, commercial and residential applications. For instance, LEDs provide light sources for lamps, flashlights, headlights, flood lights, traffic lights and displays.

LEDs include high power chips that generate high light output and considerable heat. Unfortunately, LEDs exhibit color shifts and low light output as well as short lifetimes and immediate failure at high operating temperatures. Furthermore, LED light output and reliability are constrained by heat dissipation limits. LEDs underscore the critical need for providing high power chips with adequate heat dissipation.

LED packages usually include an LED chip, a submount, electrical contacts and a thermal contact. The submount is thermally connected to and mechanically supports the LED chip. The electrical contacts are electrically connected to the anode and cathode of the LED chip. The thermal contact is thermally connected to the LED chip by the submount but requires adequate heat dissipation by the underlying carrier to prevent the LED chip from overheating.

Packages and thermal boards for high power chips have been developed extensively in the industry with a wide variety of designs and manufacturing techniques in attempts to meet performance demands in an extremely cost-competitive environment.

Plastic ball grid array (PBGA) packages have a chip and a laminated substrate enclosed in a plastic housing and are attached to a printed circuit board (PCB) by solder balls. The laminated substrate includes a dielectric layer that often includes fiberglass. The heat from the chip flows through the plastic and the dielectric layer to the solder balls and then the PCB. However, since the plastic and the dielectric layer typically have low thermal conductivity, the PBGA provides poor heat dissipation.

Quad-Flat-No Lead (QFN) packages have the chip mounted on a copper die pad which is soldered to the PCB. The heat from the chip flows through the die pad to the PCB. However, since the lead frame type interposer has limited routing capability, the QFN package cannot accommodate high input/output (I/O) chips or passive elements.

Thermal boards provide electrical routing, thermal management and mechanical support for semiconductor devices. Thermal boards usually include a substrate for signal routing, a heat spreader or heat sink for heat removal, pads for electrical connection to the semiconductor device and terminals for electrical connection to the next level assembly. The substrate can be a laminated structure with single layer or multi-layer routing circuitry and one or more dielectric layers. The heat spreader can be a metal base, a metal slug or an embedded metal layer.

Thermal boards interface with the next level assembly. For instance, the next level assembly can be a light fixture with a printed circuit board and a heat sink. In this instance, an LED package is mounted on the thermal board, the thermal board is mounted on the heat sink, the thermal board/heat sink subassembly and the printed circuit board are mounted in the light fixture and the thermal board is electrically connected to the printed circuit board by wires. The substrate routes electrical signals to the LED package from the printed circuit board and the heat spreader spreads and transfers heat from the LED package to the heat sink. The thermal board thus provides a critical thermal path for the LED chip.

U.S. Pat. No. 6,507,102 to Juskey et al. discloses an assembly in which a composite substrate with fiberglass and cured thermosetting resin includes a central opening, a heat slug with a square or rectangular shape resembling the central opening is attached to the substrate at sidewalls of the central opening, top and bottom conductive layers are attached to the top and bottom of the substrate and electrically connected to one another by plated through-holes through the substrate, a chip is mounted on the heat slug and wire bonded to the top conductive layer, an encapsulant is molded on the chip and solder balls are placed on the bottom conductive layer.

During manufacture, the substrate is initially a prepreg with B-stage resin placed on the bottom conductive layer, the heat slug is inserted into the central opening and on the bottom conductive layer and spaced from the substrate by a gap, the top conductive layer is mounted on the substrate, the conductive layers are heated and pressed towards one another so that the resin melts, flows into the gap and solidifies, the conductive layers are patterned to form circuit traces on the substrate and expose the excess resin flash on the heat slug, and the excess resin flash is removed to expose the heat slug. The chip is then mounted on the heat slug, wire bonded and encapsulated.

The heat flows from the chip through the heat slug to the PCB. However, manually dropping the heat slug into the central opening is prohibitively cumbersome and expensive for high volume manufacture. Furthermore, since the heat slug is difficult to accurately position in the central opening due to tight lateral placement tolerance, voids and inconsistent bond lines arise between the substrate and the heat slug. The substrate is therefore partially attached to the heat slug, fragile due to inadequate support by the heat slug and prone to delamination. In addition, the wet chemical etch that removes portions of the conductive layers to expose the excess resin flash also removes portions of the heat slug exposed by the excess resin flash. The heat slug is therefore non-planar and difficult to bond to. As a result, the assembly suffers from high yield loss, poor reliability and excessive cost.

U.S. Pat. No. 6,528,882 to Ding et al. discloses a thermal enhanced ball grid array package in which the substrate includes a metal core layer. The chip is mounted on a die pad region at the top surface of the metal core layer, an insulating layer is formed on the bottom surface of the metal core layer, blind vias extend through the insulating layer to the metal core layer, thermal balls fill the blind vias and solder balls are placed on the substrate and aligned with the thermal balls. The heat from the chip flows through the metal core layer to the thermal balls to the PCB. However, the insulating layer sandwiched between the metal core layer and the PCB limits the heat flow to the PCB.

U.S. Pat. No. 6,670,219 to Lee et al. discloses a cavity down ball grid array (CDBGA) package in which a ground plate with a central opening is mounted on a heat spreader to form a thermal dissipating substrate. A substrate with a central opening is mounted on the ground plate using an adhesive with a central opening. A chip is mounted on the heat spreader in a cavity defined by the central opening in the ground plate and solder balls are placed on the substrate. However, since the solder balls extend above the substrate, the heat spreader does not contact the PCB. As a result, the heat spreader releases the heat by thermal convection rather than thermal conduction which severely limits the heat dissipation.

U.S. Pat. No. 7,038,311 to Woodall et al. discloses a thermal enhanced BGA package in which a heat sink with an inverted T-like shape includes a pedestal and an expanded base, a substrate with a window opening is mounted on the expanded base, an adhesive attaches the pedestal and the expanded base to the substrate, a chip is mounted on the pedestal and wire bonded to the substrate, an encapsulant is molded on the chip and solder balls are placed on the substrate. The pedestal extends through the window opening, the substrate is supported by the expanded base and the solder balls are located between the expanded base and the perimeter of the substrate. The heat from the chip flows through the pedestal to the expanded base to the PCB. However, since the expanded base must leave room for the solder balls, the expanded base protrudes below the substrate only between the central window and the innermost solder ball. Consequently, the substrate is unbalanced and wobbles and warps during manufacture. This creates enormous difficulties with chip mounting, wire bonding and encapsulant molding. Furthermore, the expanded base may be bent by the encapsulant molding and may impede soldering the package to the next level assembly as the solder balls collapse. As a result, the package suffers from high yield loss, poor reliability and excessive cost.

U.S. Patent Application Publication No. 2007/0267642 to Erchak et al. discloses a light emitting device assembly in which a base with an inverted T-like shape includes a substrate, a protrusion and an insulative layer with an aperture, electrical contacts are mounted on the insulative layer, a package with an aperture and a transparent lid is mounted on the electrical contacts and an LED chip is mounted on the protrusion and wire bonded to the substrate. The protrusion is adjacent to the substrate and extends through the apertures in the insulative layer and the package into the package, the insulative layer is mounted on the substrate, the electrical contacts are mounted on the insulative layer and the package is mounted on the electrical contacts and spaced from the insulative layer. The heat from the chip flows through the protrusion to the substrate to a heat sink. However, the electrical contacts are difficult to mount on the insulating layer, difficult to electrically connect to the next level assembly and fail to provide multi-layer routing.

Conventional packages and thermal boards thus have major deficiencies. For instance, dielectrics with low thermal conductivity such as epoxy limit heat dissipation, whereas dielectrics with higher thermal conductivity such as epoxy filled with ceramic or silicon carbide have low adhesion and are prohibitively expensive for high volume manufacture. The dielectric may delaminate during manufacture or prematurely during operation due to the heat. The substrate may have single layer circuitry with limited routing capability or multi-layer circuitry with thick dielectric layers which reduce heat dissipation. The heat spreader may be inefficient, cumbersome or difficult to thermally connect to the next level assembly. The manufacturing process may be unsuitable for low cost, high volume manufacture.

In view of the various development stages and limitations in currently available packages and thermal boards for high power semiconductor devices, there is a need for a semiconductor chip assembly that is cost effective, reliable, manufacturable, versatile, provides flexible signal routing and has excellent heat spreading and dissipation.

SUMMARY OF THE INVENTION

The present invention provides a semiconductor chip assembly that includes a semiconductor device, a heat spreader, a conductive trace and an adhesive. The heat spreader includes a bump and a base. The conductive trace includes a pad and a terminal. The semiconductor device is mounted on the bump opposite a cavity in the bump, is electrically connected to the conductive trace and is thermally connected to the bump. The bump extends from the base into an opening in the adhesive and the base extends laterally from the bump. The conductive trace is located outside the cavity and provides signal routing between the pad and the terminal.

In accordance with an aspect of the present invention, a semiconductor chip assembly includes a semiconductor device, an adhesive, a heat spreader and a conductive trace. The adhesive includes an opening. The heat spreader includes a bump and a base, wherein (i) the bump is adjacent to and integral with the base and extends from the base in a first vertical direction, (ii) the base extends laterally from the bump in lateral directions orthogonal to the first vertical direction, and (iii) a cavity in the bump is covered by the bump in the first vertical direction and is not covered by the bump in a second vertical direction opposite the first vertical direction. The conductive trace includes a pad and a terminal.

The semiconductor device is mounted on the bump, extends beyond the bump in the first vertical direction, is located outside the cavity, extends laterally within a periphery of the cavity, is electrically connected to the pad and thereby electrically connected to the terminal, and is thermally connected to the bump and thereby thermally connected to the base. The adhesive contacts the bump and the base and extends laterally from the bump to or beyond the terminal. The conductive trace is located outside the cavity. The bump and the cavity extend into the opening.

In accordance with another aspect of the present invention, a semiconductor chip assembly includes a semiconductor device, an adhesive, a heat spreader and a conductive trace. The adhesive includes an opening. The heat spreader includes a bump, a base and a cap, wherein (i) the bump is adjacent to and integral with the base, extends from the base in a first vertical direction, is adjacent to the cap and extends from the cap in a second vertical direction opposite the first vertical direction, (ii) the base extends laterally from the bump in lateral directions orthogonal to the vertical directions, (iii) the cap covers the bump in the first vertical direction and extends laterally from the bump, and (iv) a cavity in the bump is covered by the bump in the first vertical direction, is not covered by the bump in the second vertical direction, is spaced from the cap by the bump and extends across most of the bump in the vertical and lateral directions. The conductive trace includes a pad and a terminal.

The semiconductor device is mounted on the cap, extends beyond the cap in the first vertical direction, is located outside the cavity, extends laterally within a periphery of the cavity, is electrically connected to the pad and thereby electrically connected to the terminal, and is thermally connected to the bump and thereby thermally connected to the base. The adhesive contacts the bump, the base and the cap, is sandwiched between the base and the pad and between the base and the cap and extends laterally from the bump to or beyond the terminal. The conductive trace is located outside the cavity. The bump and the cavity extend into the opening.

In accordance with another aspect of the present invention, a semiconductor chip assembly includes a semiconductor device, an adhesive, a heat spreader, a substrate and a conductive trace. The adhesive includes an opening. The heat spreader includes a bump, a base and a cap, wherein (i) the bump is adjacent to and integral with the base, extends from the base in a first vertical direction, is adjacent to the cap and extends from the cap in a second vertical direction opposite the first vertical direction, (ii) the base extends laterally from the bump in lateral directions orthogonal to the vertical directions, (iii) the cap covers the bump in the first vertical direction and extends laterally from the bump, and (iv) a cavity in the bump is covered by the bump in the first vertical direction, is not covered by the bump in the second vertical direction, is spaced from the cap by the bump and extends across most of the bump in the vertical and lateral directions. The substrate includes a dielectric layer, and an aperture extends through the substrate. The conductive trace includes a pad and a terminal.

The semiconductor device is mounted on the cap, extends beyond the cap in the first vertical direction, is located outside the cavity, extends laterally within a periphery of the cavity, is electrically connected to the pad and thereby electrically connected to the terminal, and is thermally connected to the bump and thereby thermally connected to the base. The adhesive contacts the bump, the base, the cap and the dielectric layer, is spaced from the pad, is sandwiched between the bump and the dielectric layer, between the base and the pad, between the base and the cap and between the base and the dielectric layer and extends laterally from the bump to or beyond the terminal. The substrate is mounted on the adhesive and the dielectric layer contacts the pad and the cap and is spaced from bump and the base. The conductive trace is located outside the cavity. The bump and the cavity extend into the opening and the aperture, the bump extends beyond the aperture in the vertical directions and the cap covers the opening and the aperture in the first vertical direction.

The semiconductor device can be mounted on the bump outside the cavity and extend laterally within the peripheries of the bump and the cavity. For instance, the semiconductor device can be mounted on the pad and the cap, extend beyond the pad and the cap in the first vertical direction, be electrically connected to the pad using a first solder joint and be thermally connected to the cap using a second solder joint. In this instance, the semiconductor device can extend laterally within and outside a periphery of the conductive trace and laterally within and outside the peripheries of the bump and the cavity. Alternatively, the semiconductor device can be mounted on the cap but not the pad, extend beyond the pad and the cap in the first vertical direction, be electrically connected to the pad using a wire bond and be thermally connected to the cap using a die attach. In this instance, the semiconductor device can be located outside a periphery of the conductive trace, be located within the peripheries of the bump and the cavity and be covered by the bump and the cavity in the second vertical direction. In this instance, the semiconductor device can also be located outside a periphery of the conductive trace, extend laterally within and outside the peripheries of the bump and the cavity and cover or not cover the bump and the cavity in the first vertical direction. In this instance, the semiconductor device can also be located outside a periphery of the conductive trace, be located within the periphery of the bump, extend laterally within and outside the periphery of the cavity, cover the cavity in the first vertical direction and be covered by the bump in the second vertical direction. In any case, the semiconductor device is mounted on the bump outside the cavity and extends laterally within a periphery of the cavity.

The semiconductor device can be a packaged or unpackaged semiconductor chip. For instance, the semiconductor device can be an LED package that includes an LED chip, is mounted on the pad and the cap, extends beyond the pad and the cap in the first vertical direction, is electrically connected to the pad using a first solder joint and is thermally connected to the cap using a second solder joint. Alternatively, the semiconductor device can be a semiconductor chip such as an LED chip that is mounted on the cap but not the pad, extends beyond the pad and the cap in the first vertical direction, is electrically connected to the pad using a wire bond and is thermally connected to the cap using a die attach.

The adhesive can contact the bump and the dielectric layer in a gap in the aperture between the bump and the substrate and contact the base, the cap and the dielectric layer outside the gap. The adhesive can also contact and be sandwiched between the bump and the base, between the bump and the cap, between the bump and the dielectric layer and between the base and the dielectric layer. The adhesive can also cover the base outside the bump in the first vertical direction, cover the substrate in the second vertical direction and cover and surround a sidewall of the bump in the lateral directions. The adhesive can also conformally coat the sidewall of the bump, a surface portion of the base that is adjacent to and extends laterally from the bump and faces in the first vertical direction and a surface of the dielectric layer that faces in the second vertical direction. The adhesive can also fill the space between the bump and the dielectric layer, between the base and the cap and between the base and the substrate.

The adhesive can extend laterally from the bump to or beyond the terminal. For instance, the adhesive and the terminal can extend to peripheral edges of the assembly. In this instance, the adhesive extends laterally from the bump to the terminal. Alternatively, the adhesive can extend to peripheral edges of the assembly and the terminal can be spaced from the peripheral edges of the assembly. In this instance, the adhesive extends laterally from the bump beyond the terminal.

The adhesive alone can intersect an imaginary horizontal line between the bump and the cap, an imaginary horizontal line between the bump and the dielectric layer, an imaginary horizontal line between the bump and a plated through-hole, an imaginary horizontal line between the bump and a peripheral edge of the assembly, an imaginary vertical line between the base and the cap and an imaginary vertical line between the base and the dielectric layer. The adhesive alone can also intersect an imaginary vertical line between the base and the pad and an imaginary vertical line between the base and the terminal if the dielectric layer is omitted.

The bump can be integral with the base. For instance, the bump and the base can be a single-piece metal or include a single-piece metal at their interface, and the single-piece metal can be copper. The bump can also be coplanar with the adhesive at the cap. The bump can also contact the adhesive, be spaced from the dielectric layer, extend into the opening and the aperture and extend beyond the aperture in the vertical directions.

The bump can include a first bent corner as it extends to the base and a second bent corner as it extends to the cap. The bump can also be bent laterally outward about 90 degrees adjacent to the base and bent laterally inward about 90 degrees adjacent to the cap. The bump can also have an irregular thickness characteristic of stamping. The bump can also have a larger diameter at the base than at the cap. For instance, the bump can have a cut-off conical or pyramidal shape in which its diameter decreases as it extends in the first vertical direction from the base to the cap. Alternatively, the bump can have a cylindrical or rectangular prism shape with a constant diameter as it extends in the first vertical direction from the base to the cap.

The cavity can have a cut-off conical or pyramidal shape in which its diameter decreases as it extends in the first vertical direction towards the cap. Alternatively, the cavity can have a cylindrical or rectangular prism shape with a constant diameter as it extends in the first vertical direction towards the cap.

The cavity can also have a circular, square or rectangular periphery and circular, square or rectangular entrance. The cavity can also conform to the shape of the bump, extend into the opening and the aperture and extend across most of the bump in the vertical and lateral directions.

The cavity can be exposed or covered in the second vertical direction. For instance, the cavity can be hollow and unsealed. In this instance, the cavity can be exposed in the second vertical direction and expose the bump in the second vertical direction. Alternatively, the cavity can contain a filler such as epoxy, polyimide or solder that contacts the bump, extends across most of the bump in the vertical and lateral directions, is confined to the cavity and fills most or all of the cavity. For instance, the cavity can be unsealed and the filler can be essentially coplanar with the base and exposed in the second vertical direction. As another instance, the cavity can be sealed by the base and the filler can contact and be enclosed by the bump and the base and covered by the base in the second vertical direction.

The base can support the bump, the substrate and the adhesive, extend laterally beyond the cap and extend to or be spaced from the peripheral edges of the assembly. The base can also contact the adhesive, be spaced from the substrate and extend beyond the adhesive and the substrate in the second vertical direction. The base can also cover the conductive trace and the substrate in the second vertical direction.

The cap can have a uniform or non-uniform thickness. For instance, the cap can have a uniform thickness and be spaced from the conductive layer and the dielectric layer. In this instance, the cap can extend laterally from the bump to the adhesive but not to the conductive layer or the dielectric layer and cover the opening but not the aperture in the first vertical direction. Alternatively, the cap can have a first thickness where it is adjacent to the bump, a second thickness where it is adjacent to the dielectric layer that is larger than the first thickness and a flat surface that faces in the first vertical direction. In this instance, the cap can contact the adhesive and the dielectric layer, have the first thickness where it is adjacent to the adhesive and spaced from the dielectric layer and the second thickness where contacts the dielectric layer and is closest to the pad and cover the opening and the aperture in the first vertical direction. The cap can also be spaced from the peripheral edges of the assembly and provide a die paddle for the semiconductor device.

The cap can have a rectangular or square shape and the bump can have a circular shape. In this instance, the cap can be sized and shaped to accommodate a thermal contact surface of the semiconductor device whereas the bump is not sized and shaped to accommodate the thermal contact surface of the semiconductor device. In any case, the cap is thermally connected to the base by the bump.

The heat spreader can consist of the bump, the base and the cap. The heat spreader can also consist essentially of copper, aluminum or copper/nickel/aluminum. The heat spreader can also consist of a buried copper, aluminum or copper/nickel/aluminum core and plated surface contacts that consist of gold, silver and/or nickel. In any case, the heat spreader provides heat dissipation and spreading from the semiconductor device to the next level assembly.

The substrate can contact the cap and be spaced from the bump and the base. The substrate can also be a laminated structure. The substrate can also include the pad and include or exclude the terminal.

The pad and the cap can have the same thickness where closest to one another, have different thickness where the cap is adjacent to the bump and be coplanar with one another at a surface that faces in the first vertical direction.

The pad and the terminal can have the same thickness and be coplanar with one another at a surface that faces in the first vertical direction. Alternatively, the base and the terminal can have the same thickness and be coplanar with one another at a surface that faces in the second vertical direction.

The conductive trace can contact or be spaced from the adhesive. For instance, the pad and the terminal can contact the adhesive and extend beyond the adhesive in the first vertical direction. In this instance, the pad and the terminal can have the same thickness and be coplanar with one another. Likewise, the pad can contact the adhesive and extend beyond the adhesive in the first vertical direction and the terminal can contact the adhesive and extend beyond the adhesive in the second vertical direction. In this instance, the base and the terminal can have the same thickness and be coplanar with one another. Alternatively, the pad and the terminal can contact the dielectric layer, be spaced from the adhesive and extend beyond the adhesive and the dielectric layer in the first direction. In this instance, the pad and the terminal can have the same thickness and be coplanar with one another. As another alternative, the pad can contact the dielectric layer, be spaced from the adhesive and extend beyond the adhesive and the dielectric layer in the first vertical direction and the terminal can contact the adhesive, be spaced from the dielectric layer and extend beyond the adhesive and the dielectric layer in the second vertical direction. In this instance, the base and the terminal can have the same thickness and be coplanar with one another.

The conductive trace can contact or be spaced from the adhesive. For instance, the pad and the terminal can contact the adhesive and extend beyond the adhesive in the first vertical direction. In this instance, the pad and the terminal can have the same thickness and be coplanar with one another Likewise, the pad can contact the adhesive and extend beyond the adhesive in the first vertical direction and the terminal can contact the adhesive and extend beyond the adhesive in the second vertical direction. In this instance, the base and the terminal can have the same thickness and be coplanar with one another. Alternatively, the pad and the terminal can contact the dielectric layer, be spaced from the adhesive and extend beyond the adhesive and the dielectric layer in the first vertical direction. In this instance, the pad and the terminal can have the same thickness and be coplanar with one another. As another alternative, the pad can contact the dielectric layer, be spaced from the adhesive and extend beyond the adhesive and the dielectric layer in the first vertical direction and the terminal can contact the adhesive, be spaced from the dielectric layer and extend beyond the adhesive and the dielectric layer in the second vertical direction. In this instance, the base and the terminal can have the same thickness and be coplanar with one another.

The conductive trace can consist essentially of copper. The conductive trace can also consist of a buried copper core and plated surface contacts that consist of gold, silver and/or nickel. In any case, the conductive trace provides signal routing between the pad and the terminal.

The pad can be an electrical contact for the semiconductor device, the terminal can be an electrical contact for the next level assembly, and the pad and the terminal can provide signal routing between the semiconductor device and the next level assembly.

The base, the cap, the pad and the terminal can be the same metals. For instance, the base, the cap, the pad and the terminal can include a gold, silver or nickel surface layer and a buried copper core and be primarily copper and the bump, the routing line and the plated through-hole can be primarily or entirely copper. In this instance, a plated contact can include a gold or silver surface layer and a buried nickel layer that contacts and is sandwiched between the surface layer and the buried copper core or a nickel surface layer that contacts the buried copper core.

The heat spreader can include a copper core shared by the bump, the base and the cap and the conductive trace can include a copper core shared by the pad and the terminal. For instance, the heat spreader can include a gold, silver or nickel surface layer at the base and the cap, a buried copper core at the bump, the base and the cap and be primarily copper. In this instance, the base can include a plated contact as its surface layer, the cap can include a plated contact as its surface layer and the bump can be copper or include a plated contact as its surface layer at the cavity Likewise, the conductive trace can include a gold, silver or nickel surface layer at the pad and the terminal, a buried copper core at the pad and the terminal and be primarily copper. In this instance, the pad can include a plated contact as its surface layer and the terminal can include a plated contact as its surface layer.

The assembly can include an encapsulant that covers the semiconductor device in the first vertical direction. For instance, the encapsulant can be a color-shifting encapsulant that contacts an LED chip, a wire bond and a die attach and converts blue light emitted by the LED chip into white light. In this instance, the assembly can include a transparent encapsulant that contacts the color-shifting encapsulant and covers the color-shifting encapsulant in the first vertical direction. Furthermore, the color-shifting encapsulant can include silicone and phosphor and the transparent encapsulant can include silicone and exclude phosphor.

The assembly can be a first-level or second-level single-chip or multi-chip device. For instance, the assembly can be a first-level package that contains a single chip or multiple chips. Alternatively, the assembly can be a second-level module that contains a single LED package or multiple LED packages, and each LED package can contain a single LED chip or multiple LED chips.

The present invention provides a method of making a semiconductor chip assembly that includes providing a bump and a ledge, mounting an adhesive on the ledge including inserting the bump into an opening in the adhesive, mounting a conductive layer on the adhesive including aligning the bump with an aperture in the conductive layer, then flowing the adhesive between the bump and the conductive layer, solidifying the adhesive, then providing a conductive trace that includes a pad, a terminal and a selected portion of the conductive layer, then mounting a semiconductor device on the bump opposite a cavity in the bump, wherein a heat spreader includes the bump and a base that includes a portion of the ledge adjacent to the bump, electrically connecting the semiconductor device to the conductive trace and thermally connecting the semiconductor device to the heat spreader.

In accordance with an aspect of the present invention, a method of making a semiconductor chip assembly includes (1) providing a bump, a ledge, an adhesive and a conductive layer, wherein (a) the bump is adjacent to and integral with the ledge, extends vertically from the ledge in a first vertical direction, extends into an opening in the adhesive and is aligned with an aperture in the conductive layer, (b) the ledge extends laterally from the bump in lateral directions orthogonal to the first vertical direction, (c) a cavity in the bump faces in a second vertical direction opposite the first vertical direction and is covered by the bump in the first vertical direction, (d) the adhesive is mounted on the ledge, is sandwiched between the ledge and the conductive layer and is non-solidified, and (e) the conductive layer is mounted on the adhesive, then (2) flowing the adhesive in the first vertical direction into a gap located in the aperture between the bump and the conductive layer, (3) solidifying the adhesive, then (4) providing a conductive trace that includes a pad, a terminal and a selected portion of the conductive layer, then (5) mounting a semiconductor device on the bump, wherein (a) a heat spreader includes the bump and a base, (b) the bump is adjacent to the base and extends vertically from the base in the first vertical direction, (c) the base includes a portion of the ledge that is adjacent to and integral with and extends laterally from the bump and (d) the semiconductor device extends beyond the bump in the first vertical direction, is located outside the cavity and extends laterally within a periphery of the cavity, (6) electrically connecting the semiconductor device to the pad, thereby electrically connecting the semiconductor device to the terminal, and (7) thermally connecting the semiconductor device to the bump, thereby thermally connecting the semiconductor device to the base.

In accordance with another aspect of the present invention, a method of making a semiconductor chip assembly includes (1) providing a bump and a ledge, wherein (a) the bump is adjacent to and integral with the ledge and extends vertically from the ledge in a first vertical direction, (b) the ledge extends laterally from the bump in lateral directions orthogonal to the first vertical direction and (c) a cavity in the bump (i) faces in a second vertical direction opposite the first vertical direction, (ii) is covered by the bump in the first vertical direction and (iii) extends across most of the bump in the vertical and lateral directions, (2) providing an adhesive, wherein an opening extends through the adhesive, (3) providing a conductive layer, wherein an aperture extends through the conductive layer, (4) mounting the adhesive on the ledge, including inserting the bump into the opening, wherein the bump and the cavity extend into the opening, (5) mounting the conductive layer on the adhesive, including aligning the bump with the aperture, wherein the adhesive is sandwiched between the ledge and the conductive layer and is non-solidified, then (6) applying heat to melt the adhesive, (7) moving the ledge and the conductive layer towards one another, thereby moving the bump in the first vertical direction in the aperture and applying pressure to the molten adhesive between the ledge and the conductive layer, wherein the pressure forces the molten adhesive to flow in the first vertical direction into a gap located in the aperture between the bump and the conductive layer, (8) applying heat to solidify the molten adhesive, thereby mechanically attaching the bump and the ledge to the conductive layer, then (9) providing a conductive trace that includes a pad, a terminal and a selected portion of the conductive layer, then (10) mounting a semiconductor device on the bump, wherein (a) a heat spreader includes the bump and a base, (b) the bump is adjacent to the base and extends vertically from the base in the first vertical direction, (c) the base includes a portion of the ledge that is adjacent to and integral with and extends laterally from the bump and (d) the semiconductor device extends beyond the bump in the first vertical direction, is located outside the cavity and extends laterally within a periphery of the cavity, (11) electrically connecting the semiconductor device to the pad, thereby electrically connecting the semiconductor device to the terminal, and (12) thermally connecting the semiconductor device to the bump, thereby thermally connecting the semiconductor device to the base.

Mounting the conductive layer can include mounting the conductive layer alone on the adhesive. Alternatively, mounting the conductive layer can include mounting the conductive layer and a carrier on the adhesive such that the conductive layer contacts and is sandwiched between the adhesive and the carrier, and then, after solidifying the adhesive, removing the carrier and then providing the conductive trace. As another alternative, mounting the conductive layer can include mounting the conductive layer and a dielectric layer on the adhesive such that the conductive layer is spaced from the adhesive and the dielectric layer contacts and is sandwiched between the conductive layer and the adhesive.

In accordance with another aspect of the present invention, a method of making a semiconductor chip assembly includes (1) providing a bump, a ledge, an adhesive and a conductive layer, wherein (a) the bump is adjacent to and integral with the ledge, extends vertically from the ledge in a first vertical direction, extends into an opening in the adhesive and is aligned with an aperture in the conductive layer, (b) the ledge extends laterally from the bump in lateral directions orthogonal to the first vertical direction, (c) a cavity in the bump (i) faces in a second vertical direction opposite the first vertical direction, (ii) is covered by the bump in the first vertical direction and (iii) extends across most of the bump in the vertical and lateral directions, (d) the adhesive is mounted on the ledge, is sandwiched between the ledge and the conductive layer and is non-solidified, and (e) the conductive layer is mounted on the adhesive, then (2) flowing the adhesive in the first vertical direction into a gap located in the aperture between the bump and the conductive layer, (3) solidifying the adhesive, then (4) providing a conductive trace that includes a pad and a terminal, wherein the pad includes a selected portion of the conductive layer, (5) providing a heat spreader includes the bump, a base and a cap, wherein (a) the bump is adjacent to the base and extends vertically from the base in the first vertical direction, (b) the base includes a portion of the ledge that is adjacent to and integral with and extends laterally from the bump and (c) the cap is adjacent to the bump, covers the bump in the first vertical direction, extends laterally from the bump and includes a selected portion of the conductive layer, then (6) mounting a semiconductor device on the cap, wherein the semiconductor device extends beyond the cap in the first vertical direction, is located outside the cavity and extends laterally within a periphery of the cavity, (7) electrically connecting the semiconductor device to the pad, thereby electrically connecting the semiconductor device to the terminal, and (8) thermally connecting the semiconductor device to the cap, thereby thermally connecting the semiconductor device to the base.

In accordance with another aspect of the present invention, a method of making a semiconductor chip assembly includes (1) providing a bump and a ledge, wherein (a) the bump is adjacent to and integral with the ledge and extends vertically from the ledge in a first vertical direction, (b) the ledge extends laterally from the bump in lateral directions orthogonal to the first vertical direction and (c) a cavity in the bump (i) faces in a second vertical direction opposite the first vertical direction, (ii) is covered by the bump in the first vertical direction, (iii) extends across most of the bump in the vertical and lateral directions and (iv) has an entrance at the ledge, (2) providing an adhesive, wherein an opening extends through the adhesive, (3) providing a conductive layer, wherein an aperture extends through the conductive layer, (4) mounting the adhesive on the ledge, including inserting the bump into the opening, wherein the bump and the cavity extend into the opening, (5) mounting the conductive layer on the adhesive, including aligning the bump with the aperture, wherein the adhesive is sandwiched between the ledge and the conductive layer and is non-solidified, then (6) applying heat to melt the adhesive, (7) moving the ledge and the conductive layer towards one another, thereby moving the bump in the first vertical direction in the aperture and applying pressure to the molten adhesive between the ledge and the conductive layer, wherein the pressure forces the molten adhesive to flow in the first vertical direction into a gap located in the aperture between the bump and the conductive layer, (8) applying heat to solidify the molten adhesive, thereby mechanically attaching the bump and the ledge to the conductive layer, then (9) providing a conductive trace that includes a pad and a terminal, wherein the pad includes a selected portion of the conductive layer, (10) providing a heat spreader includes the bump, a base and a cap, wherein (a) the bump is adjacent to the base and extends vertically from the base in the first vertical direction, (b) the base includes a portion of the ledge that is adjacent to and integral with and extends laterally from the bump and (c) the cap is adjacent to the bump, covers the bump in the first vertical direction, extends laterally from the bump and includes a selected portion of the conductive layer, then (11) mounting a semiconductor device on the cap, wherein the semiconductor device extends beyond the cap in the first vertical direction, is located outside the cavity and extends laterally within a periphery of the cavity, (12) electrically connecting the semiconductor device to the pad, thereby electrically connecting the semiconductor device to the terminal, and (13) thermally connecting the semiconductor device to the cap, thereby thermally connecting the semiconductor device to the base.

Providing the bump can include mechanically stamping a metal plate, thereby forming the bump in the metal plate and the cavity in the bump. In this instance, the bump is a stamped portion of the metal plate and the ledge is an unstamped portion of the metal plate.

Providing the adhesive can include providing a prepreg with uncured epoxy, flowing the adhesive can include melting the uncured epoxy and compressing the uncured epoxy between the ledge and the conductive layer, and solidifying the adhesive can include curing the molten uncured epoxy.

Providing the pad can include removing selected portions of the conductive layer after solidifying the adhesive. The removing can include applying a wet chemical etch to the conductive layer using an etch mask that defines the pad such that the pad includes a selected portion of the conductive layer.

Providing the cap can include removing selected portions of the conductive layer after solidifying the adhesive. The removing can include applying a wet chemical etch to the conductive layer using an etch mask that defines the cap such that the cap includes a selected portion of the conductive layer.

Providing the terminal can include removing selected portions of the conductive layer after solidifying the adhesive. The removing can include applying a wet chemical etch to the conductive layer using an etch mask that defines the terminal such that the terminal includes a selected portion of the conductive layer.

Providing the terminal can include removing selected portions of the ledge after solidifying the adhesive. The removing can include applying a wet chemical etch to the ledge using an etch mask that defines the terminal such that the terminal includes a selected portion of the ledge.

Providing the base can include removing selected portions of the ledge after solidifying the adhesive. The removing can include applying a wet chemical etch to the ledge using an etch mask that defines the base such that the base includes a selected portion of the ledge.

Providing the pad and the cap can include removing selected portions of the conductive layer using an etch mask that defines the pad and the cap. Thus, the pad and the cap can be formed simultaneously using the same etch mask and wet chemical etch. Likewise, providing the pad and the terminal can include removing selected portions of the conductive layer using an etch mask that defines the pad and the terminal. Thus, the pad and the terminal can be formed simultaneously using the same etch mask and wet chemical etch. Likewise, providing the pad, the terminal and the cap can include removing selected portions of the conductive layer using an etch mask that defines the pad, the terminal and the cap. Thus, the pad, the terminal and the cap can be formed simultaneously using the same etch mask and wet chemical etch.

Providing the base and the terminal can include removing selected portions of the ledge using an etch mask that defines the base and the terminal. Thus, the base and the terminal can be formed simultaneously using the same etch mask and wet chemical etch.

The pad can be formed before, during or after the terminal is formed. Thus, the pad and the terminal can be formed simultaneously using the same wet chemical etch and different etch masks or sequentially using different etch masks. Likewise, the base can be formed before, during or after the cap is formed. Thus, the base and the cap can be formed simultaneously using the same wet chemical etch and different etch masks or sequentially using different etch masks or sequentially using an etch mask for the cap but not the base. Similarly, the pad, the terminal, the base and the cap can be formed simultaneously or sequentially.

Providing the pad can include grinding the bump, the adhesive and the conductive layer after solidifying the adhesive such that the bump, the adhesive and the conductive layer are laterally aligned with one another at a lateral surface that faces in the first vertical direction, and then removing selected portions of the conductive layer using an etch mask that defines the pad such that the pad includes a selected portion of the conductive layer. The grinding can include grinding the adhesive without grinding the bump and then grinding the bump, the adhesive and the conductive layer. The removing can include applying a wet chemical etch to the conductive layer using an etch mask that defines the pad.

Providing the pad can include depositing a plated layer on the bump, the adhesive and the conductive layer after the grinding and then removing selected portions of the conductive layer and the plated layer such that the pad includes selected portions of the conductive layer and the plated layer. Depositing the plated layer can include electrolessly plating a thin plated layer on the bump, the adhesive and the conductive layer and then electroplating a thick plated layer on the thin plated layer. The removing can include applying the wet chemical etch to the conductive layer and the plated layer using an etch mask that defines the pad.

Providing the cap can include depositing a plated layer on the bump, the adhesive and the conductive layer after the grinding and then removing selected portions of the conductive layer and the plated layer such that the cap includes selected portions of the conductive layer and the plated layer. Depositing the plated layer can include electrolessly plating a thin plated layer on the bump, the adhesive and the conductive layer and then electroplating a thick plated layer on the thin plated layer. The removing can include applying the wet chemical etch to the conductive layer and the plated layer using an etch mask that defines the cap.

Providing the terminal can include depositing a plated layer on the bump, the adhesive and the conductive layer after the grinding and then removing selected portions of the conductive layer and the plated layer such that the terminal includes selected portions of the conductive layer and the plated layer. Depositing the plated layer can include electrolessly plating a thin plated layer on the bump, the adhesive and the conductive layer and then electroplating a thick plated layer on the thin plated layer. The removing can include applying the wet chemical etch to the conductive layer and the plated layer using an etch mask that defines the terminal.

Providing the terminal can include depositing a plated layer on the ledge after the grinding and then removing selected portions of the ledge and the plated layer such that the terminal includes selected portions of the ledge and the plated layer. Depositing the plated layer can include electrolessly plating a thin plated layer on the ledge and then electroplating a thick plated layer on the thin plated layer. The removing can include applying the wet chemical etch to the ledge and the plated layer using an etch mask that defines the terminal.

Providing the base can include depositing a plated layer on the ledge after the grinding and then removing selected portions of the ledge and the plated layer such that the base includes selected portions of the ledge and the plated layer. Depositing the plated layer can include electrolessly plating a thin plated layer on the ledge and then electroplating a thick plated layer on the thin plated layer. The removing can include applying the wet chemical etch to the ledge and the plated layer using an etch mask that defines the base.

Providing the base can include depositing a plated layer on the ledge and a filler in the cavity after the grinding. Depositing the plated layer can include electrolessly plating a thin plated layer on the ledge and the filler and then electroplating a thick plated layer on the thin plated layer. Furthermore, the base can seal the cavity and cover the bump, the cavity and the filler in the second vertical direction.

Providing the conductive trace can include providing the pad, the terminal and a routing line in an electrically conductive path between the pad and the terminal. The routing line can include a selected portion of the conductive layer and extend beyond the adhesive and the dielectric layer in the first vertical direction.

Providing the pad and the routing line can include removing selected portions of the conductive layer using an etch mask that defines the pad and the routing line. Thus, the pad and the routing line can be formed simultaneously using the same etch mask and wet chemical etch.

Providing the conductive trace can include providing the pad, the terminal and a plated through-hole in an electrically conductive path between the pad and the terminal. The plated through-hole can be formed before the pad and the terminal and extend through the conductive layer, the adhesive, the dielectric layer and the ledge.

Providing the base, the cap, the pad, the terminal and the plated through-hole can include drilling a hole through the conductive layer, the adhesive, the dielectric layer and the ledge after solidifying the adhesive, then depositing a plated layer on the bump, the adhesive, the dielectric layer, the conductive layer and the ledge and into the hole, wherein the plated layer forms a first plated layer on the bump, the adhesive and the conductive layer, a second plated layer on the ledge and the plated through-hole in the hole, then forming a first etch mask on the first plated layer that defines the pad and the cap, forming a second etch mask on the second plated layer that defines the base and the terminal, etching the conductive layer and the first plated layer in a pattern defined by the first etch mask, etching the ledge and the second plated layer in a pattern defined by the second etch mask and then removing the etch masks.

The first plated layer on the bump, the adhesive and the conductive layer can contact the bump, the adhesive and the conductive layer, cover the bump in the first vertical direction and provide portions of the pad, the terminal, the routing line and the cap. Likewise, the second plated layer on the ledge can contact the ledge, contact the bump and/or a filler in the cavity, cover the bump in the second vertical direction and provide portions of the base and the terminal. The routing line can contact the dielectric layer and be spaced from the adhesive. The plated through-hole can contact the adhesive and the dielectric layer in the hole. Furthermore, etching the conductive layer and the first plated layer can include exposing the dielectric layer in the first vertical direction without exposing the adhesive in the first vertical direction, and etching the ledge and the second plated layer can include exposing the adhesive in the second vertical direction without exposing the dielectric layer in the second vertical direction.

The cavity can be hollow or can contain a filler. For instance, the cavity can be hollow across most of the bump in the vertical and lateral directions after mounting the semiconductor device. In this instance, the cavity can be exposed in the second vertical direction and expose the bump in the second vertical direction after mounting the semiconductor device. Alternatively, the cavity can contain a filler such as epoxy, polyimide or solder that extends across most of the bump in the vertical and lateral directions and fills most or all of the cavity before mounting the semiconductor device. For instance, the filler can be deposited into the cavity before mounting the adhesive. As another instance, the filler can be deposited into the cavity after solidifying the adhesive and before providing the conductive trace. In this instance, the filler can be deposited into the cavity and then the second plated layer can be deposited on the ledge and the filler, or alternatively, the second plated layer can be deposited on the bump and the ledge and then the filler can be deposited into the cavity. Furthermore, the filler can be grinded after it is deposited such that the filler is contained in the cavity and laterally aligned with the ledge or the second plated layer at a lateral surface that faces in the second vertical direction.

Flowing the adhesive can include filling the gap with the adhesive. Flowing the adhesive can also include squeezing the adhesive through the gap beyond the bump and the conductive layer in the first vertical direction onto surface portions of the bump and the conductive layer that are adjacent to the gap and face in the first vertical direction such that the adhesive extends beyond the bump and the conductive layer in the first vertical direction.

Solidifying the adhesive can include mechanically bonding the bump and the ledge to the conductive layer.

Mounting the semiconductor device on the bump can include mounting the semiconductor device on the cap and thus the bump. Mounting the semiconductor device can also include positioning the semiconductor device within the periphery of the cap and outside the periphery of the pad, or alternatively, positioning the semiconductor device within and outside the peripheries of the cap and the pad. The semiconductor device can also be located within or extend within and outside the peripheries of the bump and the cavity and be located outside or extend within and outside the periphery of the conductive trace. Furthermore, the semiconductor device can be located within the periphery of the base. In any case, the semiconductor device extends laterally within the periphery of the cavity.

Mounting the semiconductor device can include providing a first solder joint between an LED package that includes an LED chip and the pad and a second solder joint between the LED package and the cap, electrically connecting the semiconductor device can include providing the first solder joint between the LED package and the pad, and thermally connecting the semiconductor device can include providing the second solder joint between the LED package and the cap.

Mounting the semiconductor device can include providing a die attach between a semiconductor chip such as an LED chip and the cap, electrically connecting the semiconductor device can include providing a wire bond between the chip and the pad, and thermally connecting the semiconductor device can include providing the die attach between the chip and the cap.

The adhesive can contact the bump, the base, the cap and the dielectric layer, cover the conductive trace and the substrate in the second vertical direction, cover and surround a sidewall of the bump in the lateral directions and extend to peripheral edges of the assembly after the assembly is manufactured and detached from other assemblies in a batch.

The base can support the bump, the substrate and the adhesive, extend laterally beyond the cap and extend to or be spaced from peripheral edges of the assembly after the assembly is manufactured and detached from other assemblies in a batch.

The present invention has numerous advantages. The heat spreader can provide excellent heat spreading and heat dissipation without heat flow through the adhesive. As a result, the adhesive can be a low cost dielectric with low thermal conductivity and not prone to delamination. The heat spreader can have a large surface area with relatively thin metal, thereby reducing weight and cost. The bump and the cavity can be defined by mechanical stamping, thereby enhancing precision. The bump and the base can be integral with one another, thereby enhancing reliability. The cap can be customized for the semiconductor device, thereby enhancing the thermal connection. The filler can provide mechanical support for the bump, thereby enhancing strength. The pad and the cap can include a selected portion of the conductive layer laminated to the adhesive or the dielectric layer, thereby enhancing reliability. The adhesive can be sandwiched between the bump and the substrate, between the base and the substrate and between the cap and the substrate, thereby providing a robust mechanical bond between the heat spreader and the substrate. The conductive trace can provide signal routing with simple circuitry patterns or flexible multi-layer signal routing with complex circuitry patterns. The conductive trace can also provide vertical signal routing between the pad and the terminal using a plated through-hole that extends through the adhesive and the dielectric layer. Furthermore, the plated through-hole can be formed after the adhesive is solidified and remain a hollow tube or be split at a peripheral edge of the assembly. As a result, a solder joint subsequently reflowed on the terminal can wet and flow into the plated through-hole without creating a buried void in the solder joint that might otherwise occur if the plated through-hole is filled with the adhesive or another non-wettable insulator, thereby increasing reliability. The base can provide mechanical support for the substrate, thereby preventing warping. The assembly can be manufactured using low temperature processes which reduces stress and improves reliability. The assembly can also be manufactured using well-controlled processes which can be easily implemented by circuit board, lead frame and tape manufacturers.

These and other features and advantages of the present invention will be further described and more readily apparent from a review of the detailed description of the preferred embodiments which follows.

BRIEF DESCRIPTION OF THE DRAWINGS

The following detailed description of the preferred embodiments of the present invention can best be understood when read in conjunction with the following drawings, in which.

DETAILED DESCRIPTION OF THE INVENTION

Figure 1A:
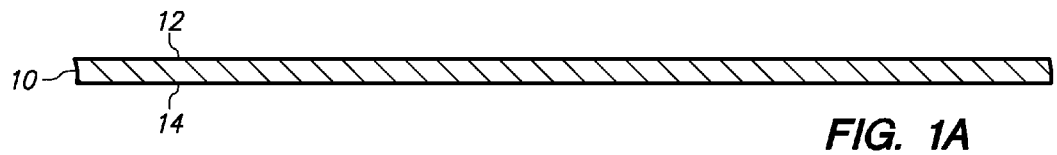
FIGS. 1A and 1B are cross-sectional views showing a method of making a bump and a ledge in accordance with an embodiment of the present invention.
Figure 1B:
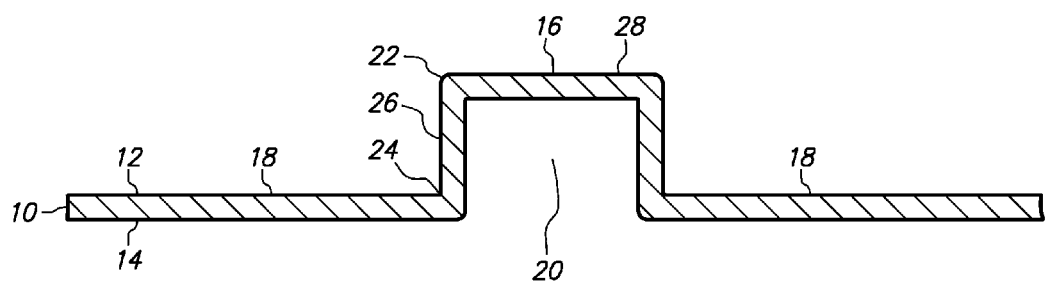
Figure 1C:
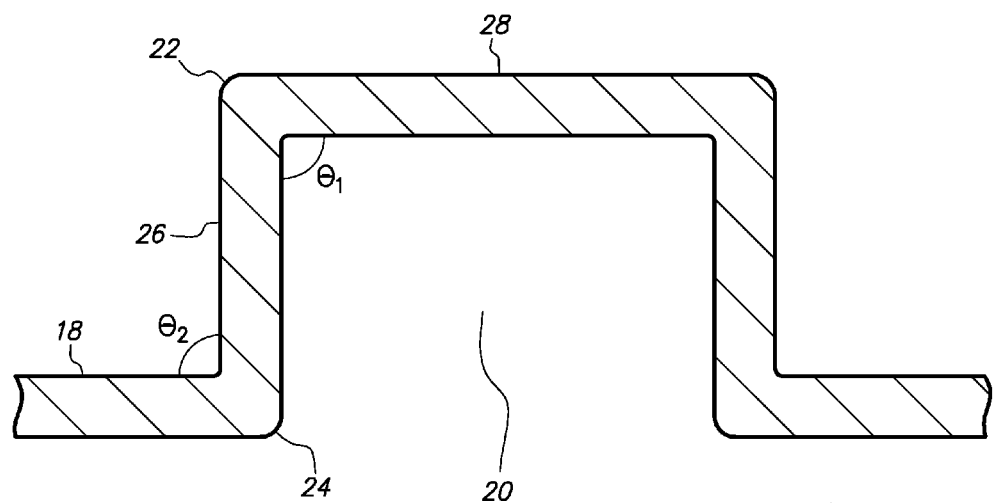
FIGS. 1C, 1D and 1E are enlarged cross-sectional, top and bottom views, respectively, corresponding to FIG. 1B, FIGS. 2A and 2B are cross-sectional views showing a method of making an adhesive in accordance with an embodiment of the present invention.
Figure 1D:
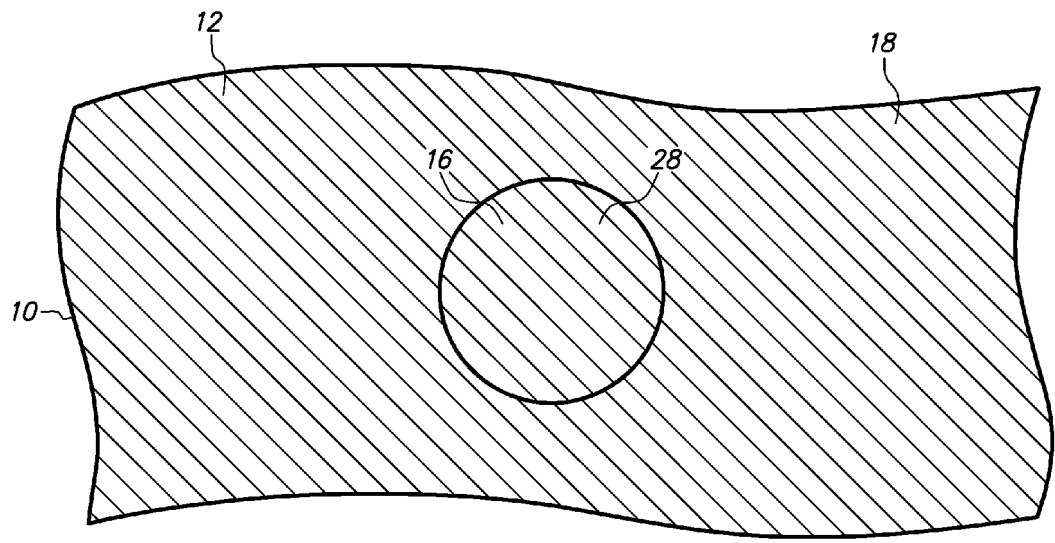
Figure 1E:
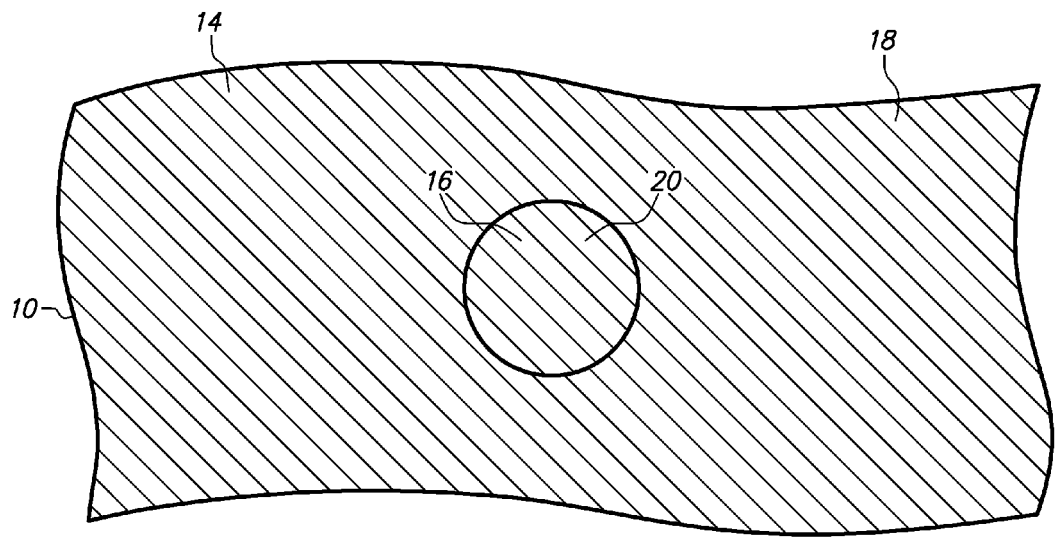

FIGS. 1A and 1B are cross-sectional views showing a method of making a bump and a ledge in accordance with an embodiment of the present invention, FIG. 1C is an enlarged cross-sectional view corresponding to FIG. 1B and FIGS. 1D and 1E are top and bottom views, respectively, corresponding to FIG. 1B.

FIG. 1A. is a cross-sectional view of metal plate 10 which includes opposing major surfaces 12 and 14. Metal plate 10 is illustrated as a copper plate with a thickness of 150 microns. Copper has high thermal conductivity, good bondability and low cost. Metal plate 10 can be various metals such as copper, aluminum, alloy 42, iron, nickel, silver, gold, combinations thereof, and alloys thereof.

FIGS. 1B, 1C, 1D and 1E are cross-sectional, enlarged cross-sectional, top and bottom views, respectively, of metal plate 10 with bump 16, ledge 18 and cavity 20. Bump 16, cavity 20 and bent corners 22 and 24 are formed by mechanically stamping metal plate 10. Thus, bump 16 is a stamped portion of metal plate 10, ledge 18 is an unstamped portion of metal plate 10 and bent corners 22 and 24 are bent portions of metal plate 10.

Bump 16 is adjacent to and integral with ledge 18 and extends from ledge 18 in the upward direction and ledge 18 extends laterally from bump 16 in the lateral directions (such as left and right) orthogonal to the upward and downward directions.

Bump 16 includes bent corners 22 and 24, sidewall 26 and ceiling 28. Bent corners 22 and 24 are bent by the stamping operation and thus sidewall 26 is shaped and sloped by the stamping operation. Bent corner 22 is adjacent to ceiling 28 and extends laterally inward. Bent corner 24 is adjacent to ledge 18 and extends laterally outward. Sidewall 26 extends vertically in the upward and downward directions between bent corners 22 and 24. Ceiling 28 extends laterally inward from bent corner 22. Furthermore, bent corner 22 has an angle $\theta_1$ of 90 degrees and bent corner 24 has an angle $\theta_2$ of 90 degrees (as shown in FIG. 1C). Thus, sidewall 26 has an angle $\theta_1$ of 90 degrees relative to ceiling 28 and an angle $\theta_2$ of 90 degrees relative to ledge 18.

Bump 16 has a cylindrical shape with constant diameter as it extends vertically between bent corners 22 and 24. Bump 16 has a height of 600 microns relative to ledge 18 and a diameter of 1000 microns. Furthermore, bump 16 has an irregular thickness due to the stamping operation. For instance, sidewall 26 is thinner than ceiling 28 since it is elongated by the stamping operation. Bump 16 is shown with a uniform thickness for convenience of illustration.

Cavity 20 extends into bump 16, is covered by bump 16 in the upward direction, faces in the downward direction, is exposed in the downward direction and exposes bump 16 in the downward direction where bump 16 defines cavity 20. Thus, cavity 20 is hollow, unsealed at its entrance at ledge 18 and not covered by bump 16 in the downward direction. Cavity 20 also conforms to the shape of bump 16. Thus, cavity 20 has a cylindrical shape with constant diameter. Furthermore, cavity 20 extends across most of bump 16 in the vertical and lateral directions.

Figure 2A:
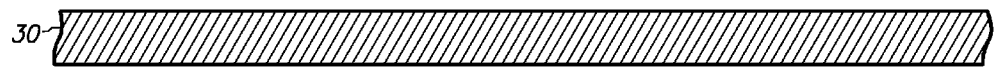
FIGS. 2C and 2D are top and bottom views, respectively, corresponding to FIG. 2B, FIGS. 3A and 3B are cross-sectional views showing a method of making a substrate in accordance with an embodiment of the present invention.
Figure 2B:
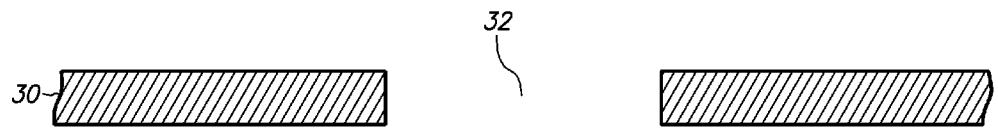
Figure 2C:
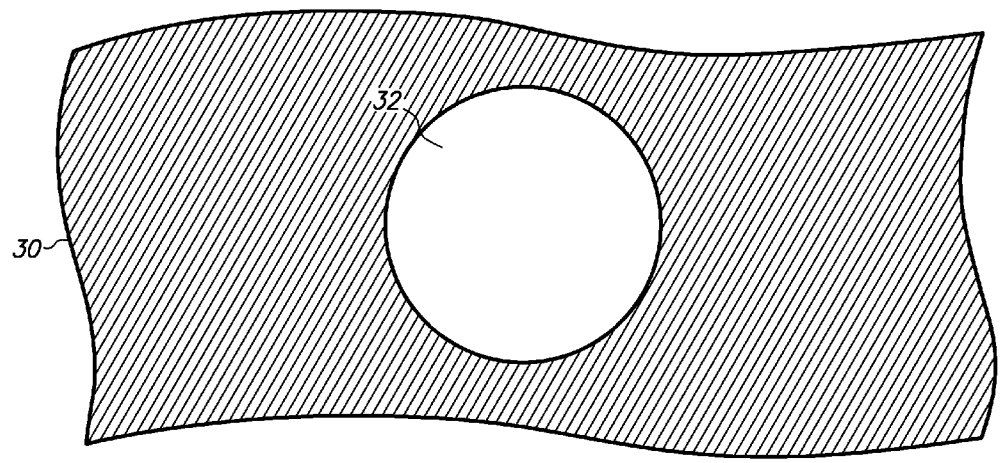
Figure 2D:
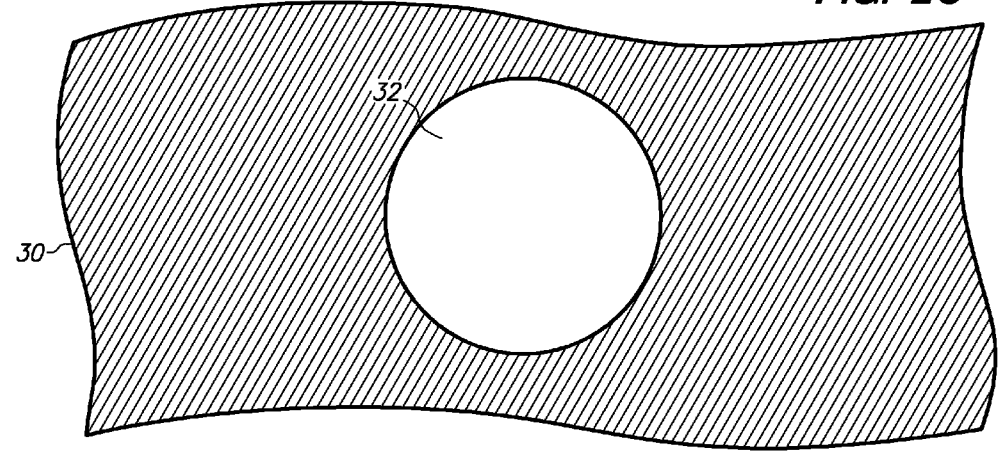

FIGS. 2A and 2B are cross-sectional views showing a method of making an adhesive in accordance with an embodiment of the present invention, and FIGS. 2C and 2D are top and bottom views, respectively, corresponding to FIG. 2B.

FIG. 2A is a cross-sectional view of adhesive 30. Adhesive 30 is illustrated as a prepreg with B-stage uncured epoxy provided as a non-solidified unpatterned sheet with a thickness of 250 microns.

Adhesive 30 can be various dielectric films or prepregs formed from numerous organic or inorganic electrical insulators. For instance, adhesive 30 can initially be a prepreg in which thermosetting epoxy in resin form impregnates a reinforcement and is partially cured to an intermediate stage. The epoxy can be FR-4 although other epoxies such as polyfunctional and bismaleimide triazine (BT) are suitable. For specific applications, cyanate esters, polyimide and PTFE are also suitable. The reinforcement can be E-glass although other reinforcements such as S-glass, D-glass, quartz, kevlar aramid and paper are suitable. The reinforcement can also be woven, non-woven or random microfiber. A filler such as silica (powdered fused quartz) can be added to the prepreg to improve thermal conductivity, thermal shock resistance and thermal expansion matching. Commercially available prepregs such as SPEEDBOARD C prepreg by W.L. Gore & Associates of Eau Claire, Wis. are suitable.

FIGS. 2B, 2C and 2D are cross-sectional, top and bottom views, respectively, of adhesive 30 with opening 32. Opening 32 is a window that extends through adhesive 30 and has a diameter of 1050 microns. Opening 32 is formed by mechanical drilling through the prepreg and can be formed by other techniques such as punching and stamping.

Figure 3A:
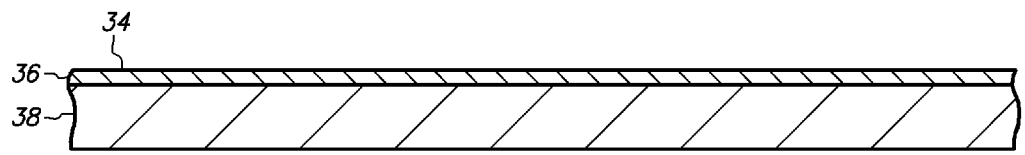
FIGS. 3C and 3D are top and bottom views, respectively, corresponding to FIG. 3B, FIGS. 4A-4L are cross-sectional views showing a method of making a thermal board in accordance with an embodiment of the present invention.
Figure 3B:
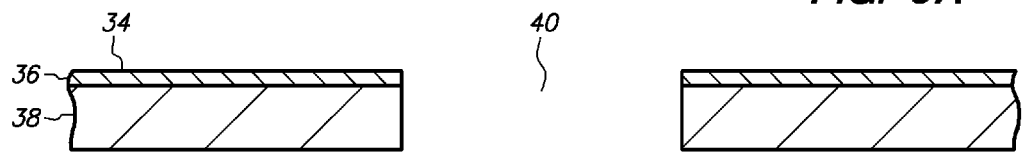
Figure 3C:
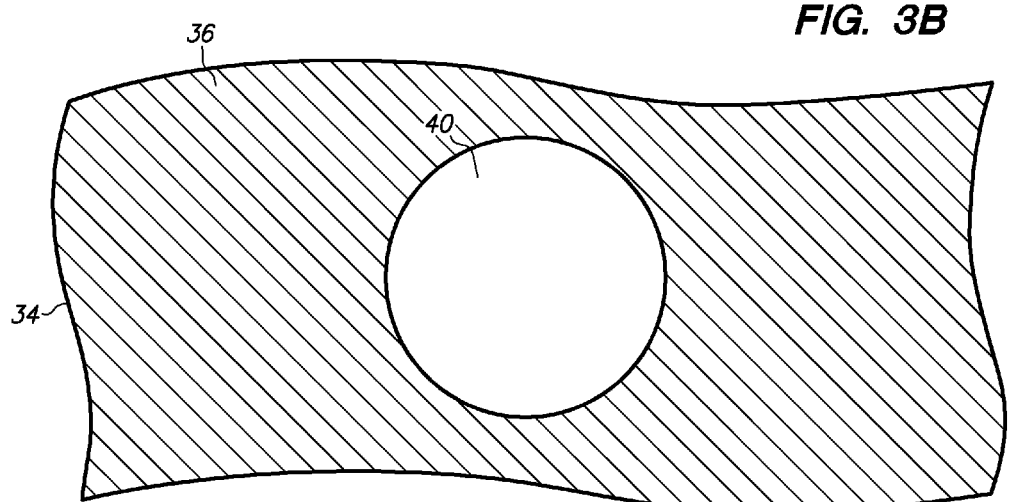
Figure 3D:
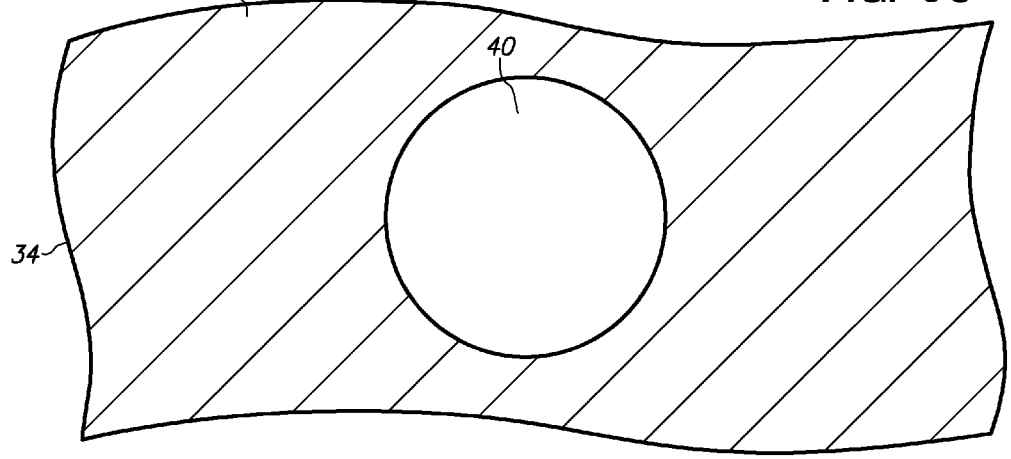

FIGS. 3A and 3B are cross-sectional views showing a method of making a substrate in accordance with an embodiment of the present invention, and FIGS. 3C and 3D are top and bottom views, respectively, corresponding to FIG. 3B.

FIG. 3A is a cross-sectional view of substrate 34 that includes conductive layer 36 and dielectric layer 38. Conductive layer 36 is an electrical conductor that contacts and extends above dielectric layer 38, and dielectric layer 38 is an electrical insulator. For instance, conductive layer 36 is an unpatterned copper sheet with a thickness of 50 microns and dielectric layer 38 is epoxy with a thickness of 350 microns.

FIGS. 3B, 3C and 3D are cross-sectional, top and bottom views, respectively, of substrate 34 with aperture 40. Aperture 40 is a window that extends through substrate 34 and has a diameter of 1050 microns. Aperture 40 is formed by mechanical drilling through conductive layer 36 and dielectric layer 38 and can be formed with other techniques such as punching and stamping. Thus, opening 32 and aperture 40 have the same diameter. Furthermore, opening 32 and aperture 40 can be formed in the same manner with the same drill bit at the same drilling station or the same punch at the same punching station.

Substrate 34 is illustrated as a laminated structure. Substrate 34 can be other electrical interconnects such as a ceramic board or a printed circuit board. Likewise, substrate 34 can include additional layers of embedded circuitry.

Figure 4A:
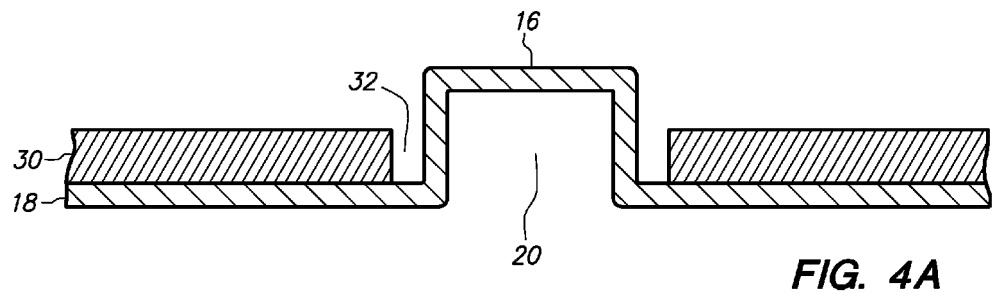
FIGS. 4M and 4N are top and bottom views, respectively, corresponding to FIG. 4L, FIGS. 5A, 5B and 5C are cross-sectional, top and bottom views, respectively, of a thermal board with a conductive trace that contacts an adhesive in accordance with an embodiment of the present invention.
Figure 4B:
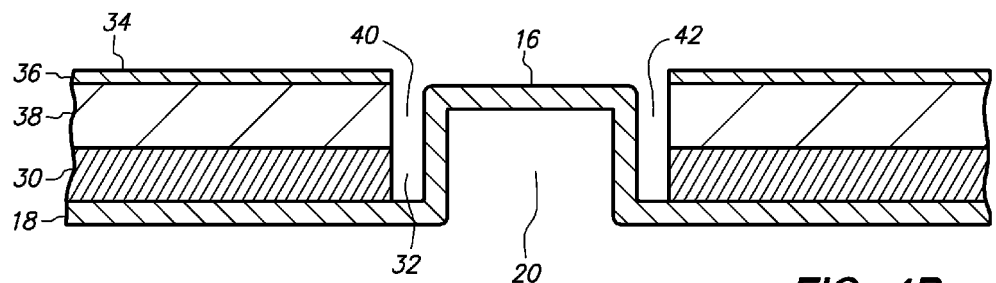
Figure 4C:
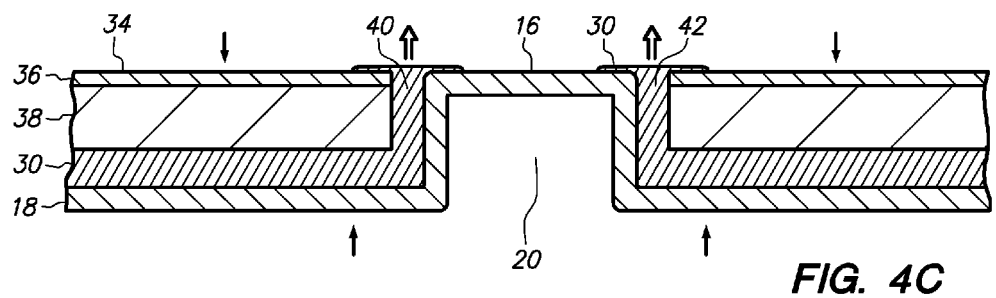
Figure 4D:
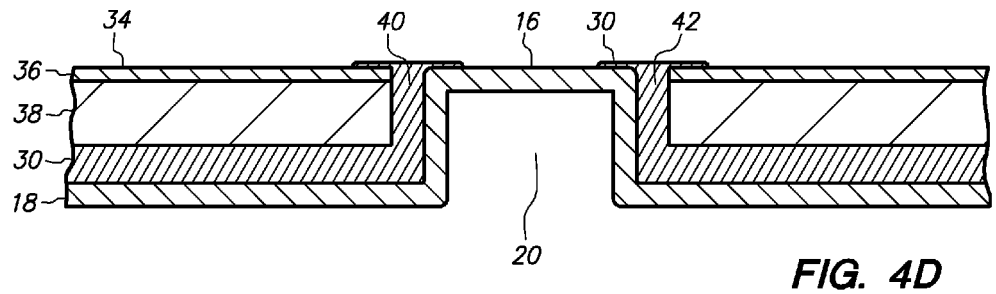
Figure 4E:
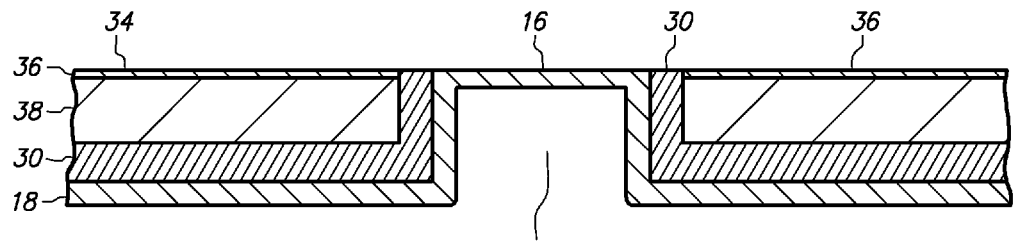
Figure 4F:
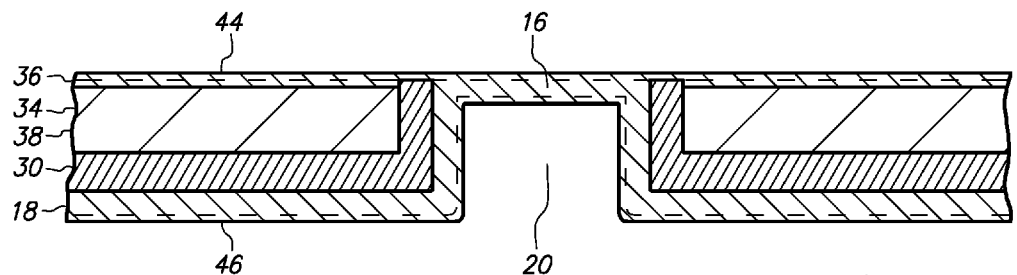
Figure 4G:
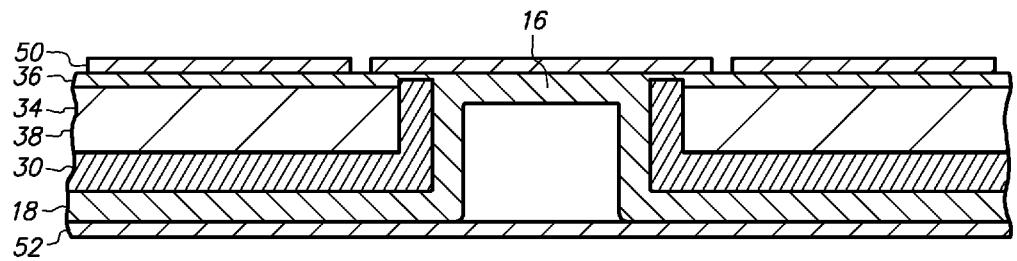
Figure 4H:
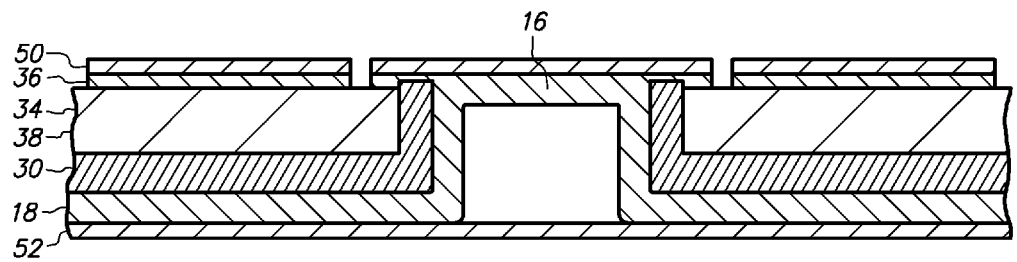
Figure 4I:
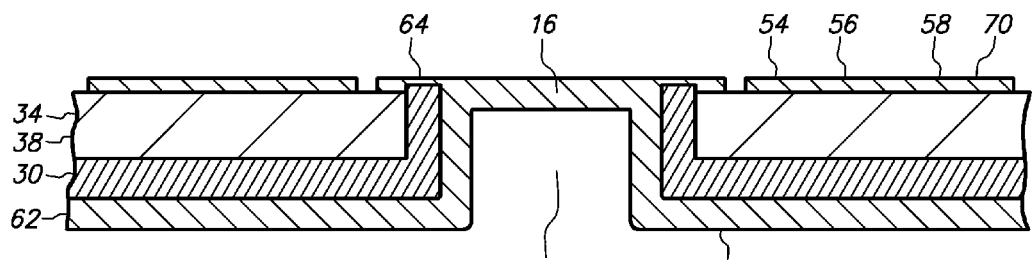
Figure 4J:
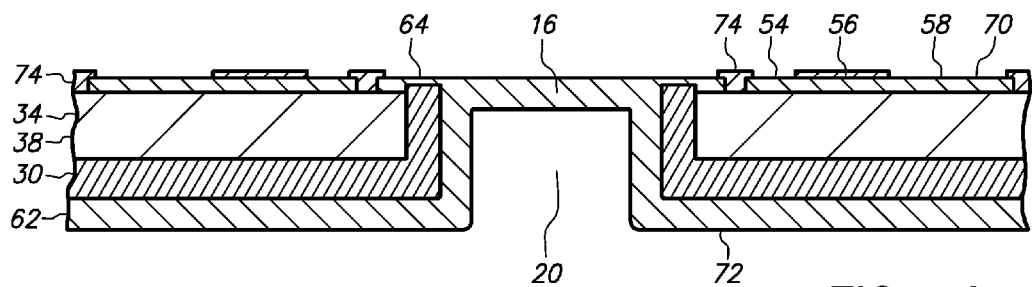
Figure 4K:
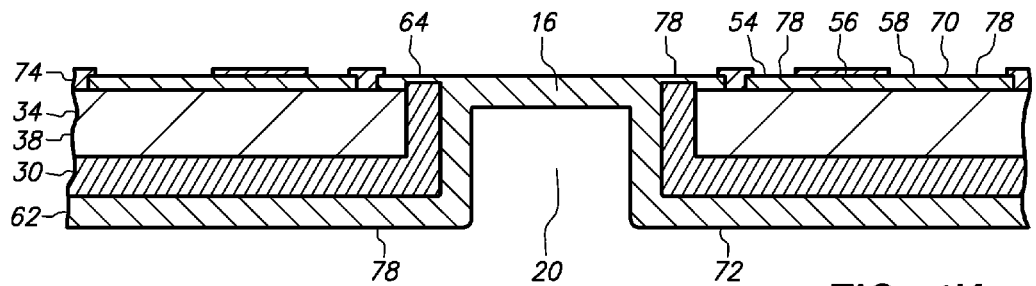
Figure 4L:
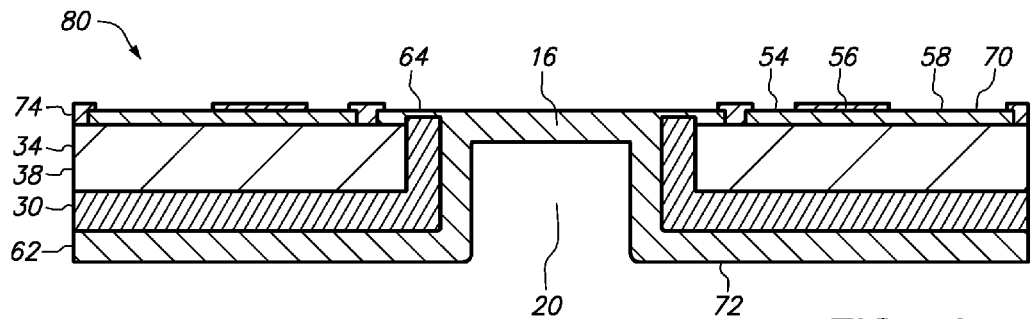
Figure 4M:
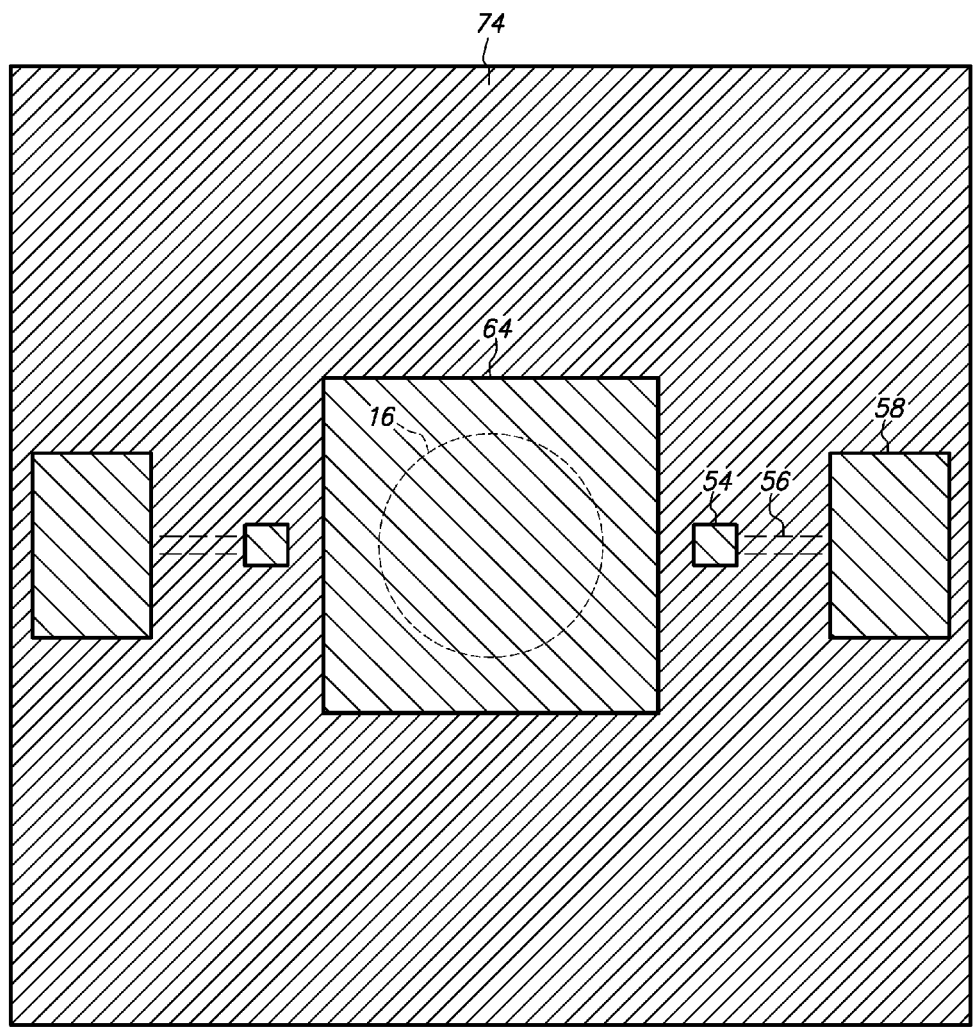
Figure 4N:
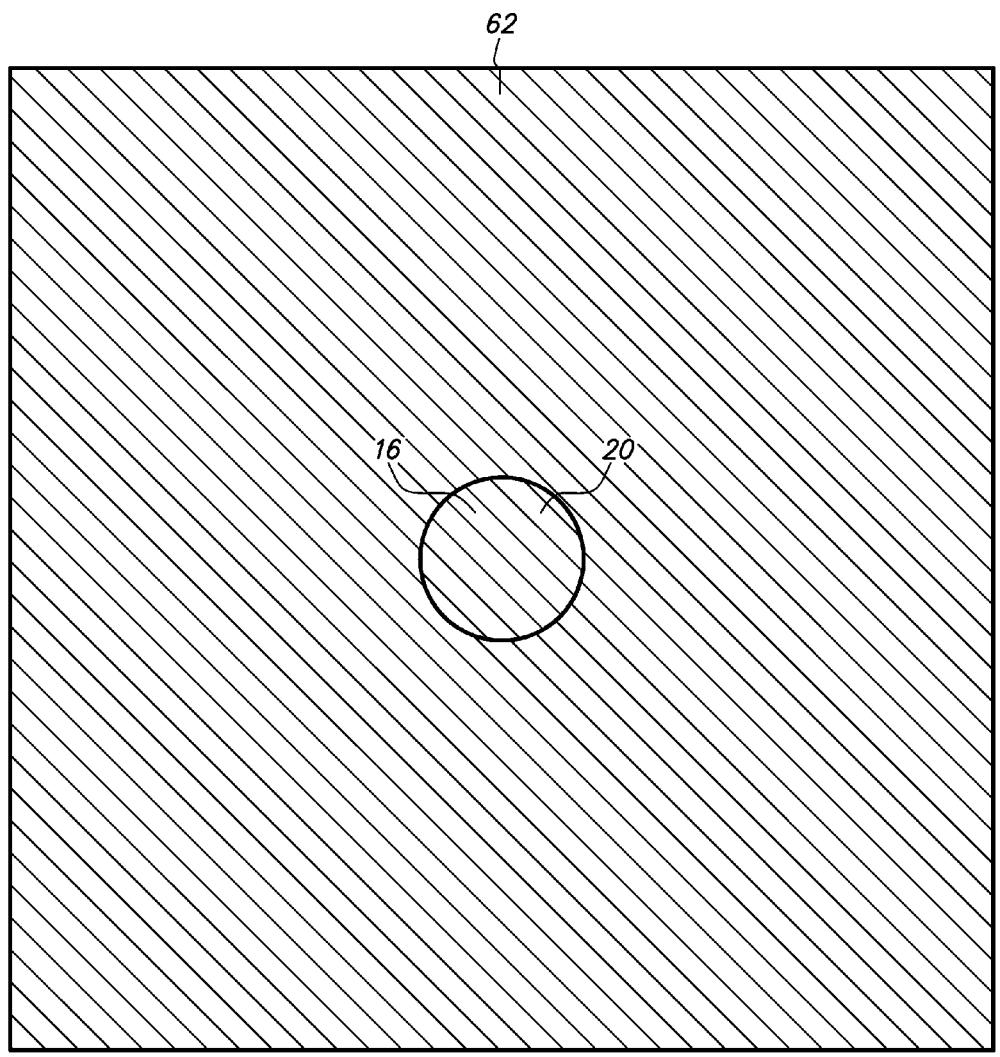

FIGS. 4A-4L are cross-sectional views showing a method of making a thermal board that includes bump 16, adhesive 30 and substrate 34 in accordance with an embodiment of the present invention, and FIGS. 4M and 4N are top and bottom views, respectively, corresponding to FIG. 4L.

In FIGS. 4A and 4B the structure is in the cavity-down position so that gravity assists with mounting adhesive 30 and substrate 34 on ledge 18, and in FIGS. 4C-4L the structure remains in the cavity-down position. Thus, cavity 20 faces downward and is covered by bump 16 in the upward direction. However, the relative orientation of the structure does not change. Cavity 20 is covered by bump 16 in the first vertical direction regardless of whether the structure is inverted, rotated or slanted. Likewise, bump 16 extends beyond ledge 18 in the first vertical direction and substrate 34 in the second vertical direction regardless of whether the structure is inverted, rotated or slanted. Hence, the first and second vertical directions are oriented relative to the structure and remain opposite to one another and orthogonal to the lateral directions.

FIG. 4A is a cross-sectional view of the structure with adhesive 30 mounted on ledge 18. Adhesive 30 is mounted by lowering it onto ledge 18 as bump 16 is inserted into and through and upwards in opening 32. Adhesive 30 eventually contacts and rests on ledge 18. Preferably, bump 16 is inserted into and extends through opening 32 without contacting adhesive 30 and is aligned with and centrally located within opening 32.

FIG. 4B is a cross-sectional view of the structure with substrate 34 mounted on adhesive 30. Substrate 34 is mounted by lowering it onto adhesive 30 as bump 16 is inserted into and upwards in aperture 40. Substrate 34 eventually contacts and rests on adhesive 30.

Bump 16 is inserted into but not through aperture 40 without contacting substrate 34 and is aligned with and centrally located within aperture 40. As a result, gap 42 is located in aperture 40 between bump 16 and substrate 34. Gap 42 laterally surrounds bump 16 and is laterally surrounded by substrate 34. In addition, opening 32 and aperture 40 are precisely aligned with one another and have the same diameter.

At this stage, substrate 34 is mounted on and contacts and extends above adhesive 30. Bump 16 extends through opening 32 into aperture 40 to dielectric layer 38, is 50 microns below the top surface of conductive layer 36 and is exposed through aperture 40 in the upward direction. Adhesive 30 contacts and is sandwiched between ledge 18 and substrate 34, contacts dielectric layer 38 but is spaced from conductive layer 36 and remains a non-solidified prepreg with B-stage uncured epoxy, and gap 42 is filled with air.

FIG. 4C is a cross-sectional view of the structure with adhesive 30 in gap 42. Adhesive 30 is flowed into gap 42 by applying heat and pressure. In this illustration, adhesive 30 is forced into gap 42 by applying downward pressure to conductive layer 36 and/or upward pressure to ledge 18, thereby moving ledge 18 and substrate 34 towards one another and applying pressure to adhesive 30 while simultaneously applying heat to adhesive 30. Adhesive 30 becomes compliant enough under the heat and pressure to conform to virtually any shape. As a result, adhesive 30 sandwiched between ledge 18 and substrate 34 is compressed, forced out of its original shape and flows into and upward in gap 42. Ledge 18 and substrate 34 continue to move towards one another and adhesive 30 eventually fills gap 42. Moreover, adhesive 30 remains sandwiched between and continues to fill the reduced space between ledge 18 and substrate 34.

For instance, ledge 18 and conductive layer 36 can be disposed between top and bottom platens (not shown) of a press. In addition, a top cull plate and top buffer paper (not shown) can be sandwiched between conductive layer 36 and the top platen, and a bottom cull plate and bottom buffer paper (not shown) can be sandwiched between ledge 18 and the bottom platen. The stack includes the top platen, top cull plate, top buffer paper, substrate 34, adhesive 30, ledge 18, bottom buffer paper, bottom cull plate and bottom platen in descending order. Furthermore, the stack may be positioned on the bottom platen by tooling pins (not shown) that extend upward from the bottom platen through registration holes (not shown) in metal plate 10.

The platens are heated and move towards one another, thereby applying heat and pressure to adhesive 30. The cull plates disperse the heat from the platens so that it is more uniformly applied to ledge 18 and substrate 34 and thus adhesive 30, and the buffer papers disperse the pressure from the platens so that it is more uniformly applied to ledge 18 and substrate 34 and thus adhesive 30. Initially, dielectric layer 38 contacts and presses down on adhesive 30. As the platen motion and heat continue, adhesive 30 between ledge 18 and substrate 34 is compressed, melted and flows into and upward in gap 42 and across conductive layer 36 and dielectric layer 38. For instance, the uncured epoxy is melted by the heat and the molten uncured epoxy is squeezed by the pressure into gap 42, however the reinforcement and the filler remain between ledge 18 and substrate 34. Adhesive 30 elevates more rapidly than bump 16 in aperture 40 and fills gap 42. Adhesive 30 also rises slightly above gap 42 and overflows onto the top surfaces of bump 16 and conductive layer 36 adjacent to gap 42 before the platen motion stops. This may occur due to the prepreg being slightly thicker than necessary. As a result, adhesive 30 creates a thin coating on the top surfaces of bump 16 and conductive layer 36. The platen motion is eventually blocked by bump 16 and the platens become stationary but continue to apply heat to adhesive 30.

The upward flow of adhesive 30 in gap 42 is shown by the thick upward arrows, the upward motion of bump 16 and ledge 18 relative to substrate 34 is shown by the thin upward arrows, and the downward motion of substrate 34 relative to bump 16 and ledge 18 is shown by the thin downward arrows.

FIG. 4D is a cross-sectional view of the structure with adhesive 30 solidified.

For instance, the platens continue to clamp bump 16 and ledge 18 and apply heat after the platen motion stops, thereby converting the B-stage molten uncured epoxy into C-stage cured or hardened epoxy. Thus, the epoxy is cured in a manner similar to conventional multi-layer lamination. After the epoxy is cured, the platens move away from one another and the structure is released from the press.

Adhesive 30 as solidified provides a secure robust mechanical bond between bump 16 and substrate 34 and between ledge 18 and substrate 34. Adhesive 30 can withstand normal operating pressure without distortion or damage and is only temporarily distorted under unusually high pressure. Furthermore, adhesive 30 can absorb thermal expansion mismatch between bump 16 and substrate 34 and between ledge 18 and substrate 34.

At this stage, bump 16 and conductive layer 36 are essentially coplanar with one another and adhesive 30 and conductive layer 36 extend to a top surface that faces in the upward direction. For instance, adhesive 30 between ledge 18 and dielectric layer 38 has a thickness of 200 microns which is 50 microns less than its initial thickness of 250 microns, bump 16 ascends 50 microns in aperture 40 and substrate 34 descends 50 microns relative to bump 16. The 600 micron height of bump 16 is essentially the same as the combined height of conductive layer 36 (50 microns), dielectric layer 38 (350 microns) and the underlying adhesive 30 (200 microns). Furthermore, bump 16 continues to be centrally located in opening 32 and aperture 40 and spaced from substrate 34 and adhesive 30 fills the space between ledge 18 and substrate 34 and fills gap 42. For instance, gap 42 (as well as adhesive 30 between bump 16 and substrate 34) has a width of 25 microns ((1050−1000)/2). Adhesive 30 extends across dielectric layer 38 in gap 42. That is, adhesive 30 in gap 42 extends in the upward and downward directions across the thickness of dielectric layer 38 at the outer sidewall of gap 42. Adhesive 30 also includes a thin top portion above gap 42 that contacts the top surfaces of bump 16 and conductive layer 36 and extends above bump 16 by 10 microns.

FIG. 4E is a cross-sectional view of the structure after upper portions of bump 16, adhesive 30 and conductive layer 36 are removed.

Bump 16, adhesive 30 and conductive layer 36 have their upper portions removed by grinding. For instance, a rotating diamond sand wheel and distilled water are applied to the top of the structure. Initially, the diamond sand wheel grinds only adhesive 30. As the grinding continues, adhesive 30 becomes thinner as its grinded surface migrates downwardly. Eventually the diamond sand wheel contacts bump 16 and conductive layer 36 (not necessarily at the same time), and as a result, begins to grind bump 16 and conductive layer 36 as well. As the grinding continues, bump 16, adhesive 30 and conductive layer 36 become thinner as their grinded surfaces migrate downwardly. The grinding continues until the desired thickness has been removed. Thereafter, the structure is rinsed in distilled water to remove contaminants.

The grinding removes a 25 micron thick upper portion of adhesive 30, a 15 micron thick upper portion of bump 16 and a 15 micron thick upper portion of conductive layer 36. The decreased thickness does not appreciably affect bump 16 or adhesive 30. However, it substantially reduces the thickness of conductive layer 36 from 50 microns to 35 microns.

At this stage, bump 16, adhesive 30 and conductive layer 36 are coplanar with one another at a smoothed lapped lateral top surface that is above dielectric layer 38 and faces in the upward direction.

FIG. 4F is a cross-sectional view of the structure with plated layer 44 formed on bump 16, adhesive 30 and conductive layer 36 and plated layer 46 formed on bump 16 and ledge 18.

Plated layer 44 is deposited on and contacts bump 16, adhesive 30 and conductive layer 36 at the lateral top surface where they are exposed in the upward direction and covers them in the upward direction. Plated layer 44 is an unpatterned copper layer with a thickness of 25 microns.

Plated layer 46 is deposited on and contacts bump 16 and ledge 18 at their bottom surfaces where they are exposed in the downward direction and covers them in the downward direction. Plated layer 46 is an unpatterned copper layer with a thickness of 25 microns.

For instance, the structure is dipped in an activator solution to render adhesive 30 catalytic to electroless copper, then an upper electroless copper layer is electrolessly plated on bump 16, adhesive 30 and conductive layer 36 and a lower electroless copper layer is electrolessly plated on bump 16 and ledge 18, and then an upper electroplated copper layer is electroplated on the upper electroless copper layer to form plated layer 44 and a lower electroplated copper layer is electroplated on the lower electroless copper layer to form plated layer 46. The electroless copper layers have a thickness of 2 microns, the electroplated copper layers have a thickness of 23 microns, and plated layers 44 and 46 have a thickness of 25 microns. As a result, bump 16 and ledge 18 essentially grow in the downward direction and conductive layer 36 essentially grows in the upward direction. Furthermore, cavity 20 continues to be hollow, exposed in the downward direction, expose bump 16 in the downward direction and extend across most of bump 16 in the vertical and lateral directions.

Plated layer 44 serves as a cover layer for bump 16, a build-up layer for conductive layer 36 and a bridge between bump 16 and conductive layer 36 and plated layer 46 serves as a build-up layer for bump 16 and ledge 18.

Bump 16, conductive layer 36 and plated layer 44 are shown as a single layer for convenience of illustration. Likewise, bump 16, ledge 18 and plated layer 46 are shown as a single layer for convenience of illustration. The boundary (shown in phantom) between bump 16 and plated layer 44, between conductive layer 36 and plated layer 44, between bump 16 and plated layer 46 and between ledge 18 and plated layer 46 may be difficult or impossible to detect since copper is plated on copper. However, the boundary between adhesive 30 and plated layer 44 is clear.

FIG. 4G is a cross-sectional view of the structure with etch masks 50 and 52 formed on plated layers 44 and 46, respectively.

Etch masks 50 and 52 are illustrated as photoresist layers which are deposited on plated layers 44 and 46, respectively, using dry film lamination in which hot rolls simultaneously press photoresist layers 50 and 52 onto plated layers 44 and 46, respectively. Wet spin coating and curtain coating are also suitable deposition techniques. Etch mask 50 is a patterned photoresist layer and etch mask 52 is an unpatterned photoresist layer that provides a cover mask.

A reticle (not shown) is positioned proximate to photoresist layer 50. Thereafter, photoresist layer 50 is patterned by selectively applying light through the reticle so that the photoresist portions exposed to the light are rendered insoluble, applying a developer solution to remove the photoresist portions that are unexposed to the light and remain soluble and then hard baking, as is conventional. As a result, photoresist layer 50 has a pattern that selectively exposes plated layer 44 in the upward direction and photoresist layer 52 remains unpatterned and covers plated layer 46 in the downward direction. Furthermore, photoresist layers 50 and 52 cover bump 16 the upward and downward directions, respectively.

FIG. 4H is a cross-sectional view of the structure with selected portions of conductive layer 36 and plated layer 44 removed by etching conductive layer 36 and plated layer 44 in the pattern defined by etch mask 50.

The etching is a front-side wet chemical etch. For instance, the structure can be inverted so that etch mask 50 faces downward and etch mask 52 faces upward as a bottom spray nozzle (not shown) that faces etch mask 50 upwardly sprays the wet chemical etch on plated layer 44 and etch mask 50 while a top spray nozzle (not shown) that faces etch mask 52 is deactivated so that gravity assists with removing the etched byproducts. Alternatively, the structure can be dipped in the wet chemical etch since etch mask 52 provides backside protection. The wet chemical etch etches through conductive layer 36 and plated layer 44 to expose dielectric layer 38 in the upward direction and converts conductive layer 36 and plated layer 44 from unpatterned into patterned layers. However, bump 16, ledge 18 and plated layer 46 are not affected by the wet chemical etch and ledge 18 and plated layer 46 remain unpatterned layers. As a result, adhesive 30 remains covered in the upward and downward directions and dielectric layer 38 is exposed in the upward direction but not the downward direction.

A suitable wet chemical etch that is highly selective of copper can be provided by a solution containing alkaline ammonia or a dilute mixture of nitric and hydrochloric acid. Likewise, the wet chemical etch can be acidic or alkaline. The optimal etch time for providing the pattern transfer without excessively conductive layer 36 and plated layer 44 to the wet chemical etch can be established through trial and error.

FIG. 4I is a cross-sectional view of the structure after etch masks 50 and 52 are removed. The photoresist layers are stripped using a solvent, such as a strong alkaline solution containing potassium hydroxide with a pH of 14, that is highly selective of photoresist with respect to copper.

Conductive layer 36 and plated layer 44 as etched include pad 54, routing line 56, terminal 58 and cap 64. Thus, conductive layer 36 and plated layer 44 are a patterned layer that includes pad 54, routing line 56, terminal 58 and cap 64.

Likewise, pad 54, routing line 56, terminal 58 and cap 64 are selected portions of conductive layer 36 and plated layer 44 defined by etch mask 50.

Pad 54 is an unetched portion of conductive layer 36 and plated layer 44 defined by etch mask 50 that is adjacent to routing line 56 and spaced from terminal 58. Routing line 56 is an unetched portion of conductive layer 36 and plated layer 44 defined by etch mask 50 that is adjacent to and extends laterally from and electrically connects pad 54 and terminal 58. Terminal 58 is an unetched portion of conductive layer 36 and plated layer 44 defined by etch mask 50 that is adjacent to routing line 56 and spaced from pad 54. Cap 64 is an unetched portion of conductive layer 36 and plated layer 44 defined by etch mask 50 that is adjacent to and extends laterally from and is thermally connected to bump 16, covers bump 16 in the upward direction and is spaced from pad 54, routing line 56 and terminal 58.

Pad 54, routing line 56 and terminal 58 have a thickness of 60 microns (35+25). Cap 64 has a thickness of 25 microns where it is adjacent to bump 16 and excludes conductive layer 36 and a thickness of 60 microns (35+25) where it is adjacent to dielectric layer 38 and includes a selected portion of conductive layer 36. Cap 64 also has a thickness of 25 microns where it contacts adhesive 30, is spaced from dielectric layer 38 and covers opening 32 and aperture 40 in the upward direction and a thickness of 60 microns (35+25) where it contacts dielectric layer 38.

Bump 16 as enlarged by plated layer 46 includes a portion of plated layer 46 that is deposited into cavity 20. Likewise, ledge 18 as enlarged by plated layer 46 includes a portion of plated layer 46 that is deposited outside cavity 20.

Base 62 includes a portion of ledge 18 from metal plate 10 that is adjacent to and integral with and extends laterally from bump 16. Base 62 also includes a portion of plated layer 46 that covers this portion of ledge 18 in the downward direction. Thus, base 62 is adjacent to and integral with and extends laterally from bump 16 and has a thickness of 175 microns (150+25).

Conductive trace 70 is provided by pad 54, routing line 56 and terminal 58. Thus, conductive trace 70 includes selected portions of conductive layer 36 and plated layer 44 that are spaced from bump 16, base 62 and cap 64. Conductive trace 70 is located outside cavity 20. Furthermore, routing line 56 provides an electrically conductive path between pad 54 and terminal 58.

Conductive trace 70 provides horizontal (fan-out) routing from pad 54 to terminal 58 by routing line 56. Conductive trace 70 is not limited to this configuration. For instance, the electrically conductive path can include vias that extend through adhesive 30 and/or dielectric layer 38 and routing lines (above and/or below adhesive 30 and/or dielectric layer 38) as well as passive components such as resistors and capacitors mounted on additional pads.

Heat spreader 72 is provided by bump 16, base 62 and cap 64. Thus, heat spreader 72 includes selected portions of metal plate 10, conductive layer 36 and plated layers 44 and 46 that are spaced from conductive trace 70. Furthermore, bump 16 provides a thermally conductive path between base 62 and cap 64.

Heat spreader 72 is essentially a heat slug with an inverted T-like shape that includes a pedestal (bump 16), large lower wings (base 62) and small upper wings (cap 64).

FIG. 4J is a cross-sectional view of the structure with solder mask 74 formed on substrate 34, conductive trace 70 and heat spreader 72.

Solder mask 74 is an electrically insulative layer that is selectively patterned to expose pad 54, terminal 58 and cap 64 in the upward direction, cover routing line 56 in the upward direction and cover dielectric layer 38 where it is otherwise exposed in the upward direction. Solder mask 74 has a thickness of 25 microns above pad 54, routing line 56, terminal 58 and cap 64 and extends 85 microns (60+25) above dielectric layer 38.

Solder mask 74 is initially a photoimageable liquid resin that is dispensed on the structure. Thereafter, solder mask 74 is patterned by selectively applying light through a reticle (not shown) so that the solder mask portions exposed to the light are rendered insoluble, applying a developer solution to remove the solder mask portions that are unexposed to the light and remain soluble and then hard baking, as is conventional.

FIG. 4K is a cross-sectional view of the structure with plated contacts 78 formed on conductive trace 70 and heat spreader 72.

Plated contacts 78 are thin spot plated metal coatings that contact the exposed copper surfaces. Thus, plated contacts 78 contact pad 54, terminal 58 and cap 64 and cover their exposed portions in the upward direction and contact bump 16 and base 62 and cover their exposed portions in the downward direction. For instance, a nickel layer is electrolessly plated on the exposed copper surfaces, and then a silver layer is electrolessly plated on the nickel layer. The buried nickel layer has a thickness of 3 microns, the silver surface layer has a thickness of 0.5 microns, and plated contacts 78 have a thickness of 3.5 microns.

Bump 16, pad 54, terminal 58, base 62 and cap 64 treated with plated contacts 78 as a surface finish have several advantages. The buried nickel layer provides the primary mechanical and electrical and/or thermal connection, and the silver surface layer provides a wettable surface to facilitate solder reflow and accommodates a solder joint and a wire bond. Plated contacts 78 also protect conductive trace 70 and heat spreader 72 from corrosion. Plated contacts 78 can include a wide variety of metals to accommodate the external connection media. For instance, a gold surface layer can be plated on a buried nickel layer or a nickel surface layer alone can be employed.

Bump 16, pad 54, terminal 58, base 62 and cap 64 treated with plated contacts 78 are shown as single layers for convenience of illustration. The boundary (not shown) in bump 16, pad 54, terminal 58, base 62 and cap 64 with plated contacts 78 occurs at the copper/nickel interface.

At this stage, the manufacture of thermal board 80 can be considered complete.

FIGS. 4L, 4M and 4N are cross-sectional, top and bottom views, respectively, of thermal board 80 after it is detached at peripheral edges along cut lines from a support frame and/or adjacent thermal boards in a batch.

Thermal board 80 includes adhesive 30, substrate 34, conductive trace 70, heat spreader 72 and solder mask 74. Substrate 34 includes dielectric layer 38. Conductive trace 70 includes pad 54, routing line 56 and terminal 58. Heat spreader 72 includes bump 16, base 62 and cap 64.

Bump 16 is adjacent to base 62 at bent corner 24, is adjacent to cap 64 at bent corner 22 and at ceiling 28, extends from base 62 in the upward direction, extends from cap 64 in the downward direction and is integral with base 62. Bump 16 extends into and remains centrally located within opening 32 and aperture 40, extends above and below dielectric layer 38 and aperture 40 and is coplanar with adhesive 30 at cap 64. Bump 16 continues to define cavity 20 and cover cavity 20 in the upward direction and have an irregular thickness characteristic of stamping. Bump 16 also contacts adhesive 30, is spaced from dielectric layer 38 and retains its cylindrical shape in which its diameter is constant as it extends upwardly from base 62 to cap 64. Furthermore, bent corner 22 continues to bend laterally inward about 90 degrees adjacent to cap 64, bent corner 24 continues to bend laterally outward about 90 degrees adjacent to base 62 and bent corners 22 and 24 remain vertically spaced from one another by sidewall 26.

Cavity 20 extends into bump 16, is covered by bump 16 in the upward direction, faces in the downward direction, is exposed in the downward direction and exposes bump 16 in the downward direction where bump 16 defines cavity 20. Thus, cavity 20 is hollow, unsealed at its entrance and not covered by bump 16 in the downward direction. Cavity 20 also extends into opening 32 and aperture 40 and is spaced from cap 64 by bump 16. Cavity 20 also conforms to the shape of bump 16 and has a cylindrical shape with constant diameter. Furthermore, cavity 20 extends across most of bump 16 in the vertical and lateral directions.

Base 62 is located below adhesive 30, substrate 34 and conductive trace 70. Base 62 contacts adhesive 30 and is spaced from substrate 34 and cap 64, extends laterally from bump 16 beyond cap 64 and conductive trace 70, extends beyond adhesive 30 and substrate 34 in the downward direction, covers conductive trace 70 in the downward direction and supports bump 16, adhesive 30 and substrate 34 and conductive trace 70.

Cap 64 contacts and extends above adhesive 30 and dielectric layer 38. Cap 64 has a first thickness where it is adjacent to bump 16, a second thickness where it is adjacent to dielectric layer 38 that is larger than the first thickness and a flat surface that faces in the upward direction. Moreover, cap 64 has the first thickness where it is adjacent to adhesive 30 and spaced from dielectric layer 38 and the second thickness where it is adjacent to dielectric layer 38 and spaced from adhesive 30.

Adhesive 30 is mounted on and extends above base 62, contacts and is sandwiched between and fills the space between bump 16 and dielectric layer 38 in gap 42, contacts and is sandwiched between and fills the space between base 62 and dielectric layer 38 outside gap 42, contacts and is sandwiched between base 62 and cap 64 and is spaced from conductive trace 70. Adhesive 30 extends across dielectric layer 38 in gap 42 and is sandwiched between base 62 and pad 54, between base 62 and routing line 56 and between base 62 and terminal 58. Adhesive 30 also extends laterally from bump 16 beyond conductive trace 70 and is solidified.

Adhesive 30 covers and surrounds sidewall 26 of bump 16 in the lateral directions, covers base 62 outside the periphery of bump 16 in the upward direction, covers cap 64 outside the periphery of bump 16 in the downward direction and covers substrate 34 in the downward direction. Adhesive 30 also conformally coats sidewall 26 of bump 16, a bottom surface of dielectric layer 38, a top surface of base 62 outside the periphery of bump 16 and a bottom surface of cap 64 outside the periphery of bump 16.

Adhesive 30 alone can intersect an imaginary horizontal line between bump 16 and dielectric layer 38, an imaginary horizontal line between bump 16 and cap 64, an imaginary vertical line between base 62 and dielectric layer 38 and an imaginary vertical line between base 62 and cap 64. However, adhesive 30 alone cannot intersect an imaginary line between base 62 and conductive trace 70. Thus, an imaginary horizontal line exists that intersects only adhesive 30 as the line extends from bump 16 to dielectric layer 38, however no imaginary line (horizontal, vertical or otherwise) exists that intersects only adhesive 30 as the line extends from base 62 to conductive trace 70 since such line would also intersect dielectric layer 38 between base 62 and conductive trace 70.

Substrate 34 is mounted on adhesive 26, extends above base 62 and includes conductive trace 70. Dielectric layer 38 contacts and is sandwiched between adhesive 30 and pad 54, between adhesive 30 and routing line 56 and between adhesive 30 and terminal 58, contacts cap 64 and is spaced from bump 16 and base 62.

Pad 54, routing line 56 and terminal 58 contact dielectric layer 38 and are spaced from adhesive 30 and extend above adhesive 30 and dielectric layer 38. Pad 54 and terminal 58 have the same thickness and are coplanar with one another at a top surface that faces in the upward direction. Furthermore, pad 54 and cap 64 have the same thickness where they are closest to one another, have different thickness where cap 64 is adjacent to bump 16 and are coplanar with one another at a top surface that faces in the upward direction.

Adhesive 30, dielectric layer 38, base 62 and solder mask 74 extend to straight vertical peripheral edges of thermal board 80 after it is detached or singulated from a batch of identical simultaneously manufactured thermal boards.

Pad 54 is customized as an electrical interface for a semiconductor device such as an LED chip that is subsequently mounted on cap 64, terminal 58 is customized as an electrical interface for the next level assembly such as a solderable electrical wire or contact from a printed circuit board, cap 64 is customized as a thermal interface for the semiconductor device and base 62 is customized as a thermal interface for the next level assembly such as the printed circuit board or a heat sink for an electronic device.

Pad 54 and terminal 58 are horizontally offset from one another and exposed at the top surface of thermal board 80, thereby providing horizontal signal routing between the semiconductor device and the next level assembly.

Conductive trace 70 is shown in cross-section as a continuous circuit trace for convenience of illustration. However, conductive trace 70 can provide horizontal signal routing in both the X and Y directions. That is, pad 54 and terminal 58 can be laterally offset from one another in the X and Y directions.

Conductive trace 70 and heat spreader 72 remain spaced from one another. As a result, conductive trace 70 and heat spreader 72 are mechanically attached and electrically isolated from one another.

Heat spreader 72 provides heat spreading and heat dissipation from a semiconductor device that is subsequently mounted on cap 64 to the next level assembly that thermal board 80 is subsequently mounted on. The semiconductor device generates heat that flows into cap 64, from cap 64 into bump 16 and through bump 16 into base 62 where it is spread out and dissipated in the downward direction, for instance to an underlying heat sink.

Bump 16, pad 54, terminal 58, base 62 and cap 64 are the same metals—i.e. copper/nickel/silver. Bump 16, pad 54, terminal 58, base 62 and cap 64 consist of a silver surface layer, a buried copper core and a buried nickel layer that contacts and is sandwiched between the silver surface layer and the buried copper core. Bump 16, pad 54, terminal 58, base 62 and cap 64 are also primarily copper at the buried copper core. Plated contacts 78 provide the silver surface layer and the buried nickel layer and various combinations of metal plate 10, conductive layer 36 and plated layers 44 and 46 provide the buried copper core. Routing line 56 is copper since it is isolated from plated contacts 78 by solder mask 74.

Conductive trace 70 includes a buried copper core shared by pad 54, routing line 56 and terminal 58. Heat spreader 72 includes a buried copper core shared by bump 16, base 62 and cap 64. Furthermore, conductive trace 70 includes a plated contact 78 at pad 54 and another plated contact at terminal 58 and heat spreader 72 includes a plated contact at bump 16 and base 62 and spaced from cap 64 and another plated contact 78 at cap 64 and spaced from bump 16 and base 62. Furthermore, conductive trace 70 and heat spreader 72 consist of copper/nickel/silver and are primarily copper at the buried copper core.

Thermal board 80 does not expose bump 16 or routing line 56 in the upward direction. Bump 16 and routing line 56 are shown in phantom in FIG. 4M for convenience of illustration.

Thermal board 80 can include multiple conductive traces 70 with a pad 54, routing line 56 and terminal 58. A single conductive trace 70 is described and labeled for convenience of illustration. In conductive traces 70, pads 54 and terminals 58 generally have similar shapes and sizes whereas routing lines 56 may (but need not) have different routing configurations. For instance, some conductive traces 70 may be spaced and separated and electrically isolated from one another whereas other conductive traces 70 can intersect or route to the same pad 54, routing line 56 or terminal 58 and be electrically connected to one another. Likewise, some pads 54 may receive independent signals whereas other pads 54 share a common signal, power or ground.

Thermal board 80 can be adapted for an LED package with blue, green and red LED chips, with each LED chip including an anode and a cathode and each LED package including a corresponding anode terminal and cathode terminal. In this instance, thermal board 80 can include six pads 54 and four terminals 58 so that each anode is routed from a separate pad 54 to a separate terminal 58 whereas each cathode is routed from a separate pad 54 to a common ground terminal 58.

A brief cleaning step can be applied to the structure at various manufacturing stages to remove oxides and debris that may be present on the exposed metal. For instance, a brief oxygen plasma cleaning step can be applied to the structure. Alternatively, a brief wet chemical cleaning step using a solution containing potassium permanganate can be applied to the structure. Likewise, the structure can be rinsed in distilled water to remove contaminants. The cleaning step cleans the desired surfaces without appreciably affecting or damaging the structure.

Advantageously, there is no plating bus or related circuitry that need be disconnected or severed from conductive traces 70 after they are formed. A plating bus can be disconnected during the wet chemical etch that forms conductive trace 70.

Thermal board 80 can include registration holes (not shown) that are drilled or sliced through adhesive 30, dielectric layer 38, base 62 and solder mask 74 so that thermal board 80 can be positioned by inserting tooling pins through the registration holes when it is subsequently mounted on an underlying carrier.

Thermal board 80 can accommodate multiple semiconductor devices rather than one with a single bump or multiple bumps. Thus, multiple semiconductor devices can be mounted on a single bump or separate semiconductor devices can be mounted on separate bumps.

Thermal board 80 with a single bump for multiple semiconductor devices can be accomplished by adjusting etch mask 50 to define additional conductive traces 70. The conductive traces 70 can be laterally repositioned to provide a 2×2 array for four semiconductor devices. In addition, the topography (lateral shape) can be adjusted for conductive traces 70.

Thermal board 80 with multiple bumps for multiple semiconductor devices can be accomplished by stamping metal plate 10 to include additional bumps 16, adjusting adhesive 30 to include additional openings 32, adjusting substrate 34 to include additional apertures 40 and adjusting etch mask 50 to define additional caps 64 and conductive traces 70. The bumps 16, caps 64 and conductive traces 70 can be laterally repositioned to provide a 2×2 array for four semiconductor devices. In addition, the topography (lateral shape) can be adjusted for bumps 16, caps 64 and conductive traces 70. Furthermore, bumps 16 can have separate bases 62 or share a single base 62 as defined by etch mask 52.

Figure 5A:
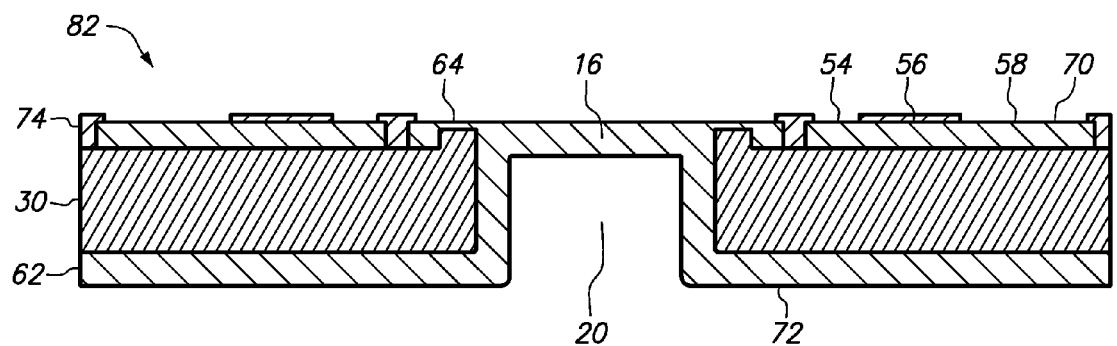
Figure 5B:
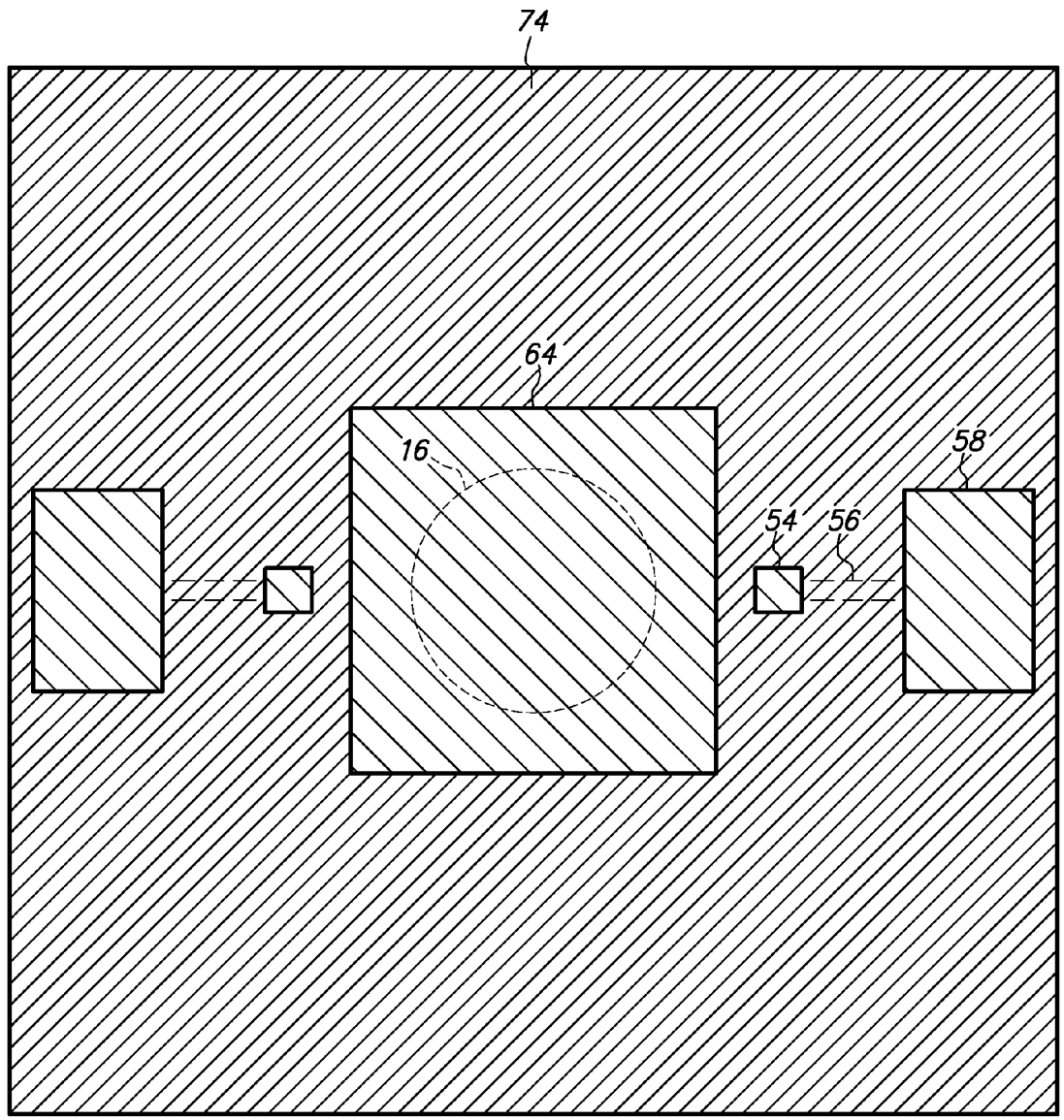
Figure 5C:
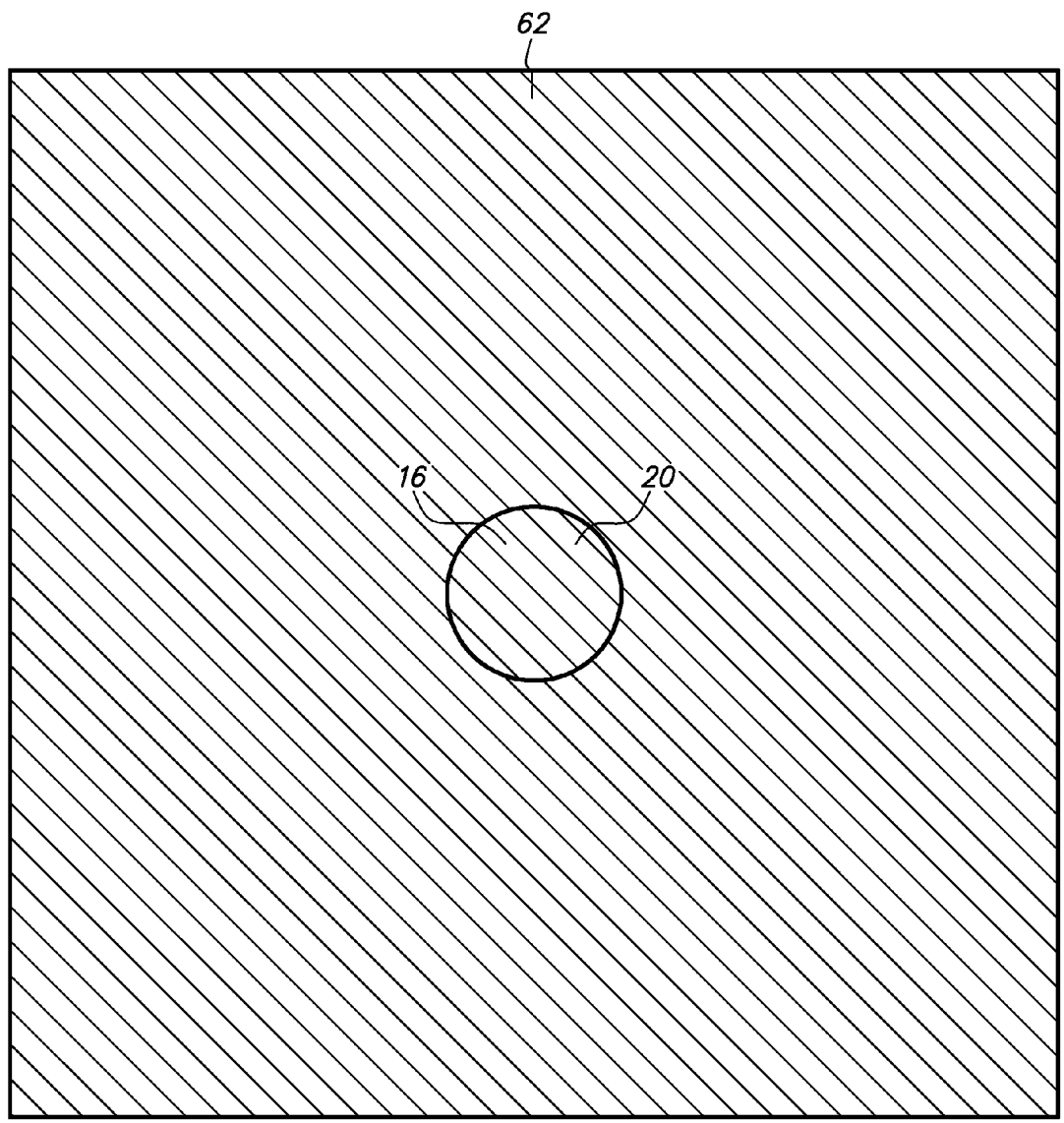

FIGS. 5A, 5B and 5C are cross-sectional, top and bottom views, respectively, of a thermal board with a conductive trace that contacts an adhesive in accordance with an embodiment of the present invention.

In this embodiment, the substrate is a provided by the conductive layer alone and the dielectric layer is omitted. For purposes of brevity, any description of thermal board 80 is incorporated herein insofar as the same is applicable, and the same description need not be repeated. Likewise, elements of the thermal board similar to those in thermal board 80 have corresponding reference numerals.

Thermal board 82 includes adhesive 30, conductive trace 70, heat spreader 72 and solder mask 74. Conductive trace 70 includes pad 54, routing line 56 and terminal 58. Heat spreader 72 includes bump 16, base 62 and cap 64.

Conductive layer 36 is thicker in this embodiment than the previous embodiment. For instance, conductive layer 36 has a thickness of 150 microns (rather than 50 microns) so that it can be handled without warping or wobbling. Pad 54, routing line 56, terminal 58 and cap 64 are therefore thicker. In addition, dielectric layer 38 is omitted. As a result, pad 54, routing line 56 and terminal 58 contact adhesive 30.

Adhesive 30 contacts and is sandwiched between and fills the space between base 62 and conductive trace 70. Thus, adhesive 30 alone can intersect an imaginary vertical line between base 62 and pad 54, between base 62 and routing line 56 and between base 62 and terminal 58. Furthermore, adhesive 30 is thicker to accommodate the absence of dielectric layer 38 and solder mask 74 is thicker to accommodate the increased thickness of pad 54, routing line 56, terminal 58 and cap 64.

Thermal board 82 can be manufactured in a manner similar to thermal board 80 with suitable adjustments for conductive layer 36. For instance, metal plate 10 is stamped to form bump 16, ledge 18 and cavity 20, adhesive 30 is mounted on ledge 18, conductive layer 36 alone is mounted on adhesive 30, heat and pressure are applied to flow and solidify adhesive 30, grinding is applied to planarize bump 16, adhesive 30 and conductive layer 36 at the top surface and then plated layers 44 and 46 are deposited on the structure as previously described. Thereafter, conductive layer 36 and plated layer 44 are etched to form pad 54, routing line 56, terminal 58 and cap 64 while ledge 18 and plated layer 46 remain unpatterned, solder mask 74 is formed on the top surface and then plated contacts 78 provide a surface finish for bump 16, pad 54, terminal 58, base 62 and cap 64. Thereafter, adhesive 30, base 62 and solder mask 74 are cut or cracked at the peripheral edges of thermal board 82 to detach it from the batch.

Figure 6A:
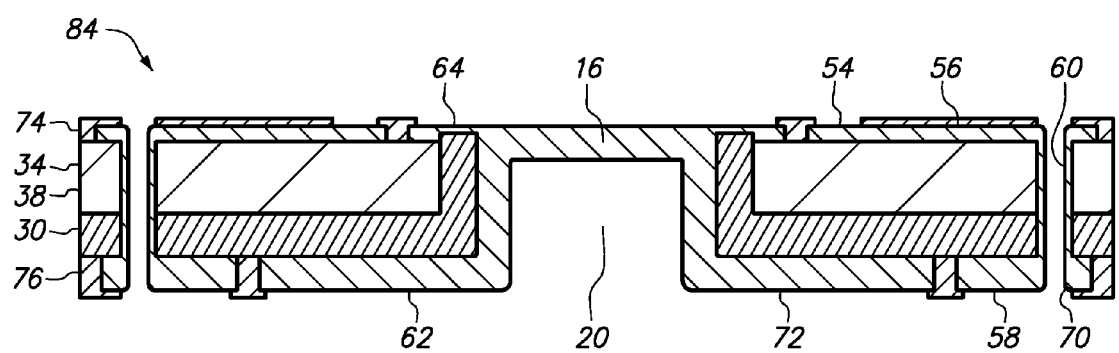
FIGS. 6A, 6B and 6C are cross-sectional, top and bottom views, respectively, of a thermal board with vertical signal routing in accordance with an embodiment of the present invention.
Figure 6B:
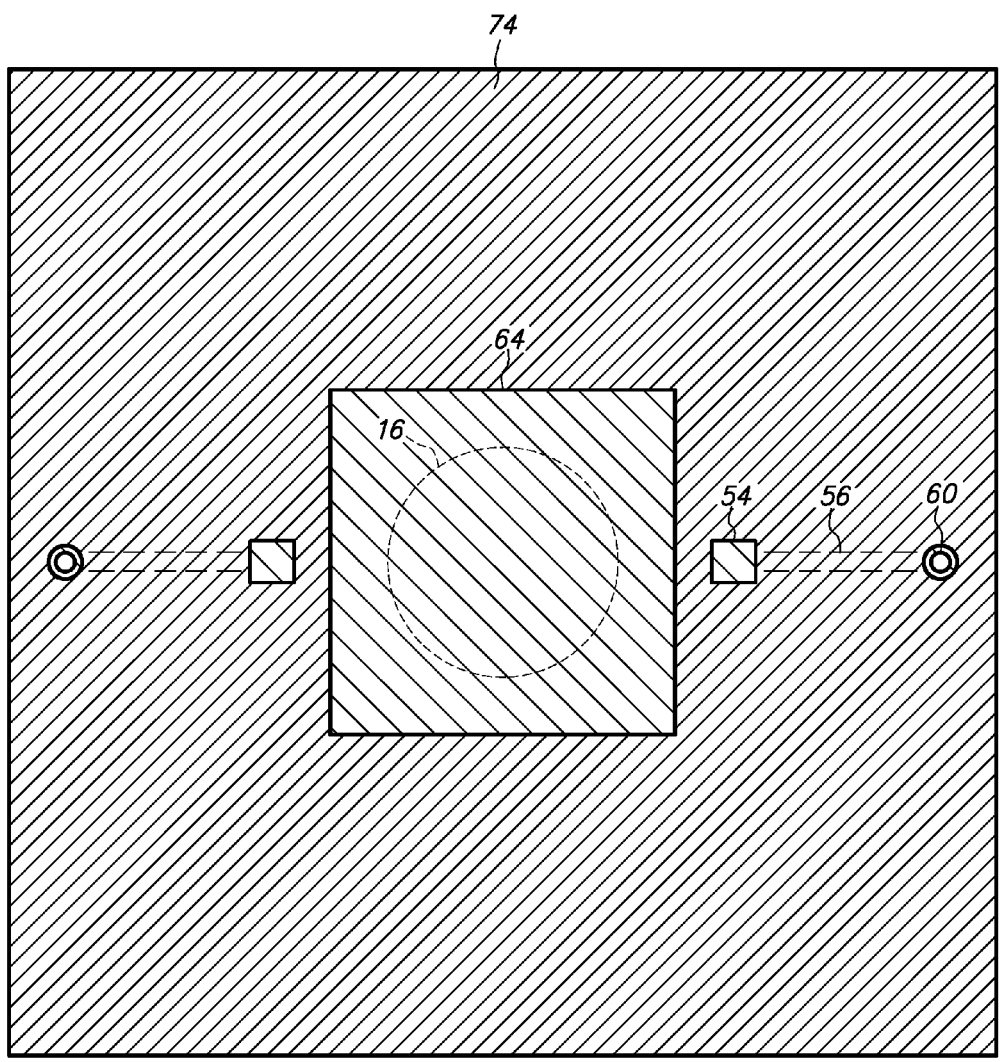
Figure 6C:
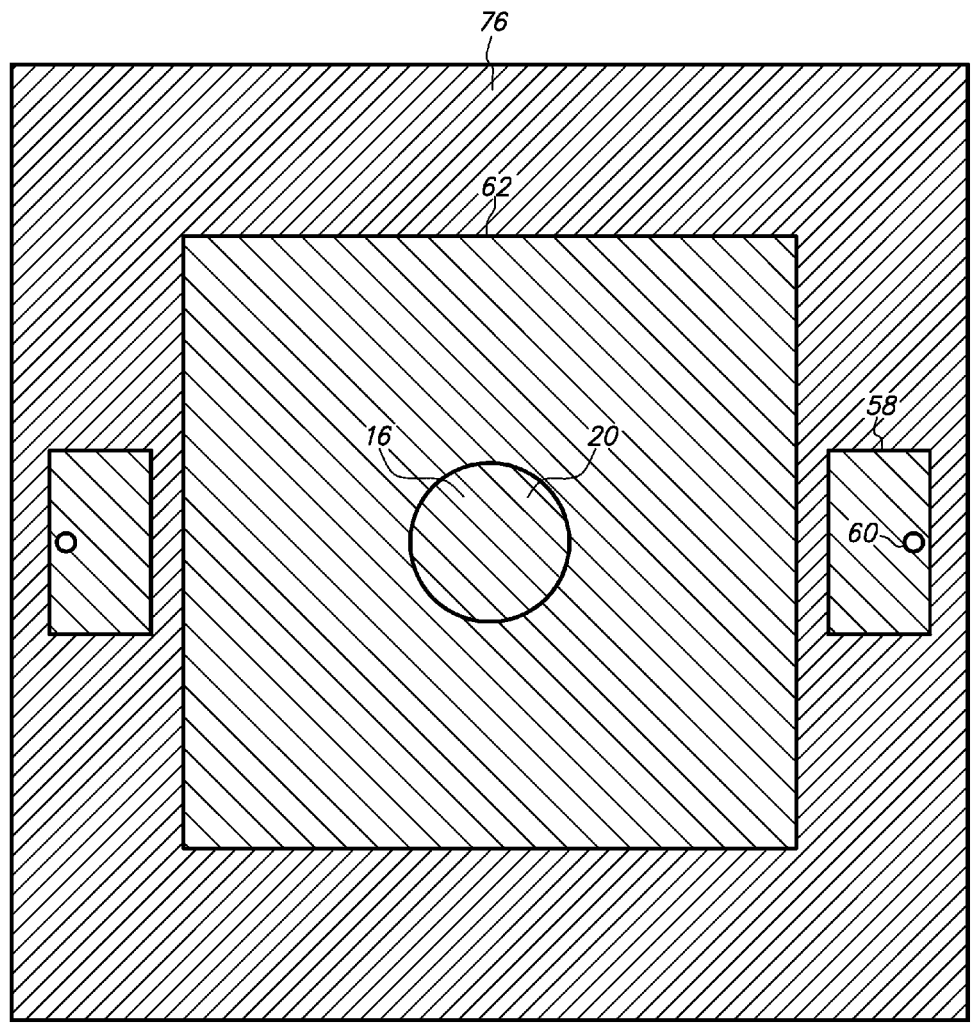

FIGS. 6A, 6B and 6C are cross-sectional, top and bottom views, respectively, of a thermal board with vertical signal routing in accordance with an embodiment of the present invention.

In this embodiment, the terminal extends below the adhesive and a plated through-hole electrically connects the routing line and the terminal. For purposes of brevity, any description of thermal board 80 is incorporated herein insofar as the same is applicable, and the same description need not be repeated. Likewise, elements of the thermal board similar to those in thermal board 80 have corresponding reference numerals.

Thermal board 84 includes adhesive 30, conductive trace 70, heat spreader 72 and solder masks 74 and 76. Conductive trace 70 includes pad 54, routing line 56, terminal 58 and plated through-hole 60. Heat spreader 72 includes bump 16, base 62 and cap 64.

Conductive trace 70 provides horizontal (fan-out) routing from pad 54 to plated through-hole 60 by routing line 56 and vertical (top to bottom) routing from routing line 56 to terminal 58 by plated through-hole 60. Thus, routing line 56 provides an electrically conductive path between pad 54 and plated through-hole 60, plated through-hole 60 provides an electrically conductive path between routing line 56 and terminal 58, and routing line 56 and plated through-hole 60 provide an electrically conductive path between pad 54 and terminal 58.

Pad 54 and routing line 56 contact dielectric layer 38, are spaced from adhesive 30 and extend above adhesive 30 and dielectric layer 38. Terminal 58 contacts adhesive 30, is spaced from dielectric layer 38 and extends below adhesive 30 and dielectric layer 38. Plated through-hole 60 contacts and extends through adhesive 30 and dielectric layer 38. Base 62 is spaced from the peripheral edges of thermal board 84 and does not cover adhesive 30, substrate 34, routing line 56, terminal 58, plated through-hole 60 or solder mask 74 in the downward direction. Furthermore, terminal 58 and base 62 include selected portions of ledge 18, have the same thickness and are coplanar with one another at the bottom surface.

Solder mask 74 is an electrically insulative layer that is selectively patterned to expose pad 54, plated through-hole 60 and cap 64 in the upward direction and cover dielectric layer 38 where it is otherwise exposed in the upward direction, and solder mask 76 is an electrically insulative layer that is selectively patterned to expose bump 16, terminal 58 and base 62 in the downward direction and cover adhesive 30 where it is otherwise exposed in the downward direction.

Thermal board 84 can be manufactured in a manner similar to thermal board 80 with suitable adjustments for conductive trace 70, heat spreader 72 and solder masks 74 and 76. For instance, metal plate 10 is stamped to form bump 16, ledge 18 and cavity 20, adhesive 30 is mounted on ledge 18, substrate 34 is mounted on adhesive 30, heat and pressure are applied to flow and solidify adhesive 30 and then grinding is applied to planarize bump 16, adhesive 30 and conductive layer 36 at the top surface as previously described.

Thereafter, a hole is drilled through ledge 18, adhesive 30, conductive layer 36 and dielectric layer 38 and then a plated layer is deposited on the structure to form plated layer 44 on the top surface, plated layer 46 on the bottom surface and plated through-hole 60 in the hole.

Thereafter etch mask 50 is formed on plated layer 44 and selectively exposes plated layer 44 with a pattern that defines pad 54, routing line 56 and cap 64, and etch mask 52 is formed on plated layer 46 and selectively exposes plated layer 46 with a pattern that defines terminal 58 and base 62. Thereafter, conductive layer 36 and plated layer 44 are etched to form pad 54, routing line 56 and cap 64 as defined by etch mask 50, thereby exposing dielectric layer 38 but not adhesive 30 in the upward direction, and ledge 18 and plated layer 46 are etched to form terminal 58 and base 62 as defined by etch mask 52, thereby exposing adhesive 30 but not dielectric layer 38 in the downward direction. Terminal 58 and base 62 include selected portions of ledge 18 and plated layer 46 defined by etch mask 52 that are spaced and separated from one another. Furthermore, terminal 58 includes a portion of ledge 18 that is spaced and separated from bump 16 and base 62 includes a portion of ledge 18 that is adjacent to and integral with and extends laterally from bump 16.

Thereafter, solder mask 74 is formed on the top surface and solder mask 76 is formed on the bottom surface. Solder masks 74 and 76 are initially a photoimageable liquid resin that is dispensed on the top and bottom surfaces, respectively. Thereafter, solder masks 74 and 76 are patterned by selectively applying light through reticles (not shown) so that the solder mask portions exposed to the light are rendered insoluble, applying a developer solution to remove the solder mask portions that are unexposed to the light and remain soluble and then hard baking, as is conventional.

Thereafter, plated contacts 78 provide a surface finish for bump 16, pad 54, terminal 58, plated through-hole 60, base 62 and cap 64. Thereafter, adhesive 30, dielectric layer 38 and solder masks 74 and 76 are cut or cracked at the peripheral edges of thermal board 84 to detach it from the batch.

Figure 7A:
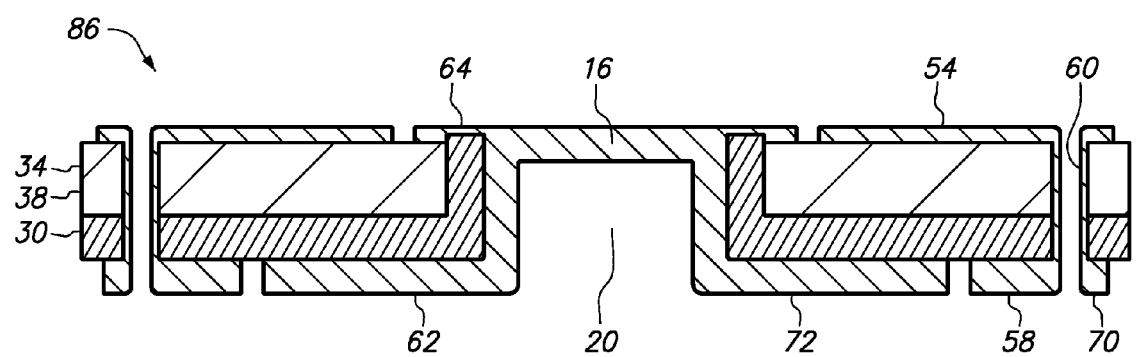
FIGS. 7A, 7B and 7C are cross-sectional, top and bottom views, respectively, of a thermal board with vertical signal routing in accordance with an embodiment of the present invention.
Figure 7B:
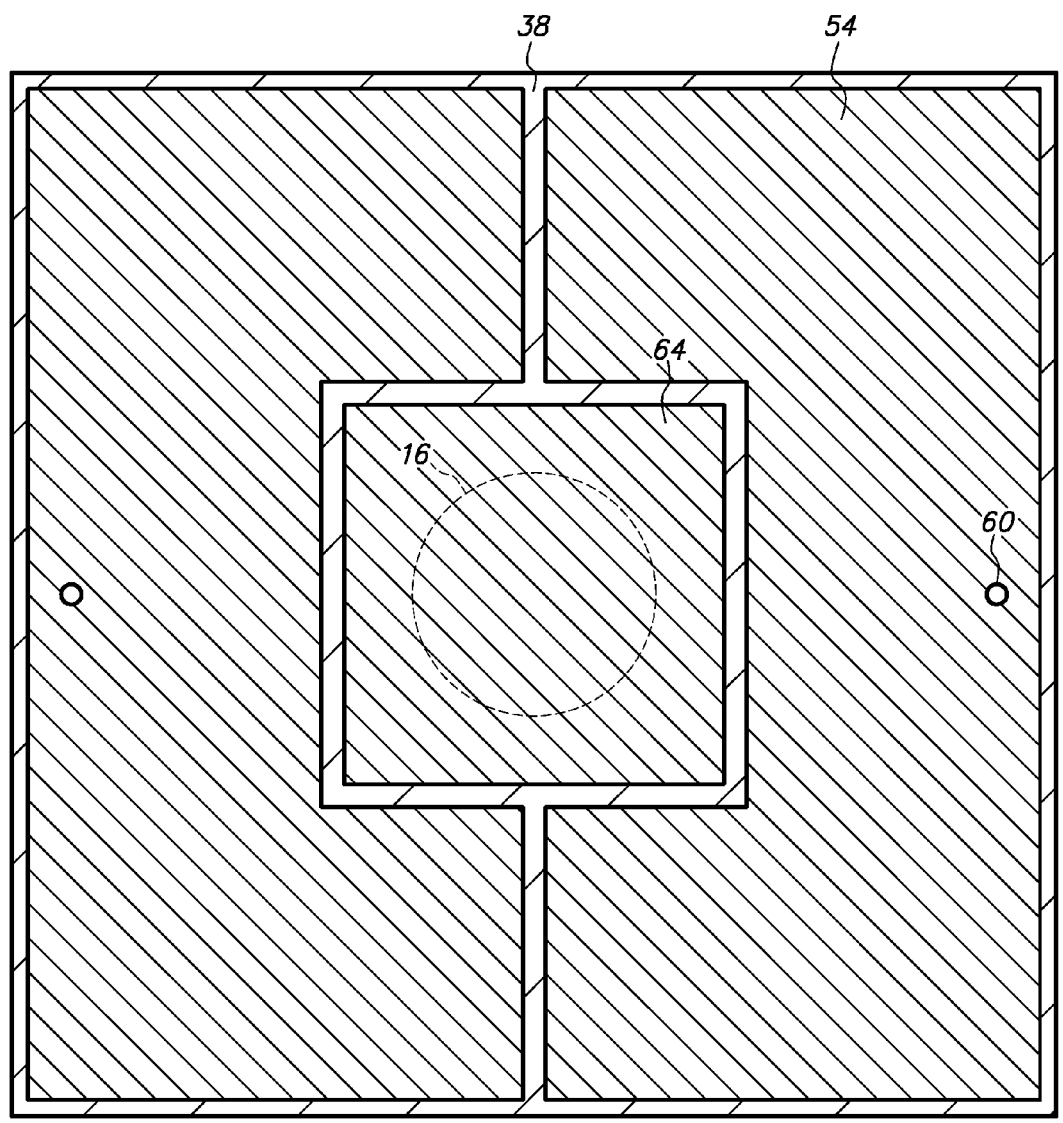
Figure 7C:
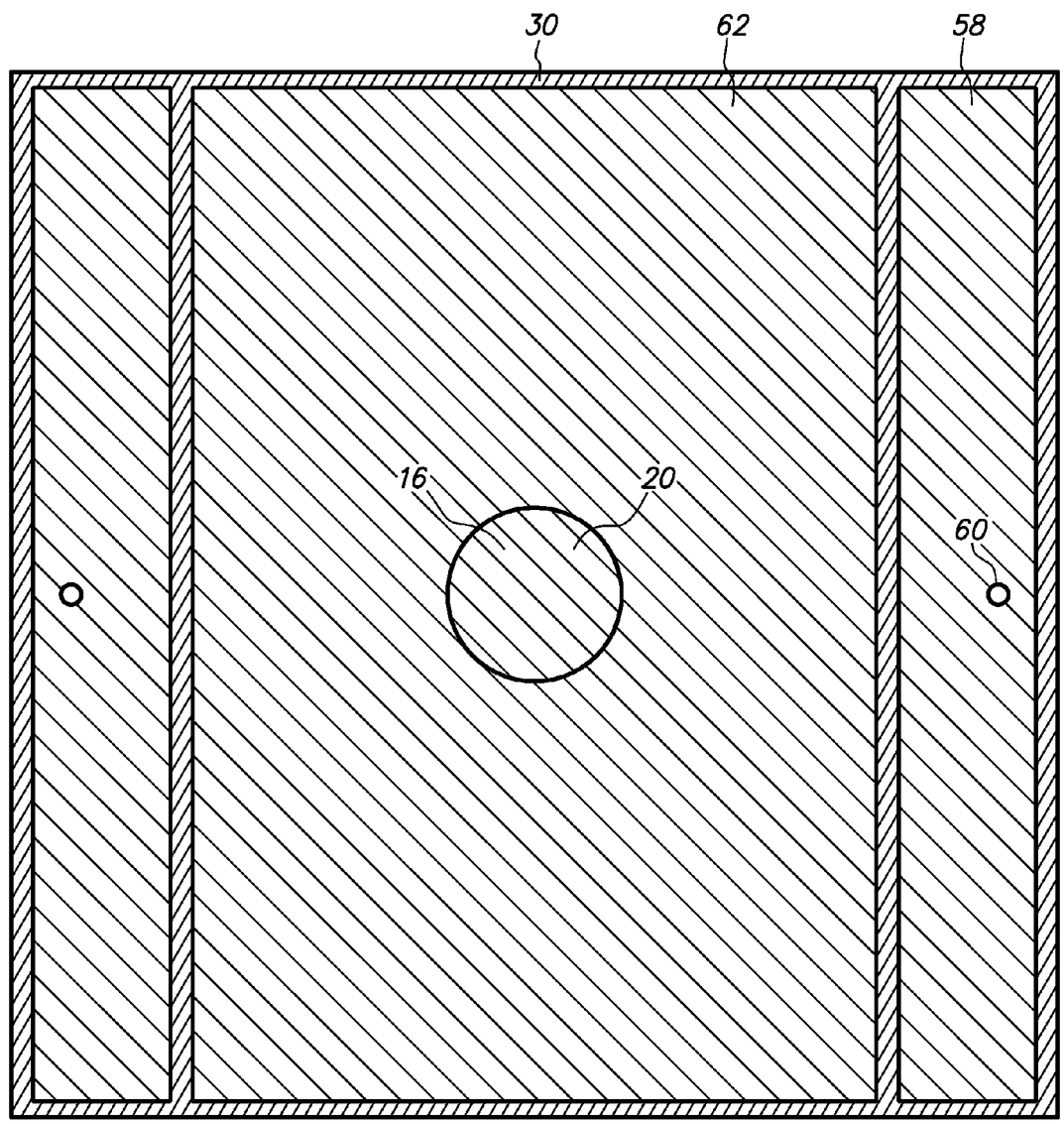

FIGS. 7A, 7B and 7C are cross-sectional, top and bottom views, respectively, of a thermal board with vertical signal routing in accordance with an embodiment of the present invention.

In this embodiment, the terminal extends below the adhesive, the routing line is omitted and a plated through-hole electrically connects the pad and the terminal. For purposes of brevity, any description of thermal board 80 is incorporated herein insofar as the same is applicable, and the same description need not be repeated. Likewise, elements of the thermal board similar to those in thermal board 80 have corresponding reference numerals.

Thermal board 86 includes adhesive 30, conductive trace 70 and heat spreader 72. Conductive trace 70 includes pad 54, terminal 58 and plated through-hole 60. Heat spreader 72 includes bump 16, base 62 and cap 64.

Conductive trace 70 provides horizontal (fan-out) routing from pad 54 to plated through-hole 60 and vertical (top to bottom) routing from pad 54 to terminal 58 by plated through-hole 60. Thus, plated through-hole 60 provides an electrically conductive path between pad 54 and terminal 58.

Pad 54 contacts dielectric layer 38, is spaced from adhesive 30 and extends above adhesive 30 and dielectric layer 38. Terminal 58 contacts adhesive 30, is spaced from dielectric layer 38 and extends below adhesive 30 and dielectric layer 38. Plated through-hole 60 contacts and extends through adhesive 30 and dielectric layer 38. Base 62 is spaced from the peripheral edges of thermal board 86 and does not cover adhesive 30, substrate 34, pad 54, terminal 58 or plated through-hole 60 in the downward direction. Furthermore, terminal 58 and base 62 include selected portions of ledge 18, have the same thickness and are coplanar with one another at the bottom surface.

Solder mask 74 is omitted. As a result, plated contacts 78 occupy 85 to 95 percent of the top surface of thermal board 86 and provide a highly reflective top surface which is particularly useful if an LED chip is subsequently mounted on cap 64.

Thermal board 86 can be manufactured in a manner similar to thermal board 80 with suitable adjustments for conductive trace 70 and heat spreader 72. For instance, metal plate 10 is stamped to form bump 16, ledge 18 and cavity 20, adhesive 30 is mounted on ledge 18, substrate 34 is mounted on adhesive 30, heat and pressure are applied to flow and solidify adhesive 30 and then grinding is applied to planarize bump 16, adhesive 30 and conductive layer 36 at the top surface as previously described.

Thereafter, a hole is drilled through ledge 18, adhesive 30, conductive layer 36 and dielectric layer 38 and then a plated layer is deposited on the structure to form plated layer 44 on the top surface, plated layer 46 on the bottom surface and plated through-hole 60 in the hole.

Thereafter etch mask 50 is formed on plated layer 44 and selectively exposes plated layer 44 with a pattern that defines pad 54 and cap 64, and etch mask 52 is formed on plated layer 46 and selectively exposes plated layer 46 with a pattern that defines terminal 58 and base 62. Thereafter, conductive layer 36 and plated layer 44 are etched to form pad 54 and cap 64 as defined by etch mask 50, thereby exposing dielectric layer 38 but not adhesive 30 in the upward direction, and ledge 18 and plated layer 46 are etched to form terminal 58 and base 62 as defined by etch mask 52, thereby exposing adhesive 30 but not dielectric layer 38 in the downward direction. Terminal 58 and base 62 include selected portions of ledge 18 and plated layer 46 defined by etch mask 52 that are spaced and separated from one another. Furthermore, terminal 58 includes a portion of ledge 18 that is spaced and separated from bump 16 and base 62 includes a portion of ledge 18 that is adjacent to and integral with and extends laterally from bump 16.

Thereafter, plated contacts 78 provide a surface finish for bump 16, pad 54, terminal 58, plated through-hole 60, base 62 and cap 64. Thereafter, adhesive 30 and dielectric layer 38 are cut or cracked at the peripheral edges of thermal board 86 to detach it from the batch.

Figure 8A:
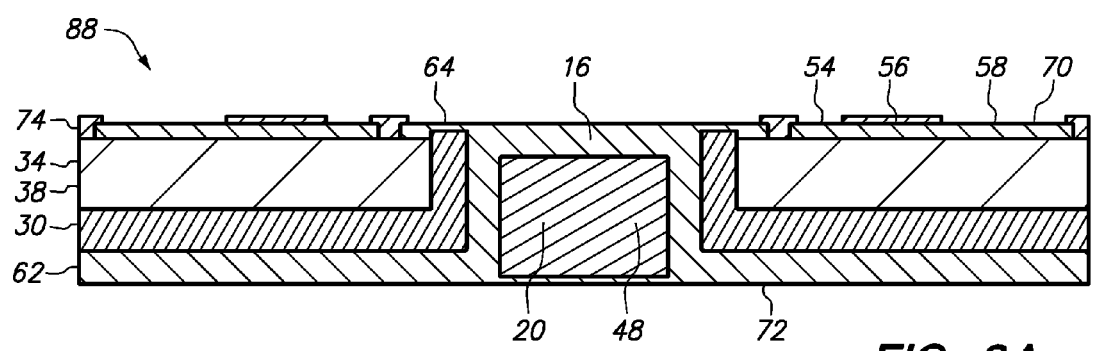
FIGS. 8A, 8B and 8C are cross-sectional, top and bottom views, respectively, of a thermal board with a filler in a sealed cavity in accordance with an embodiment of the present invention.
Figure 8B:
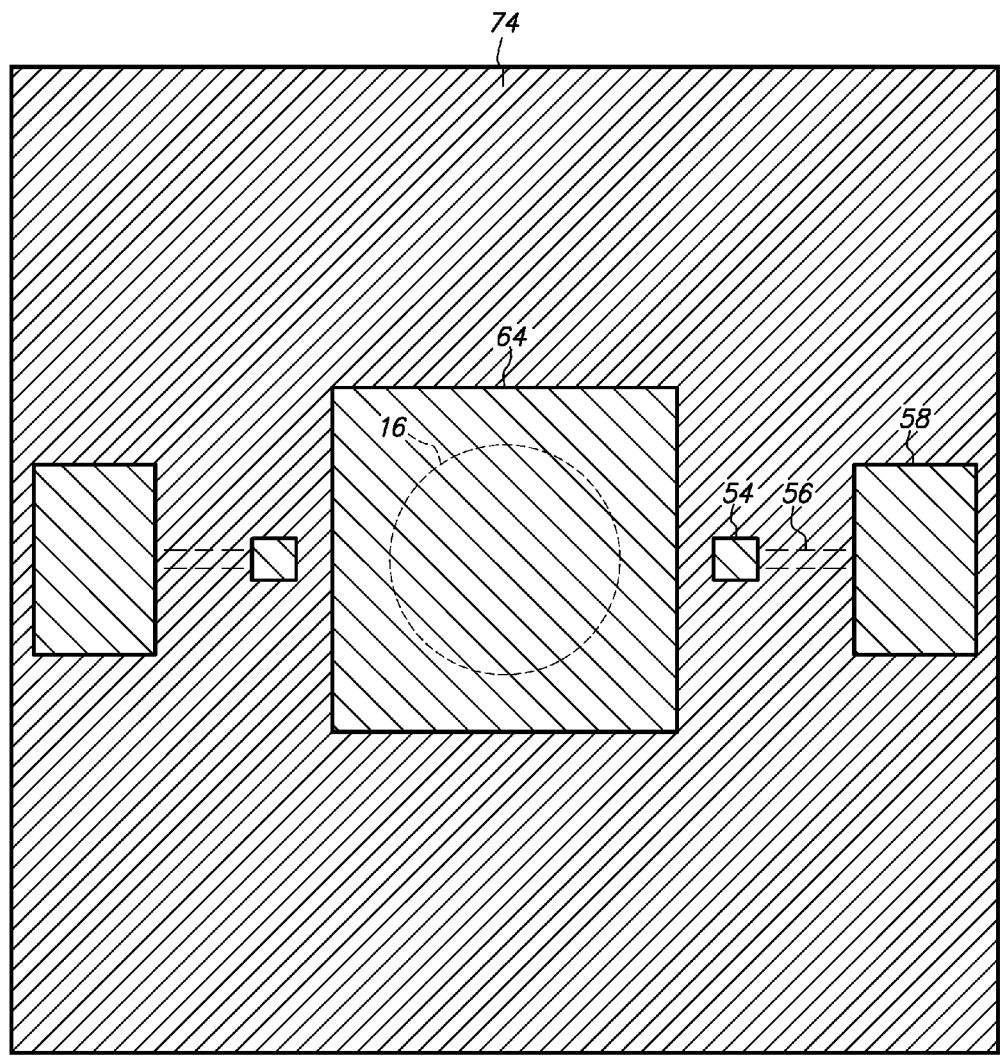
Figure 8C:
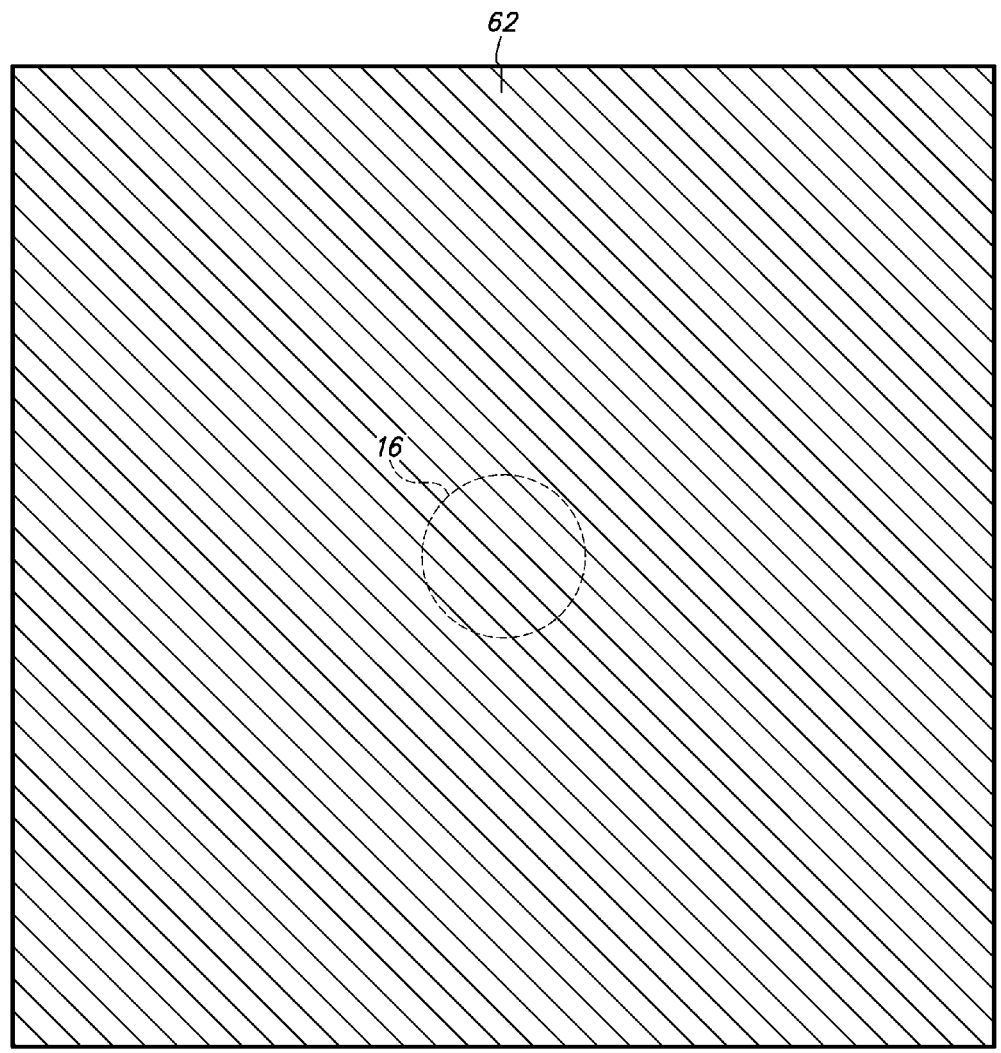

FIGS. 8A, 8B and 8C are cross-sectional, top and bottom views, respectively, of a thermal board with a filler in a sealed cavity in accordance with an embodiment of the present invention.

In this embodiment, a filler is deposited into the cavity before the adhesive is mounted on the ledge and the base seals the cavity. For purposes of brevity, any description of thermal board 80 is incorporated herein insofar as the same is applicable, and the same description need not be repeated. Likewise, elements of the thermal board similar to those in thermal board 80 have corresponding reference numerals.

Thermal board 88 includes adhesive 30, substrate 34, filler 48, conductive trace 70, heat spreader 72 and solder mask 74. Substrate 34 includes dielectric layer 38. Conductive trace 70 includes pad 54, routing line 56 and terminal 58. Heat spreader 72 includes bump 16, base 62 and cap 64.

Filler 48 is an electrically insulative epoxy that is located within and fills cavity 20. Therefore, cavity 20 contains filler 48 and is not hollow. Filler 48 contacts bump 16 in cavity 20, extends across most of bump 16 in the vertical and lateral directions, covers cavity 20 in the downward direction, is spaced from adhesive 30, substrate 34, cap 64 and conductive trace 70 and provides mechanical support for bump 16. In addition, cavity 20 is sealed by base 62. As a result, filler 48 contacts and is enclosed by bump 16 and base 62, and base 62 covers bump 16, cavity 20, filler 48 and cap 64 in the downward direction.

Thermal board 88 can be manufactured in a manner similar to thermal board 80 with suitable adjustments for filler 48. For instance, metal plate 10 is stamped to form bump 16, ledge 18 and cavity 20.

Thereafter, filler 48 is formed in cavity 20. Filler 48 is initially an epoxy paste that is selectively screen printed into cavity 20. Thereafter, the epoxy paste is heated and hardened at a relatively low temperature such as 190° C. Thereafter, filler 48 is planarized by grinding. For instance, a rotating diamond sand wheel and distilled water are applied to the bottom of the structure. Initially, the diamond sand wheel grinds only filler 48. As the grinding continues, filler 48 becomes thinner as its grinded surface migrates upwardly. Eventually the diamond sand wheel contacts ledge 18 and begins to grind ledge 18 as well. As the grinding continues, ledge 18 and filler 48 become thinner as their grinded surfaces migrate upwardly. The grinding continues until the desired thickness has been removed. Thereafter, the structure is rinsed in distilled water to remove contaminants. At this stage, ledge 18 and filler 48 are coplanar with one another at a smoothed lapped lateral bottom surface that faces in the downward direction.

Thereafter, adhesive 30 is mounted on ledge 18, substrate 34 is mounted on adhesive 30, heat and pressure are applied to flow and solidify adhesive 30, grinding is applied to planarize bump 16, adhesive 30 and conductive layer 36 at the top surface and then plated layers 44 and 46 are deposited on the structure. Plated layer 46 is deposited on filler 48 and covers filler 48 in the downward direction. As a result, plated layer 46 (and thus base 62) seals cavity 20 and seals filler 48 within cavity 20.

Thereafter, conductive layer 36 and plated layer 44 are etched to form pad 54, routing line 56, terminal 58 and cap 64 while ledge 18 and plated layer 46 remain unpatterned, solder mask 74 is formed on the top surface and then plated contacts 78 provide a surface finish for pad 54, terminal 58, base 62 and cap 64. Thereafter, adhesive 30, dielectric layer 38, base 62 and solder mask 74 are cut or cracked at the peripheral edges of thermal board 88 to detach it from the batch.

Figure 9A:
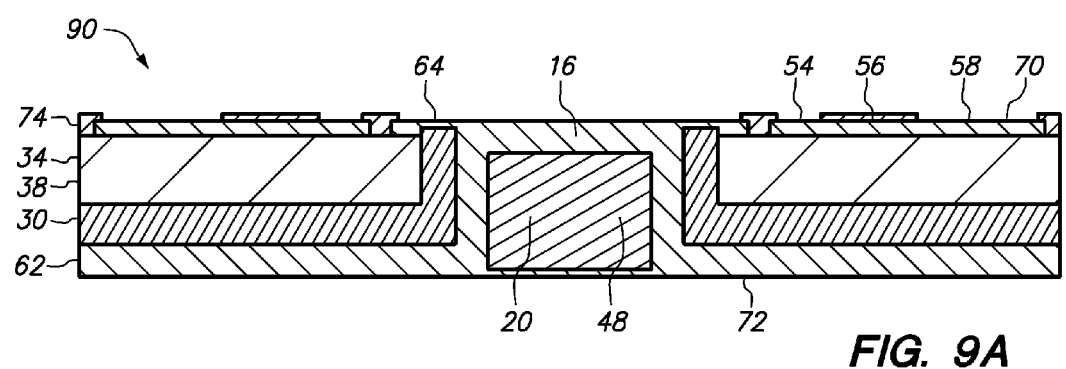
FIGS. 9A, 9B and 9C are cross-sectional, top and bottom views, respectively, of a thermal board with a filler in a sealed cavity in accordance with an embodiment of the present invention.
Figure 9B:
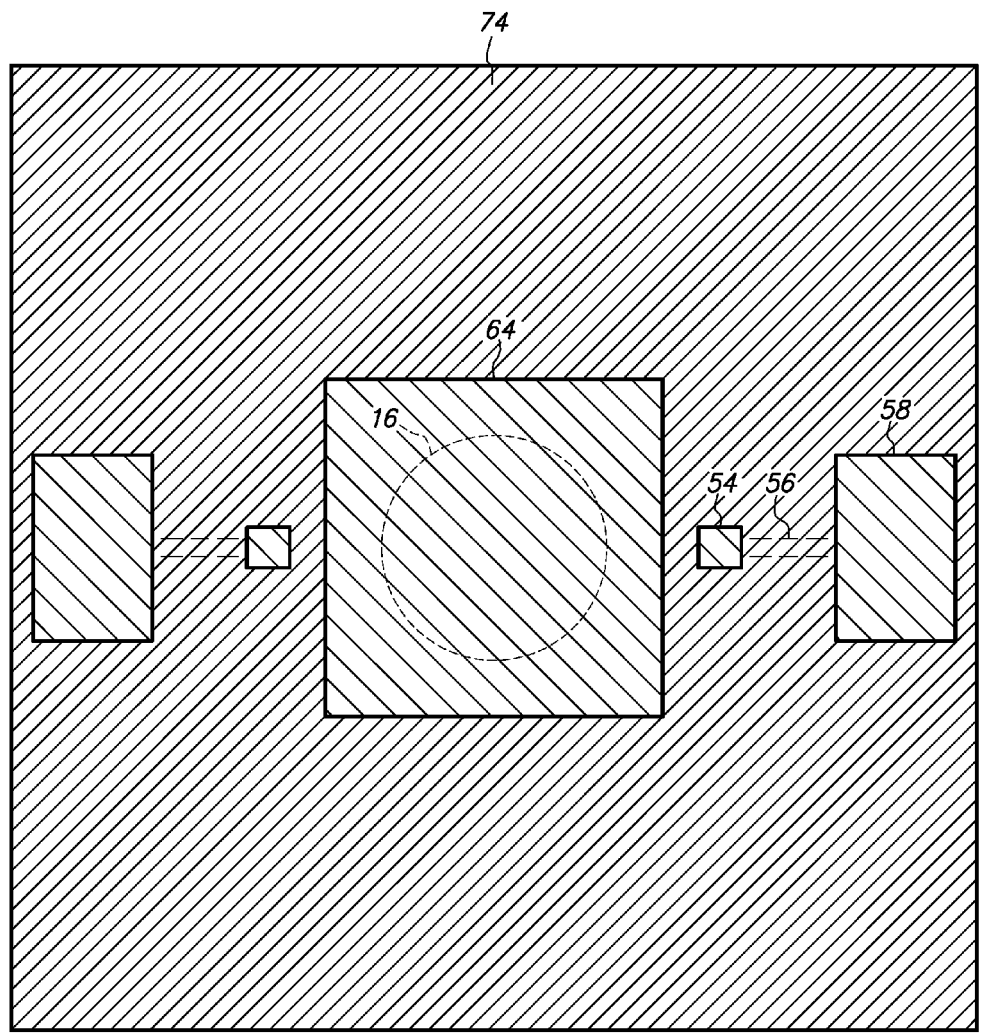
Figure 9C:
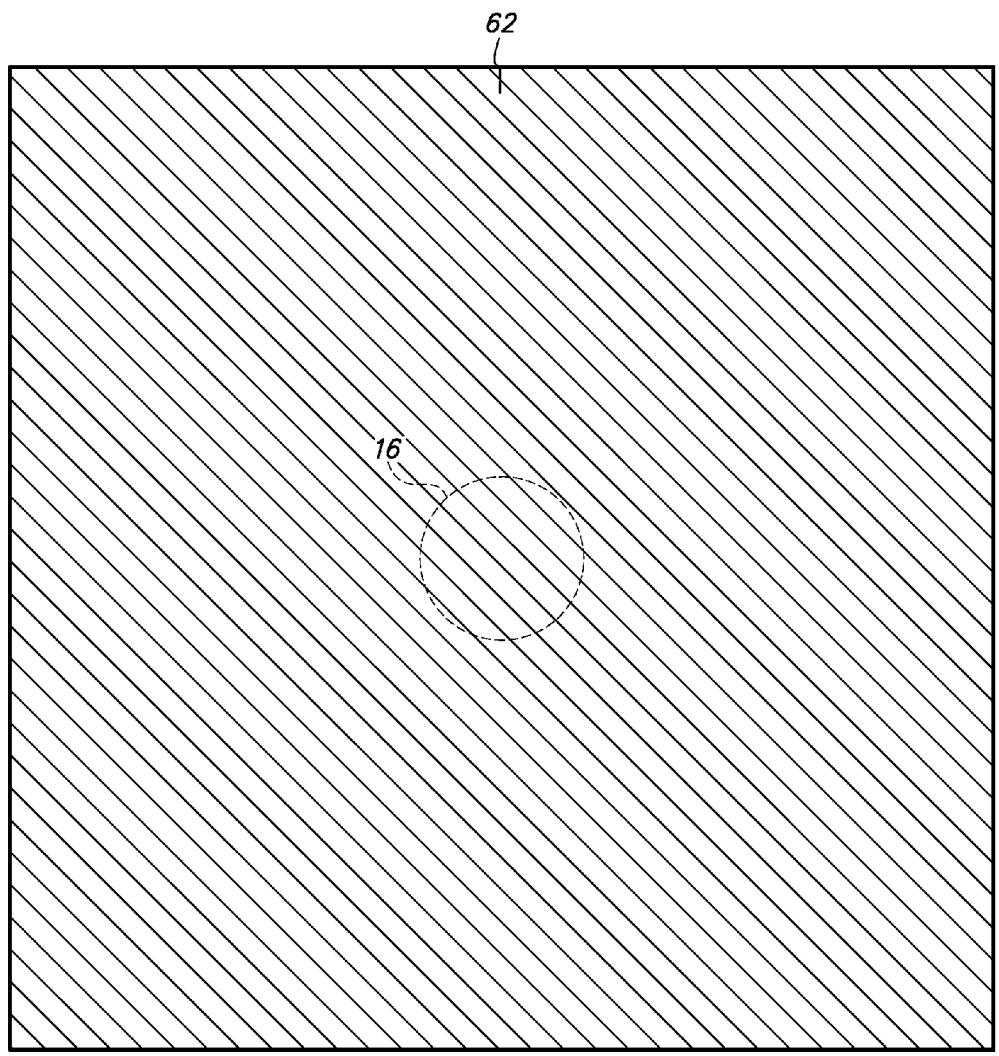

FIGS. 9A, 9B and 9C are cross-sectional, top and bottom views, respectively, of a thermal board with a filler in a sealed cavity in accordance with an embodiment of the present invention.

In this embodiment, a filler is deposited into the cavity after the adhesive is solidified and the base seals the cavity. For purposes of brevity, any description of thermal board 80 is incorporated herein insofar as the same is applicable, and the same description need not be repeated. Likewise, elements of the thermal board similar to those in thermal board 80 have corresponding reference numerals.

Thermal board 90 includes adhesive 30, substrate 34, filler 48, conductive trace 70, heat spreader 72 and solder mask 74. Substrate 34 includes dielectric layer 38. Conductive trace 70 includes pad 54, routing line 56 and terminal 58. Heat spreader 72 includes bump 16, base 62 and cap 64.

Filler 48 is an electrically insulative epoxy that is located within and fills cavity 20. Therefore, cavity 20 contains filler 48 and is not hollow. Filler 48 contacts bump 16 in cavity 20, extends across most of bump 16 in the vertical and lateral directions, covers cavity 20 in the downward direction, is spaced from adhesive 30, substrate 34, cap 64 and conductive trace 70 and provides mechanical support for bump 16. In addition, cavity 20 is sealed by base 62. As a result, filler 48 contacts and is enclosed by bump 16 and base 62, and base 62 covers bump 16, cavity 20, filler 48 and cap 64 in the downward direction.

Thermal board 90 can be manufactured in a manner similar to thermal board 80 with suitable adjustments for filler 48. For instance, metal plate 10 is stamped to form bump 16, ledge 18 and cavity 20. Thereafter, adhesive 30 is mounted on ledge 18, substrate 34 is mounted on adhesive 30 and heat and pressure are applied to flow and solidify adhesive 30.

Thereafter, filler 48 is formed in cavity 20. Filler 48 is initially an epoxy paste that is selectively screen printed into cavity 20. Thereafter, the epoxy paste is heated and hardened at a relatively low temperature such as 190° C. Thereafter, filler 48 is planarized by grinding. For instance, a rotating diamond sand wheel and distilled water are applied to the bottom of the structure. Initially, the diamond sand wheel grinds only filler 48. As the grinding continues, filler 48 becomes thinner as its grinded surface migrates upwardly. Eventually the diamond sand wheel contacts ledge 18 and begins to grind ledge 18 as well. As the grinding continues, ledge 18 and filler 48 become thinner as their grinded surfaces migrate upwardly. The grinding continues until the desired thickness has been removed. Thereafter, the structure is rinsed in distilled water to remove contaminants. At this stage, ledge 18 and filler 48 are coplanar with one another at a smoothed lapped lateral bottom surface that faces in the downward direction.

Grinding is also applied to planarize bump 16, adhesive 30 and conductive layer 36 at the top surface.

Thereafter, plated layers 44 and 46 are deposited on the structure. Plated layer 46 is deposited on filler 48 and covers filler 48 in the downward direction. As a result, plated layer 46 (and thus base 62) seals cavity 20 and seals filler 48 within cavity 20.

Thereafter, conductive layer 36 and plated layer 44 are etched to form pad 54, routing line 56, terminal 58 and cap 64 while ledge 18 and plated layer 46 remain unpatterned, solder mask 74 is formed on the top surface and then plated contacts 78 provide a surface finish for pad 54, terminal 58, base 62 and cap 64. Thereafter, adhesive 30, dielectric layer 38, base 62 and solder mask 74 are cut or cracked at the peripheral edges of thermal board 90 to detach it from the batch.

Figure 10A:
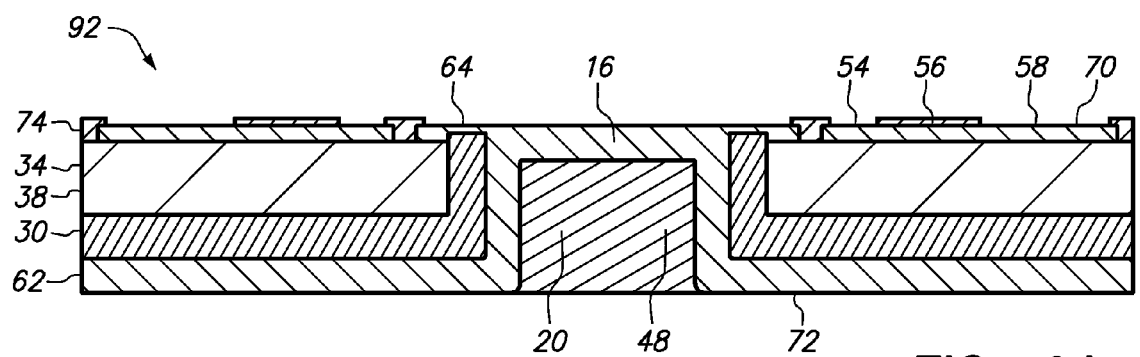
FIGS. 10A, 10B and 10C are cross-sectional, top and bottom views, respectively, of a thermal board with a filler in an unsealed cavity in accordance with an embodiment of the present invention.
Figure 10B:
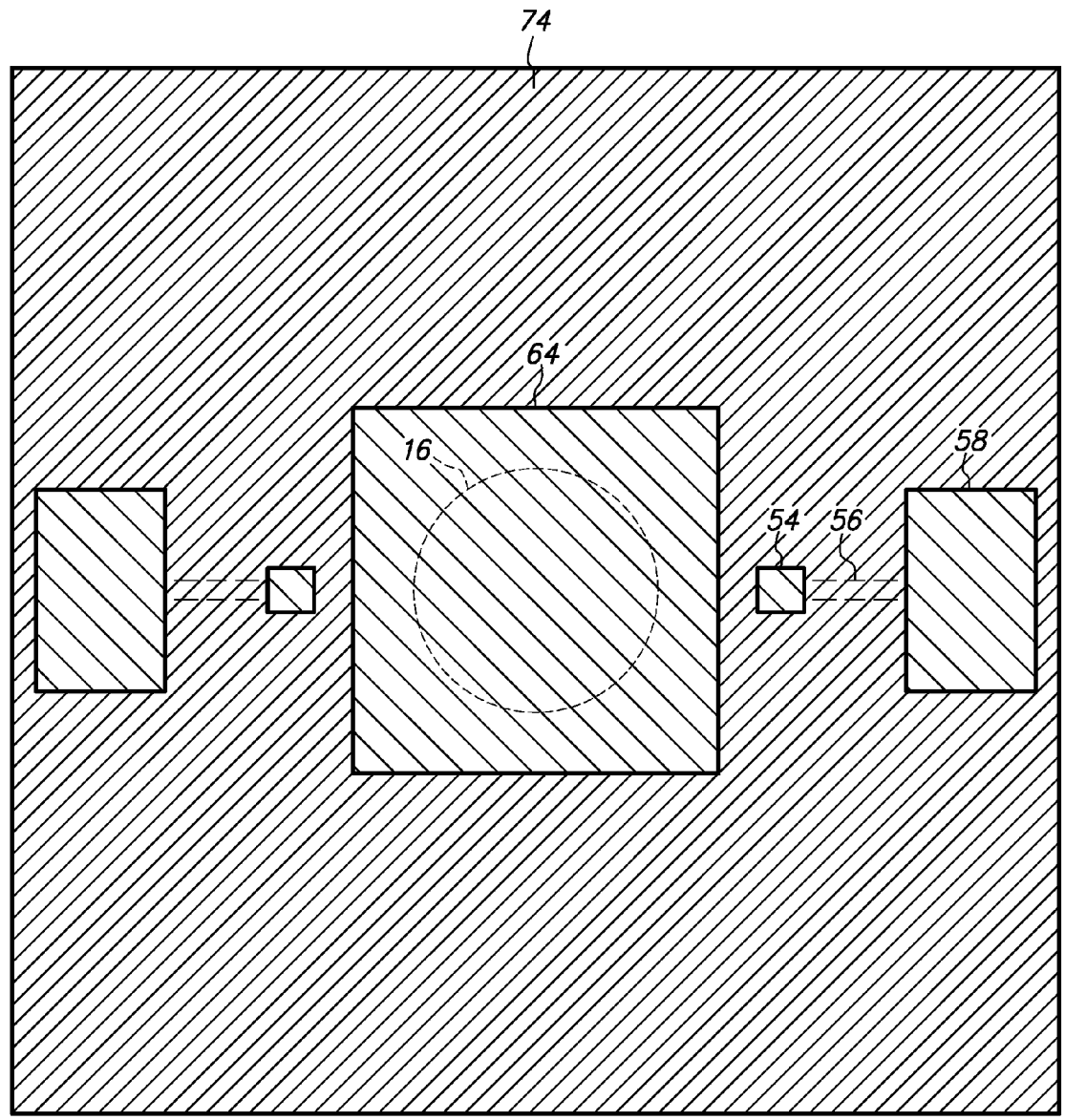
Figure 10C:
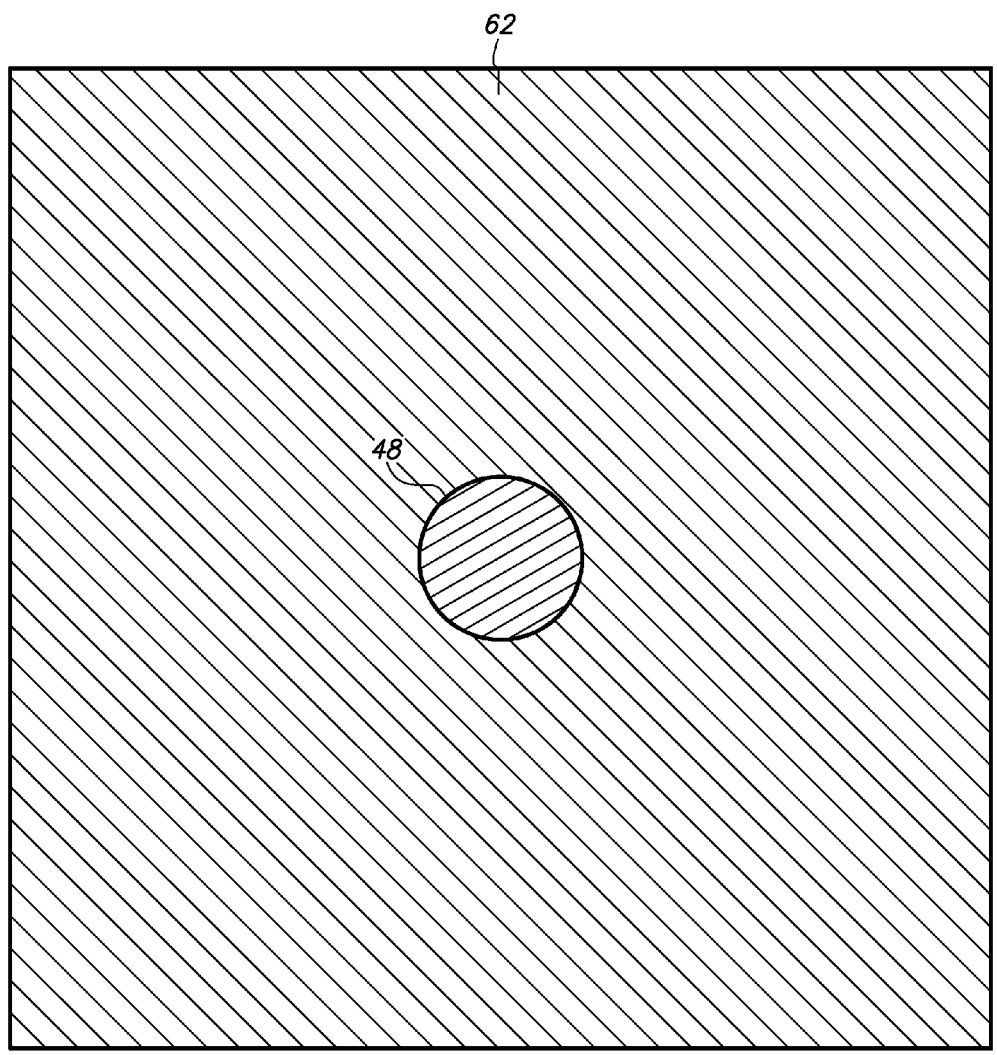

FIGS. 10A, 10B and 10C are cross-sectional, top and bottom views, respectively, of a thermal board with a filler in an unsealed cavity in accordance with an embodiment of the present invention.

In this embodiment, a filler is deposited into the cavity after the plated layers are deposited on the structure and the cavity remains unsealed. For purposes of brevity, any description of thermal board 80 is incorporated herein insofar as the same is applicable, and the same description need not be repeated. Likewise, elements of the thermal board similar to those in thermal board 80 have corresponding reference numerals.

Thermal board 92 includes adhesive 30, substrate 34, filler 48, conductive trace 70, heat spreader 72 and solder mask 74. Substrate 34 includes dielectric layer 38. Conductive trace 70 includes pad 54, routing line 56 and terminal 58. Heat spreader 72 includes bump 16, base 62 and cap 64.

Filler 48 is an electrically insulative epoxy that is located within and fills cavity 20. Therefore, cavity 20 contains filler 48 and is not hollow. Filler 48 contacts bump 16 in cavity 20, extends across most of bump 16 in the vertical and lateral directions, covers cavity 20 in the downward direction, is spaced from adhesive 30, substrate 34, cap 64 and conductive trace 70 and provides mechanical support for bump 16. In addition, cavity 20 remains unsealed and filler 48 is exposed in the downward direction.

Thermal board 92 can be manufactured in a manner similar to thermal board 80 with suitable adjustments for filler 48. For instance, metal plate 10 is stamped to form bump 16, ledge 18 and cavity 20, adhesive 30 is mounted on ledge 18, substrate 34 is mounted on adhesive 30, heat and pressure are applied to flow and solidify adhesive 30, grinding is applied to planarize bump 16, adhesive 30 and conductive layer 36 at the top surface and then plated layers 44 and 46 are deposited on the structure as previously described.

Thereafter, filler 48 is formed in cavity 20. Filler 48 is initially an epoxy paste that is selectively screen printed into cavity 20. Thereafter, the epoxy paste is heated and hardened at a relatively low temperature such as 190° C. Thereafter, filler 48 is planarized by grinding. For instance, a rotating diamond sand wheel and distilled water are applied to the bottom of the structure. Initially, the diamond sand wheel grinds only filler 48. As the grinding continues, filler 48 becomes thinner as its grinded surface migrates upwardly. Eventually the diamond sand wheel contacts plated layer 46 and begins to grind plated layer 46 as well. As the grinding continues, plated layer 46 and filler 48 become thinner as their grinded surfaces migrate upwardly. The grinding continues until the desired thickness has been removed. Thereafter, the structure is rinsed in distilled water to remove contaminants. At this stage, plated layer 46 and filler 48 are coplanar with one another at a smoothed lapped lateral bottom surface that faces in the downward direction.

Thereafter, conductive layer 36 and plated layer 44 are etched to form pad 54, routing line 56, terminal 58 and cap 64 while ledge 18 and plated layer 46 remain unpatterned, solder mask 74 is formed on the top surface and then plated contacts 78 provide a surface finish for pad 54, terminal 58, base 62 and cap 64. Thereafter, adhesive 30, dielectric layer 38, base 62 and solder mask 74 are cut or cracked at the peripheral edges of thermal board 92 to detach it from the batch.

Figure 11A:
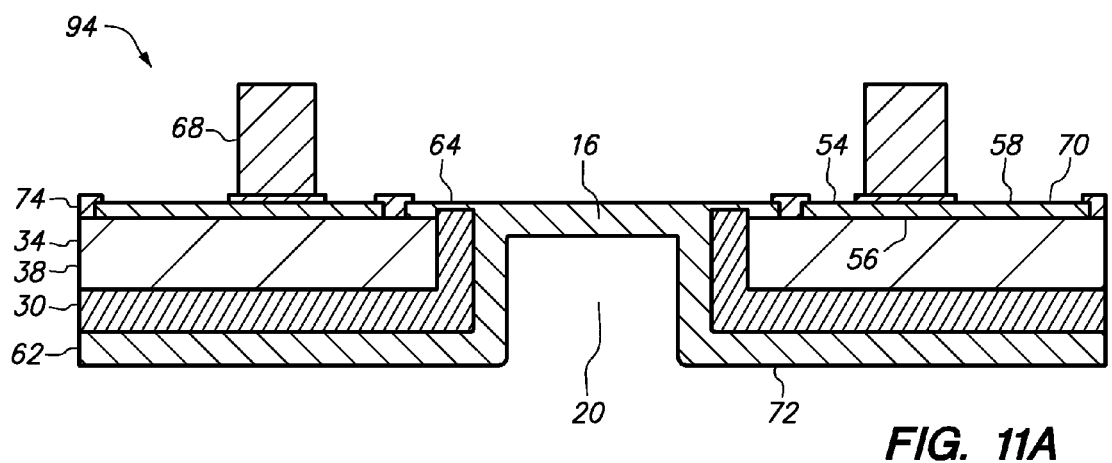
FIGS. 11A, 11B and 11C are cross-sectional, top and bottom views, respectively, of a thermal board with a rim in accordance with an embodiment of the present invention.
Figure 11B:
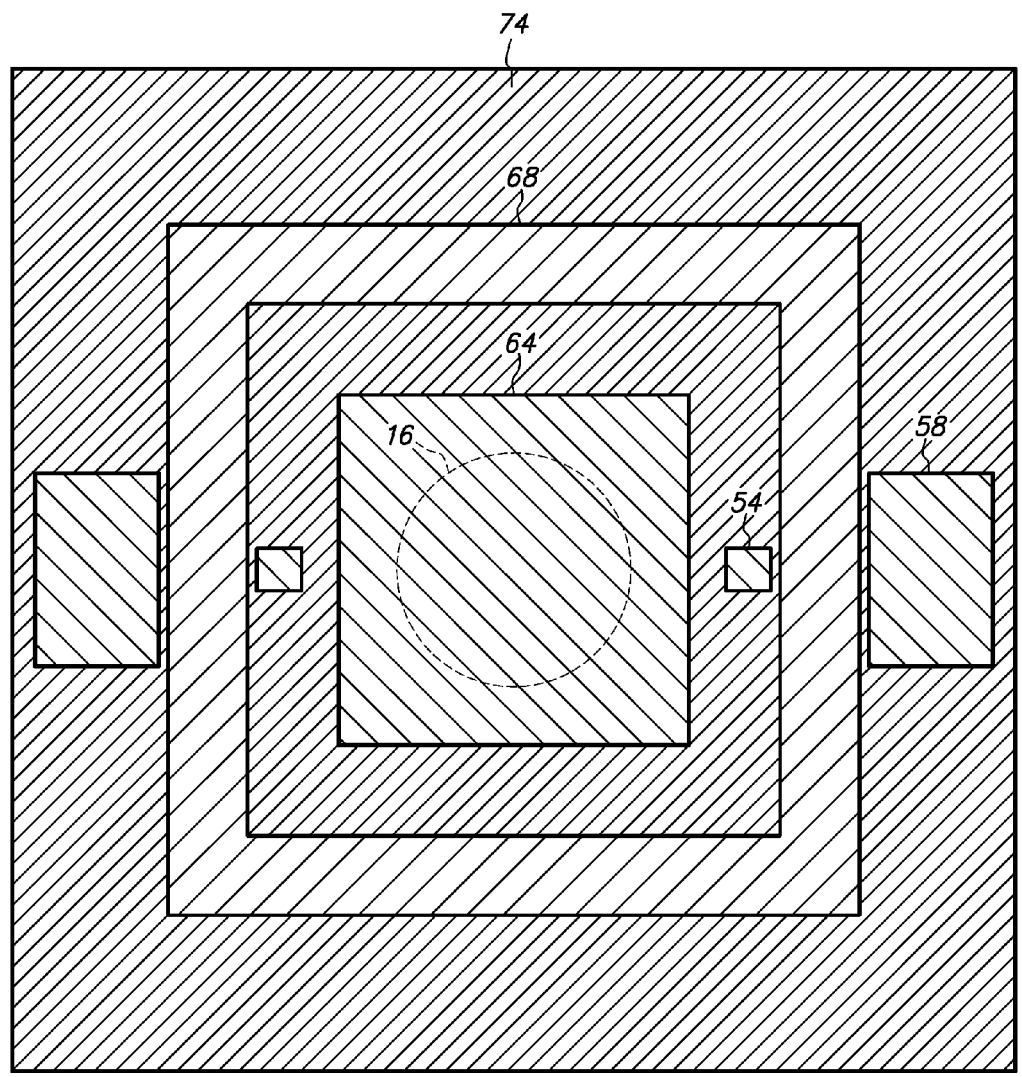
Figure 11C:
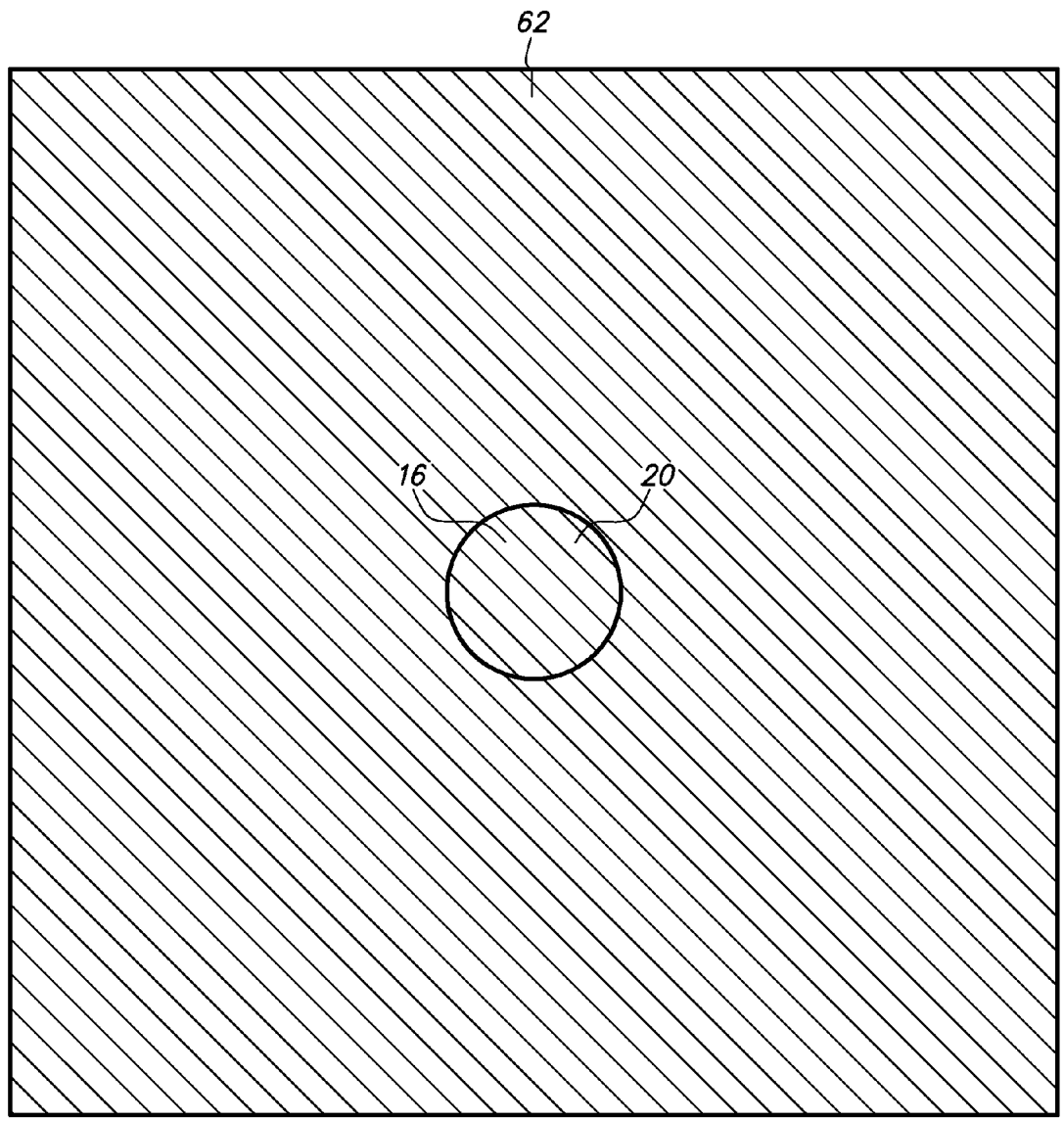

FIGS. 11A, 11B and 11C are cross-sectional, top and bottom views, respectively, of a thermal board with a rim in accordance with an embodiment of the present invention.

In this embodiment, a rim is mounted on the solder mask. For purposes of brevity, any description of thermal board 80 is incorporated herein insofar as the same is applicable, and the same description need not be repeated. Likewise, elements of the thermal board similar to those in thermal board 80 have corresponding reference numerals.

Thermal board 94 includes adhesive 30, substrate 34, rim 68, conductive trace 70, heat spreader 72 and solder mask 74. Substrate 34 includes dielectric layer 38. Conductive trace 70 includes pad 54, routing line 56 and terminal 58. Heat spreader 72 includes bump 16, base 62 and cap 64.

Rim 68 is a square shaped frame that contacts and extends above solder mask 74. Bump 16 and cap 64 are centrally located within the periphery of rim 68 and terminal 58 is located outside the periphery of rim 68. For instance, rim 68 has a height of 600 microns, a width (between its inner and outer sidewalls) of 500 microns and is laterally spaced from pad 54 by 500 microns.

Rim 68 includes a solder mask, a laminate and an adhesive film shown as a single layer for convenience of illustration. The solder mask contacts and extends above the laminate and provides the top surface, the adhesive film contacts and extends below the laminate and provides the bottom surface, and the laminate contacts and is sandwiched between and laminated to the solder mask and adhesive film. The solder mask, laminate and adhesive film are electrical insulators. For instance, the solder mask has a thickness of 50 microns, the laminate has a thickness of 500 microns, and the adhesive film has thickness of 50 microns. Thus, rim 68 has a height of 600 microns (50+500+50).

The laminate can be various dielectric films formed from numerous organic and inorganic electrical insulators. For instance, the laminate can be polyimide or FR-4 epoxy although other epoxies such as polyfunctional and bismaleimide triazine (BT) are suitable. Alternatively, rim 68 can include a metal ring on the adhesive film.

Thermal board 94 can be manufactured in a manner similar to thermal board 80 with suitable adjustments for rim 68. For instance, metal plate 10 is stamped to form bump 16, ledge 18 and cavity 20, adhesive 30 is mounted on ledge 18, substrate 34 is mounted on adhesive 30, heat and pressure are applied to flow and solidify adhesive 30, grinding is applied to planarize bump 16, adhesive 30 and conductive layer 36 at the top surface and then plated layers 44 and 46 are deposited on the structure as previously described. Thereafter, conductive layer 36 and plated layer 44 are etched to form pad 54, routing line 56, terminal 58 and cap 64 while ledge 18 and plated layer 46 remain unpatterned, solder mask 74 is formed on the top surface, rim 68 is mounted on solder mask 74 and then plated contacts 78 provide a surface finish for bump 16, pad 54, terminal 58, base 62 and cap 64. Thereafter, adhesive 30, dielectric layer 38, base 62 and solder mask 74 are cut or cracked at the peripheral edges of thermal board 94 to detach it from the batch.

Figure 12A:
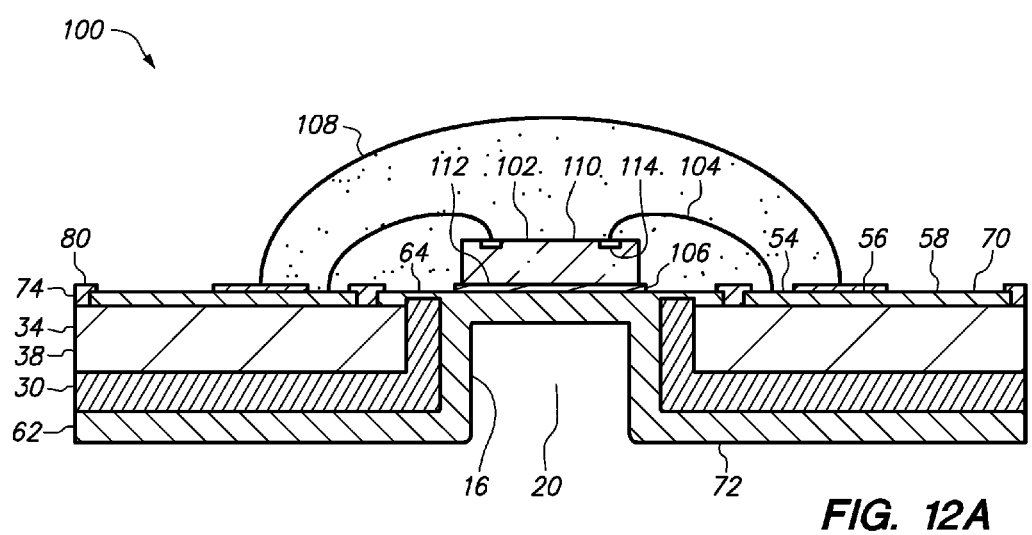
FIGS. 12A, 12B and 12C are cross-sectional, top and bottom views, respectively, of a semiconductor chip assembly that includes a thermal board, a semiconductor device and an encapsulant in accordance with an embodiment of the present invention.
Figure 12B:
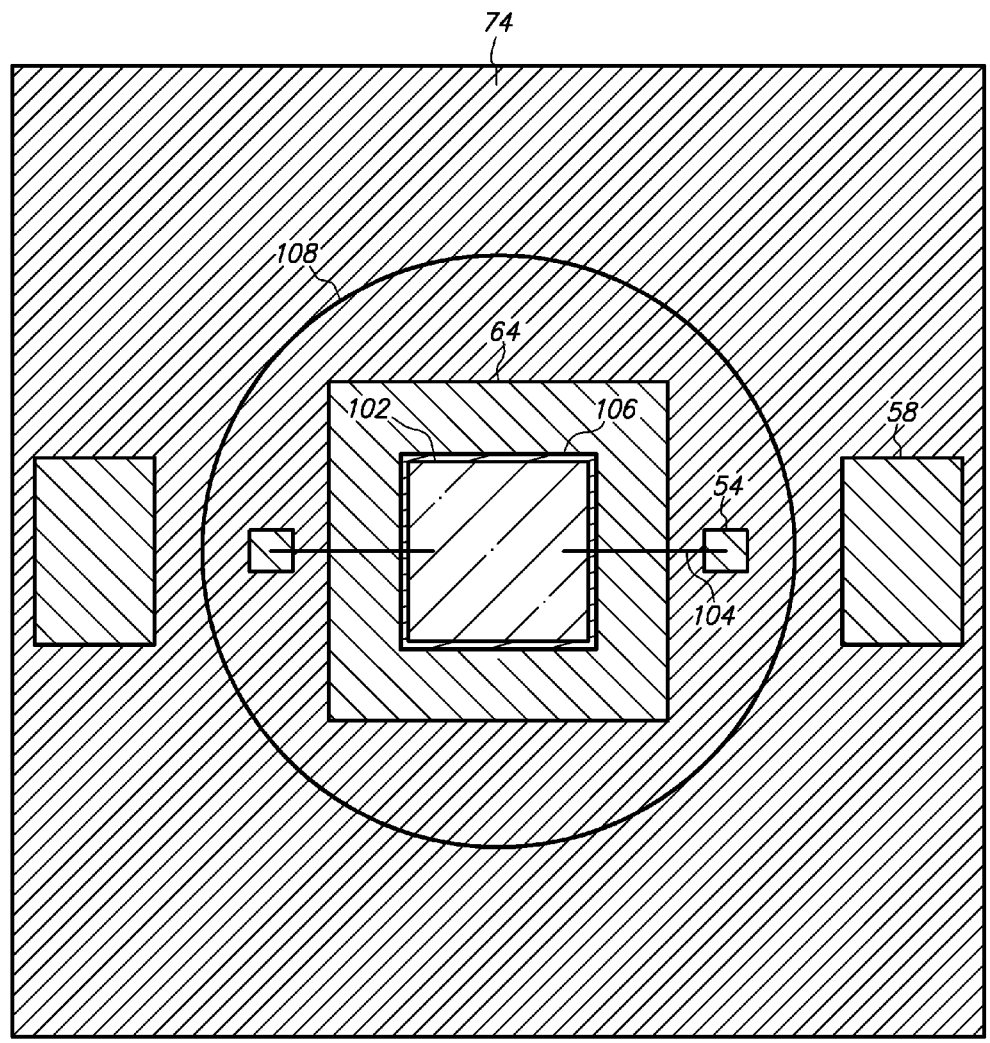
Figure 12C:
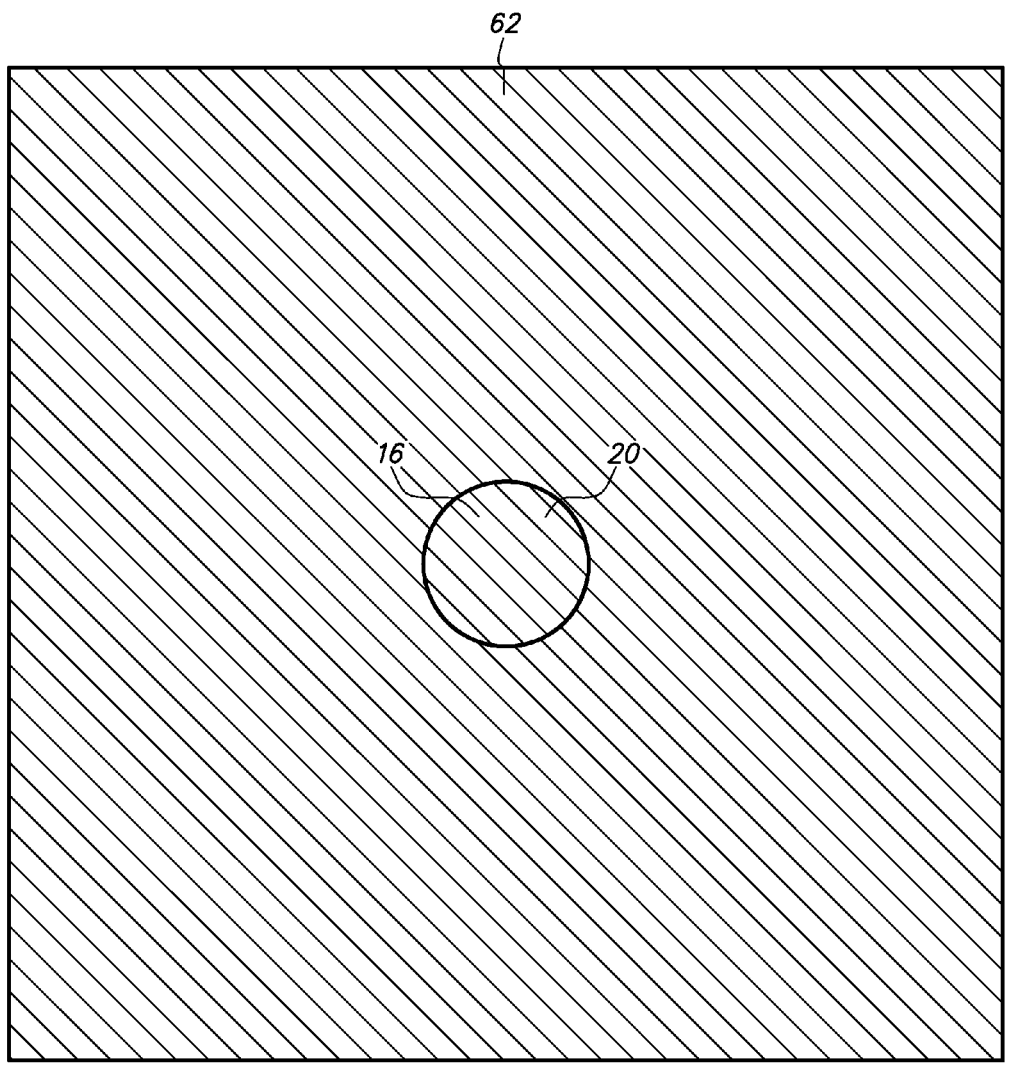

FIGS. 12A, 12B and 12C are cross-sectional, top and bottom views, respectively, of a semiconductor chip assembly that includes a thermal board, a semiconductor device and an encapsulant in accordance with an embodiment of the present invention.

In this embodiment, the semiconductor device is an LED chip that emits blue light, is mounted on the cap, is electrically connected to the pad using a wire bond and is thermally connected to the cap using a die attach. The LED chip is covered by a color-shifting encapsulant that converts the blue light to white light.

Semiconductor chip assembly 100 includes thermal board 80, LED chip 102, wire bond 104, die attach 106 and encapsulant 108. LED chip 102 includes top surface 110, bottom surface 112 and bond pad 114. Top surface 110 is the active surface and includes bond pad 114 and bottom surface 112 is the thermal contact surface.

LED chip 102 is mounted on heat spreader 72, electrically connected to conductive trace 70 and thermally connected to heat spreader 72. In particular, LED chip 102 is mounted on cap 64 (and thus bump 16) opposite cavity 20, extends above cap 64 (and thus bump 16 and cavity 20), overlaps (and thus laterally extends within the periphery of) bump 16, cavity 20 and cap 64, does not overlap (and thus is located outside the periphery of) substrate 34 and conductive trace 70, is electrically connected to pad 54 by wire bond 104 and is thermally connected to and mechanically attached to cap 64 by die attach 106. In addition, cap 64 covers LED chip 102 in the downward direction and provides a die paddle as well as a reflector for LED chip 102.

For instance, wire bond 104 is bonded to and electrically connects pads 54 and 114, thereby electrically connecting LED chip 102 to terminal 58. Die attach 106 contacts and is sandwiched between and thermally connects and mechanically attaches cap 64 and thermal contact surface 112, thereby thermally connecting LED chip 102 to bump 16 and thereby thermally connecting LED chip 102 to base 62.

Encapsulant 108 is a solid adherent electrically insulative color-shifting protective enclosure that provides environmental protection such as moisture resistance and particle protection for LED chip 102 and wire bond 104. Encapsulant 108 contacts pad 54, routing line 56, cap 64, solder mask 74, LED chip 102, wire bond 104 and die attach 106, is spaced from bump 16, adhesive 30, dielectric layer 38, terminal 58 and base 62 and covers bump 16, pad 54, cap 64, LED chip 102, wire bond 104 and die attach 106 in the upward direction. Encapsulant 108 is transparent for convenience of illustration.

Pad 54 is spot plated with nickel/silver to bond well with wire bond 104, thereby improving signal transfer from conductive trace 70 to LED chip 102, and cap 64 is spot plated with nickel/silver to bond well with die attach 106, thereby improving heat transfer from LED chip 102 to heat spreader 72. Cap 64 also provides a highly reflective surface which reflects the light emitted towards the silver surface layer by LED chip 102, thereby increasing light output in the upward direction. Furthermore, since cap 64 is shaped and sized to accommodate thermal contact surface 112, bump 16 need not be shaped and sized to accommodate thermal contact surface 112.

LED chip 102 includes a compound semiconductor that emits blue light, has high luminous efficiency and forms a p-n junction. Suitable compound semiconductors include gallium-nitride, gallium-arsenide, gallium-phosphide, gallium-arsenic-phosphide, gallium-aluminum-phosphide, gallium-aluminum-arsenide, indium-phosphide and indium-gallium-phosphide. LED chip 102 also has high light output and generates considerable heat.

Encapsulant 108 includes transparent silicone and yellow phosphor (shown as dots in FIG. 12A). For instance, the silicone can be polysiloxane resin and the yellow phosphor can be cerium-doped yttrium-aluminum-garnet (Ce:YAG) fluorescent powder. The yellow phosphor emits yellow light in response to blue light, and the blue and yellow light mix to produce white light. As a result, encapsulant 108 converts the blue light emitted by LED chip 102 into white light and assembly 100 is a white light source. In addition, encapsulant 108 has a hemisphere dome shape which provides a convex refractive surface that focuses the white light in the upward direction.

Semiconductor chip assembly 100 can be manufactured by mounting LED chip 102 on cap 64 using die attach 106, then wire bonding pads 54 and 114 and then forming encapsulant 108.

For instance, die attach 106 is initially a silver-filled epoxy paste with high thermal conductivity that is selectively screen printed on cap 64 and then LED chip 102 placed on the epoxy paste using a pick-up head and an automated pattern recognition system in step-and-repeat fashion. Thereafter, the epoxy paste is heated and hardened at a relatively low temperature such as 190° C. to form die attach 106. Next, wire bond 104 is a gold wire that is thermosonically ball bonded to pads 54 and 114 and then encapsulant 108 is molded on the structure.

LED chip 102 can be electrically connected to pad 54 by a wide variety of connection media, thermally connected to and mechanically attached to heat spreader 72 by a wide variety of thermal adhesives and encapsulated by a wide variety of encapsulants.

Semiconductor chip assembly 100 is a first-level single-chip package.

Figure 13A:
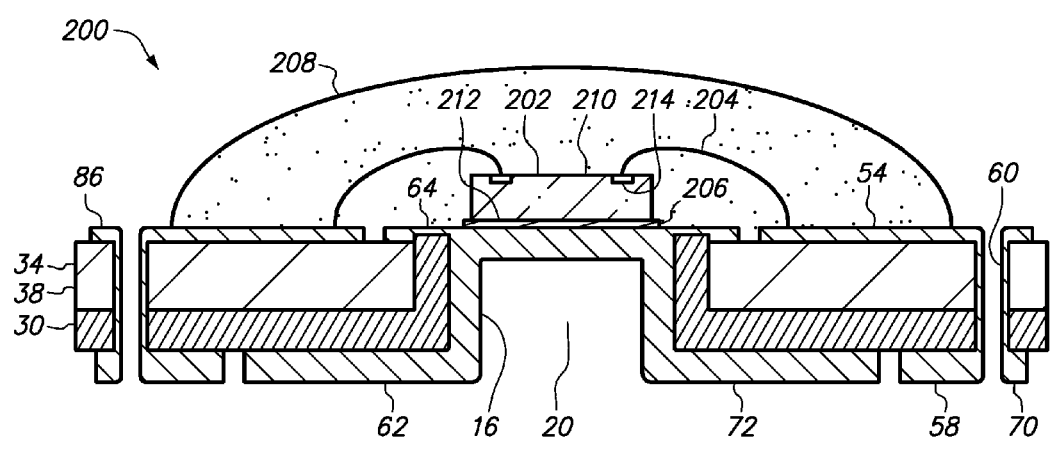
FIGS. 13A, 13B and 13C are cross-sectional, top and bottom views, respectively, of a semiconductor chip assembly that includes a thermal board with vertical signal routing, a semiconductor device and an encapsulant in accordance with an embodiment of the present invention.
Figure 13B:
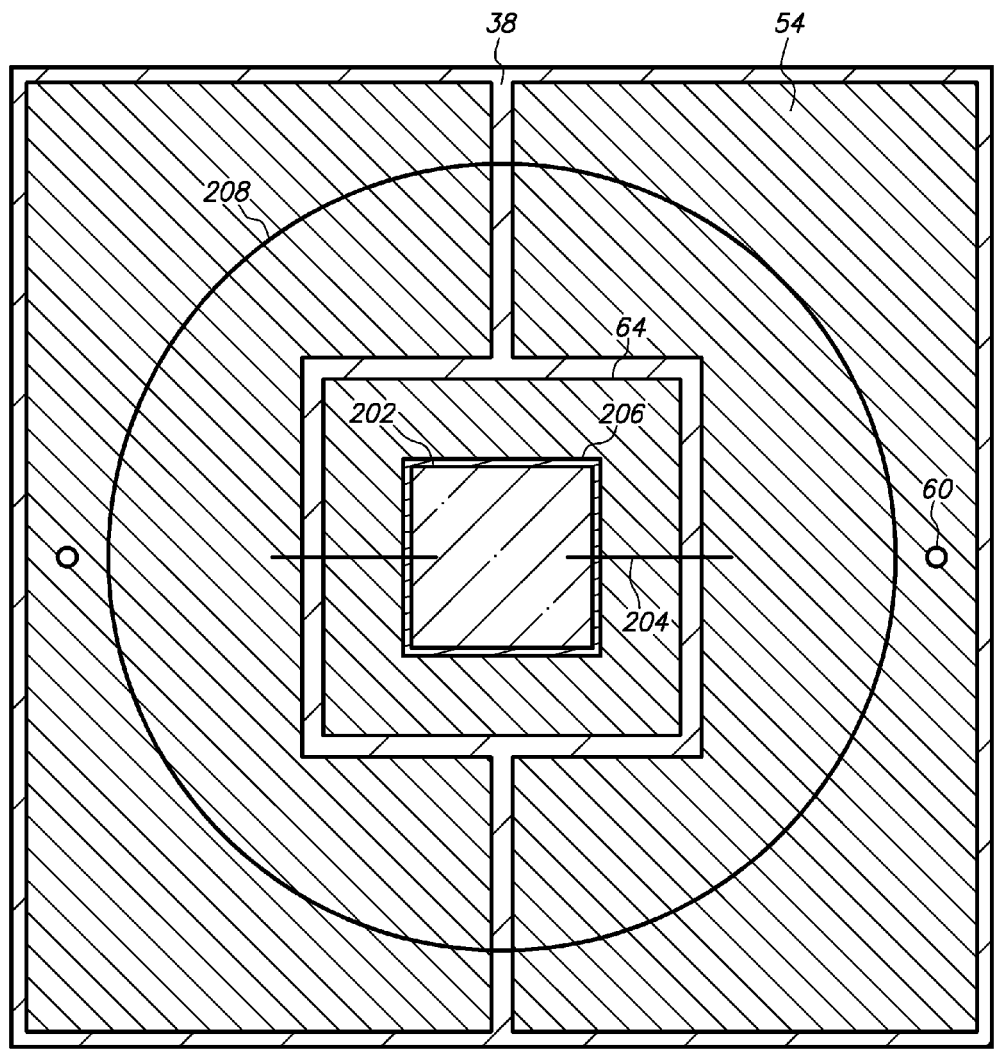
Figure 13C:
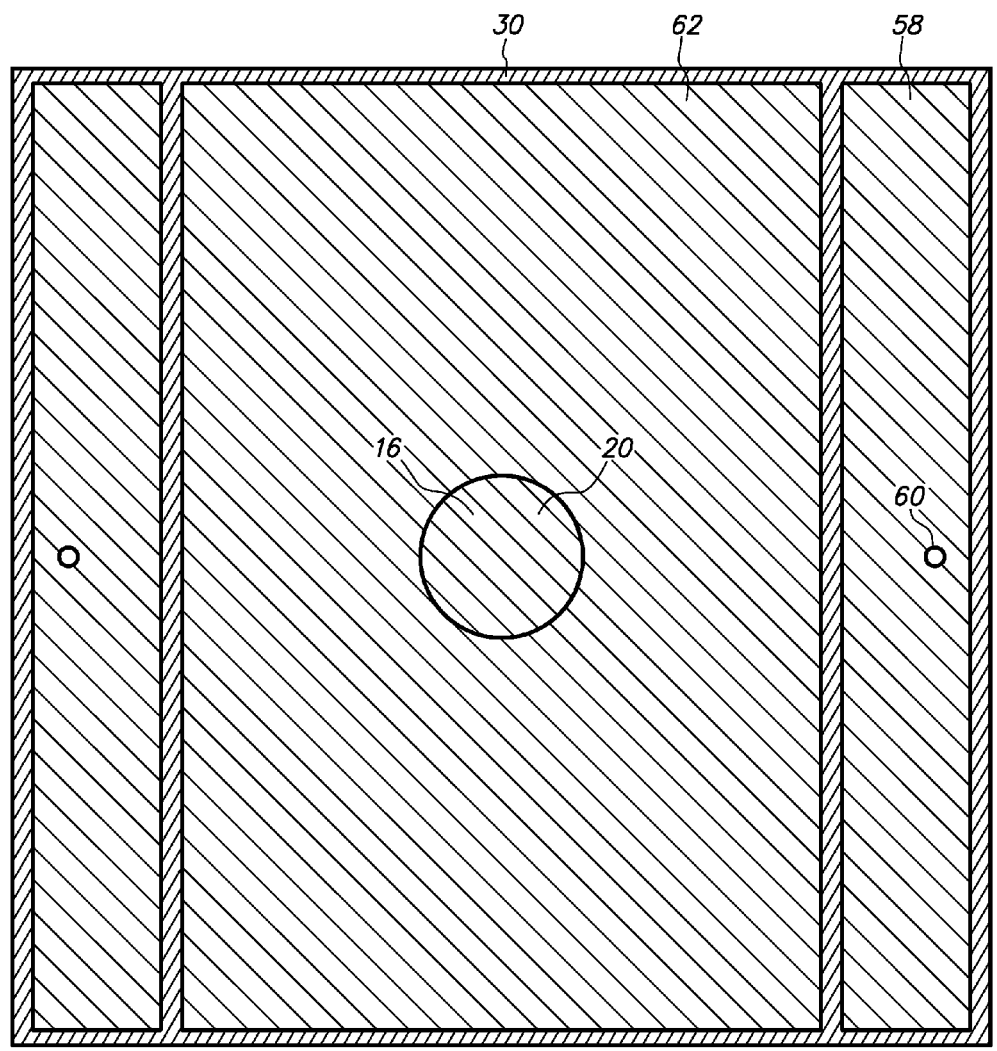

FIGS. 13A, 13B and 13C are cross-sectional, top and bottom views, respectively, of a semiconductor chip assembly that includes a thermal board with vertical signal routing, a semiconductor device and an encapsulant in accordance with an embodiment of the present invention.

In this embodiment, the terminal extends below the adhesive, the routing line is omitted and a plated through-hole electrically connects the pad and the terminal. For purposes of brevity, any description of assembly 100 is incorporated herein insofar as the same is applicable, and the same description need not be repeated. Likewise, elements of the assembly similar to those in assembly 100 have corresponding reference numerals indexed at two-hundred rather than one-hundred. For instance, LED chip 202 corresponds to LED chip 102, wire bond 204 corresponds to wire bond 104, etc.

Semiconductor chip assembly 200 includes thermal board 86, LED chip 202, wire bond 204, die attach 206 and encapsulant 208. LED chip 202 includes top surface 210, bottom surface 212 and bond pad 214. Top surface 210 is the active surface and includes bond pad 214 and bottom surface 212 is the thermal contact surface.

LED chip 202 is mounted on heat spreader 72, electrically connected to conductive trace 70 and thermally connected to heat spreader 72. In particular, LED chip 202 is mounted on cap 64, is electrically connected to pad 54 by wire bond 204 and is thermally connected to and mechanically attached to cap 64 by die attach 206.

Encapsulant 208 contacts dielectric layer 38, pad 54, cap 64, LED chip 202, wire bond 204 and die attach 206, is spaced from bump 16, adhesive 30, terminal 58, plated through-hole 60 and base 62 and covers bump 16, cap 64, LED chip 202, wire bond 204 and die attach 206 in the upward direction.

LED chip 202 emits blue light, encapsulant 208 converts the blue light to white light and assembly 200 is a white light source.

Semiconductor chip assembly 200 can be manufactured by mounting LED chip 202 on cap 64 using die attach 206, then wire bonding pads 54 and 214 and then forming encapsulant 208.

Semiconductor chip assembly 200 is a first-level single-chip package.

Figure 14A:
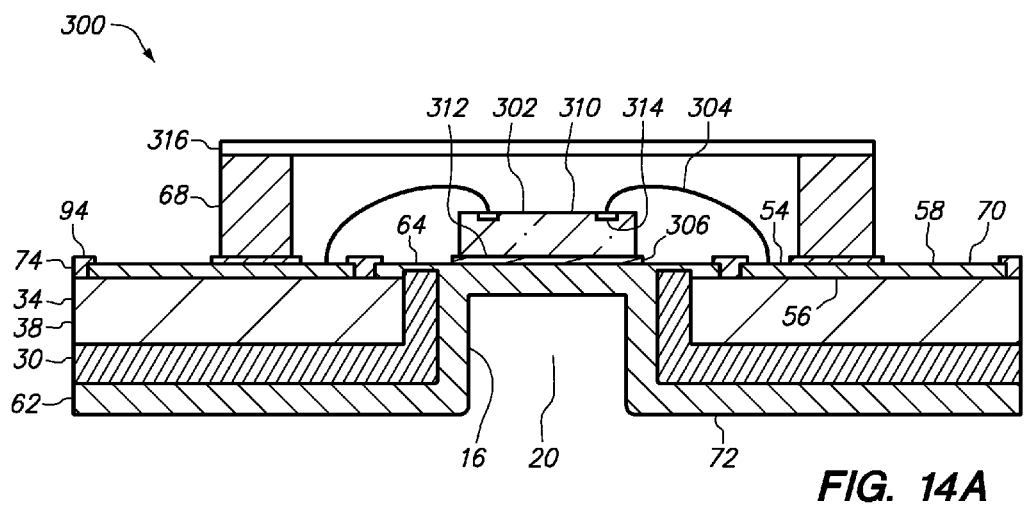
FIGS. 14A, 14B and 14C are cross-sectional, top and bottom views, respectively, of a semiconductor chip assembly that includes a thermal board with a rim, a semiconductor device and a lid in accordance with an embodiment of the present invention.
Figure 14B:
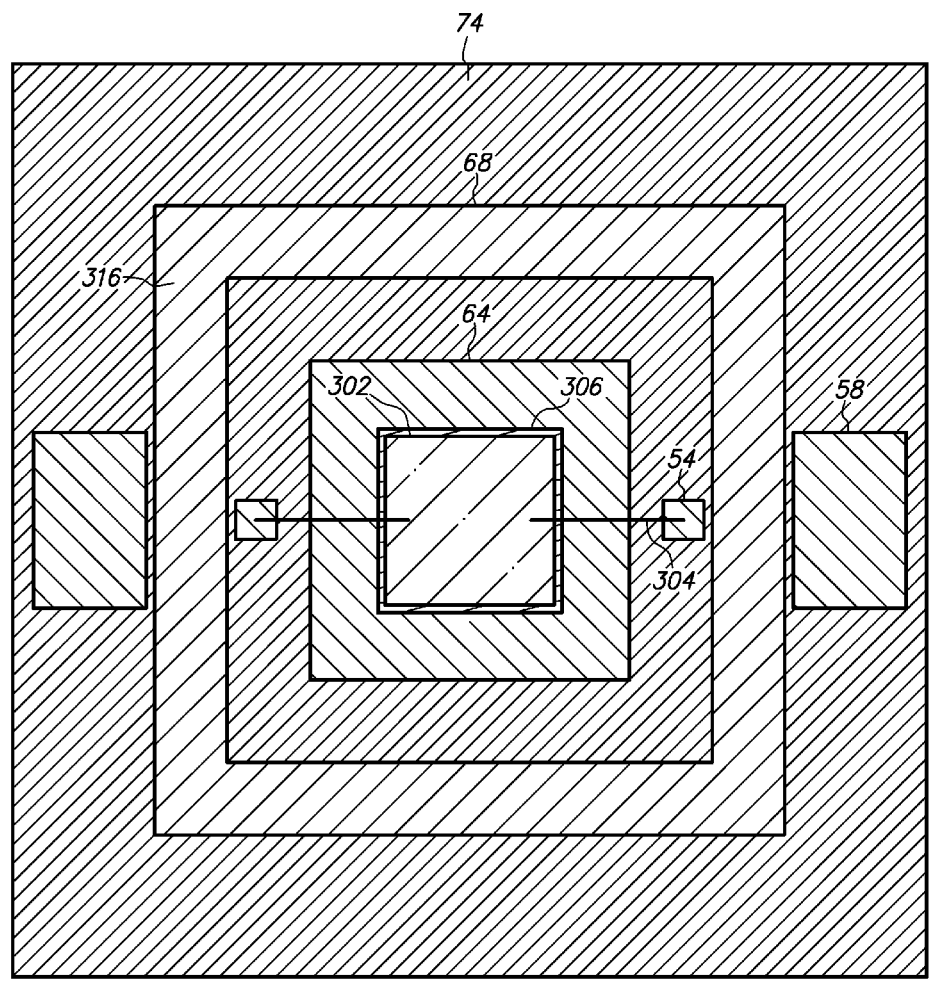
Figure 14C:
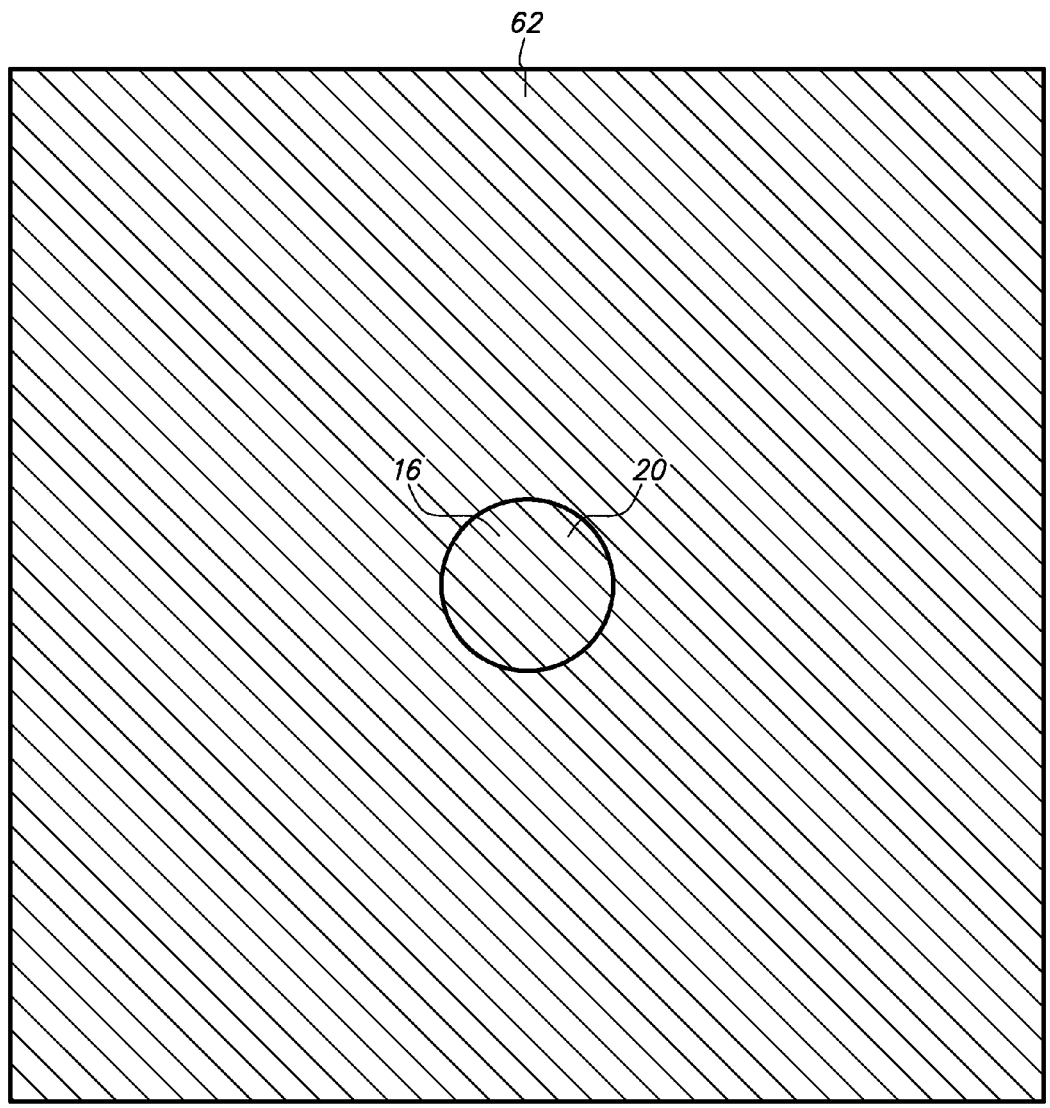

FIGS. 14A, 14B and 14C are cross-sectional, top and bottom views, respectively, of a semiconductor chip assembly that includes a thermal board with a rim, a semiconductor device and a lid in accordance with an embodiment of the present invention.

In this embodiment, the lid is mounted on the rim and the encapsulant is omitted. For purposes of brevity, any description of assembly 100 is incorporated herein insofar as the same is applicable, and the same description need not be repeated. Likewise, elements of the assembly similar to those in assembly 100 have corresponding reference numerals indexed at three-hundred rather than one-hundred. For instance, LED chip 302 corresponds to LED chip 102, wire bond 304 corresponds to wire bond 104, etc.

Semiconductor chip assembly 300 includes thermal board 94, LED chip 302, wire bond 304, die attach 306 and lid 316. LED chip 302 includes top surface 310, bottom surface 312 and bond pad 314. Top surface 310 is the active surface and includes bond pad 314 and bottom surface 312 is the thermal contact surface.

LED chip 302 is mounted on heat spreader 72, electrically connected to conductive trace 70 and thermally connected to heat spreader 72. In particular, LED chip 302 is mounted on cap 64, is electrically connected to pad 54 by wire bond 304 and is thermally connected to and mechanically attached to cap 64 by die attach 306.

Lid 316 is a glass sheet that is mounted on rim 68, thereby forming a sealed enclosure for LED chip 302 and wire bond 304 opposite cavity 20. Lid 316 provides environmental protection such as moisture resistance and particle protection for LED chip 302 and wire bond 304. Furthermore, lid 316 is transparent and does not color-shift light.

LED chip 302 emits white light which in turn radiates through lid 316 and assembly 300 is a white light source.

Semiconductor chip assembly 300 can be manufactured by mounting LED chip 302 on cap 64 using die attach 306, then wire bonding pads 54 and 314 and then mounting lid 316 on rim 68.

Semiconductor chip assembly 300 is a first-level single-chip package.

Figure 15A:
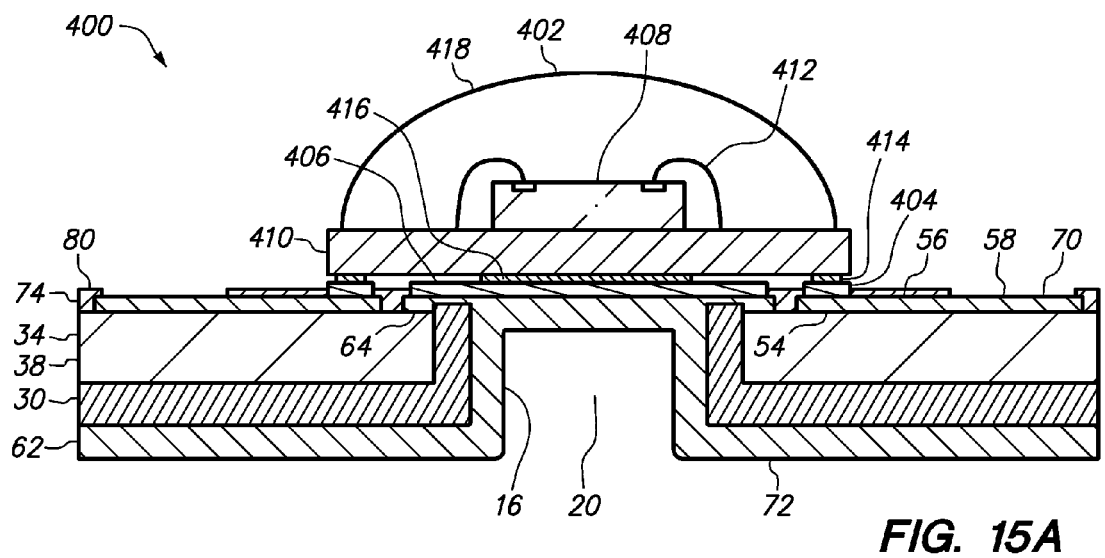
FIGS. 15A, 15B and 15C are cross-sectional, top and bottom views, respectively, of a semiconductor chip assembly that includes a thermal board and a semiconductor device with backside contacts in accordance with an embodiment of the present invention.
Figure 15B:
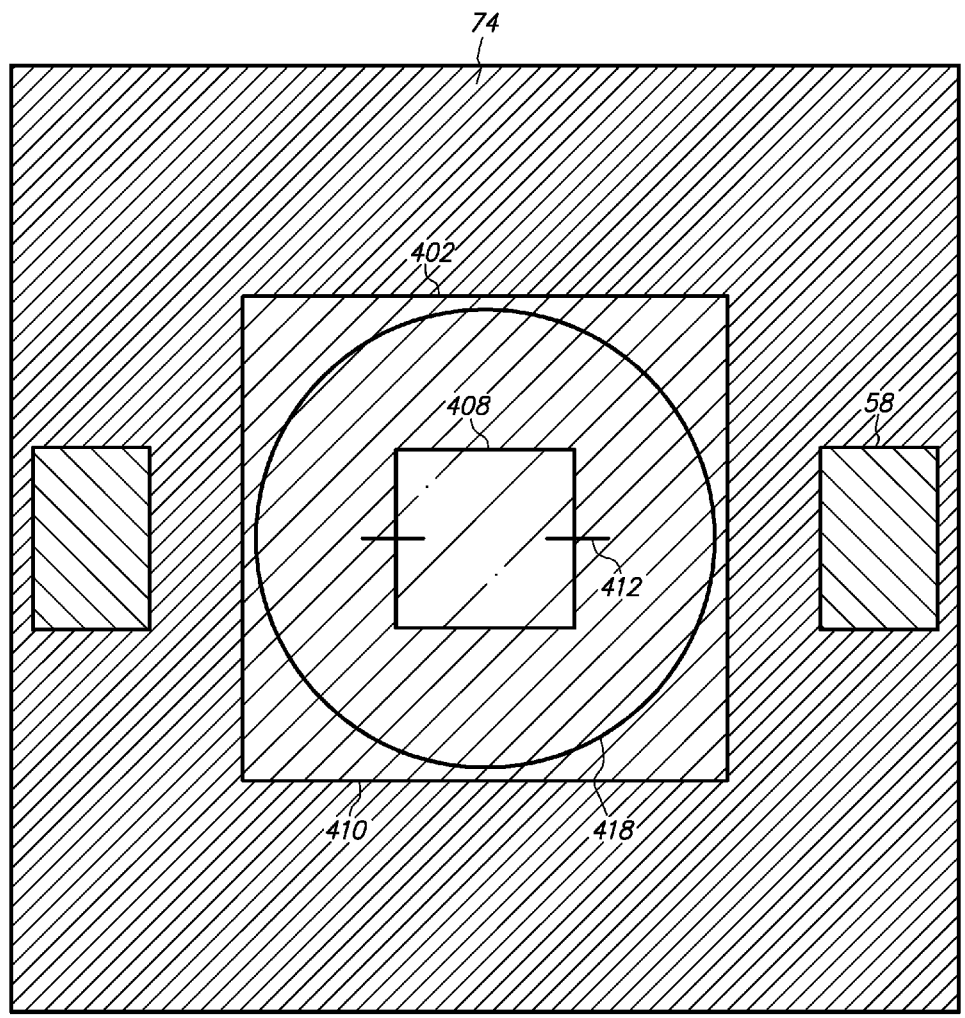
Figure 15C:
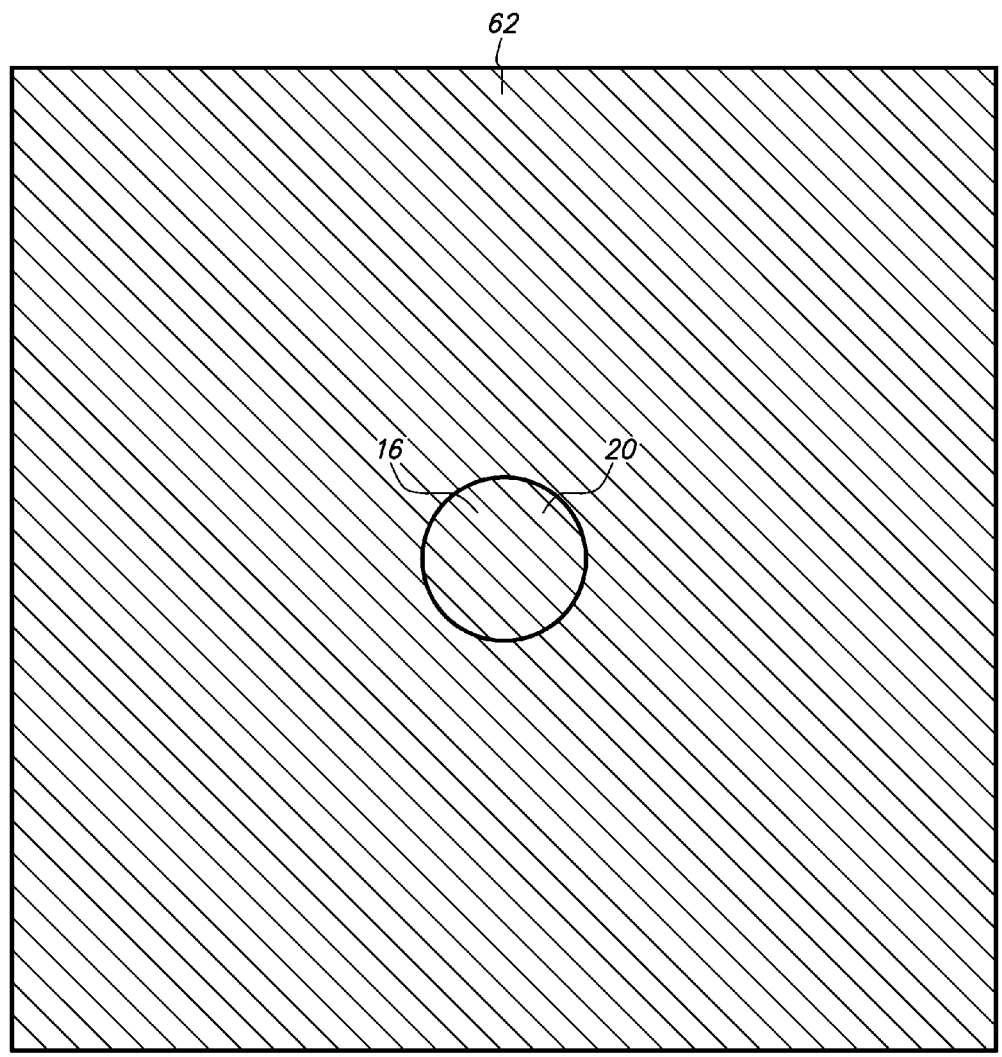

FIGS. 15A, 15B and 15C are cross-sectional, top and bottom views, respectively, of a semiconductor chip assembly that includes a thermal board and a semiconductor device with backside contacts in accordance with an embodiment of the present invention.

In this embodiment, the semiconductor device is an LED package rather than an LED chip. Furthermore, the semiconductor device is mounted on and overlaps the heat spreader and the conductive trace, is electrically connected to the pad using a solder joint and is thermally connected to the cap using a solder joint.

Semiconductor chip assembly 400 includes thermal board 80, LED package 402 and solder joints 404 and 406. LED package 402 includes LED chip 408, submount 410, wire bond 412, electrical contact 414, thermal contact 416 and encapsulant 418. LED chip 408 includes a bond pad (not shown) electrically connected to a via (not shown) in submount 410 by wire bond 412, thereby electrically connecting LED chip 408 to electrical contact 414. LED chip 408 is mounted on and thermally connected to and mechanically attached to submount 410 by a die attach (not shown), thereby thermally connecting LED chip 408 to thermal contact 416. Submount 410 is a ceramic block with low electrical conductivity and high thermal conductivity, and contacts 414 and 416 are plated on and protrude downwardly from the backside of submount 410. Furthermore, LED chip 408 is similar to LED chip 102, wire bond 412 is similar to wire bond 104 and encapsulant 418 is similar to encapsulant 108.

LED package 402 is mounted on conductive trace 70 and heat spreader 72, electrically connected to conductive trace 70 and thermally connected to heat spreader 72. In particular, LED package 402 is mounted on pad 54 (and thus substrate 34) and cap 64 (and thus bump 16), extends above pad 54 (and thus substrate 34) and cap 64 (and thus bump 16 and cavity 20), covers bump 16, cavity 20, pad 54 and cap 64 in the upward direction (and thus laterally extends within the periphery of bump 16, cavity 20, pad 54 and cap 64), does not overlap (and thus is located outside the periphery of) terminal 58, is electrically connected to pad 54 by solder joint 404 and is thermally connected to cap 64 by solder joint 406.

For instance, solder joint 404 contacts and is sandwiched between and electrically connects and mechanically attaches pad 54 and electrical contact 414, thereby electrically connecting LED chip 408 to terminal 58. Likewise, solder joint 406 contacts and is sandwiched between and thermally connects and mechanically attaches cap 64 and thermal contact 416, thereby thermally connecting LED chip 408 to bump 16 and thereby thermally connecting LED chip 408 to base 62.

Pad 54 is spot plated with nickel/silver to bond well with solder joint 404, thereby improving signal transfer from conductive trace 70 to LED chip 408, and cap 64 is spot plated with nickel/silver to bond well with solder joint 406, thereby improving heat transfer from LED chip 408 to heat spreader 72. Furthermore, since cap 64 is shaped and sized to accommodate thermal contact 416, bump 16 need not be shaped and sized to accommodate thermal contact 416.

Semiconductor chip assembly 400 can be manufactured by depositing a solder material on pad 54 and cap 64, then placing contacts 414 and 416 on the solder material over pad 54 and cap 64, respectively, and then reflowing the solder material to provide solder joints 404 and 406.

For instance, solder paste is selectively screen printed on pad 54 and cap 64, then LED package 402 is positioned over thermal board 80 using a pick-up head and an automated pattern recognition system in step-and-repeat fashion. The pick-up head places contacts 414 and 416 on the solder paste over pad 54 and cap 64, respectively. Next, the solder paste is heated and reflowed at a relatively low temperature such as 190° C. and then the heat is removed and the solder paste cools and solidifies to form hardened solder joints 404 and 406. Alternatively, solder balls are placed on pad 54 and cap 64, then contacts 414 and 416 are placed on the solder balls over pad 54 and cap 64, respectively, and then the solder balls are heated and reflowed to form solder joints 404 and 406.

The solder material can be initially deposited on thermal board 80 or LED package 402 by plating or printing or placement techniques, then sandwiched between thermal board 80 and LED package 402 and then reflowed. The solder material can also be deposited on terminal 58 and base 62 if required for the next level assembly. Furthermore, a conductive adhesive such as silver-filled epoxy or other connection media can be used instead of solder, and the connection media on pad 54, terminal 58, base 62 and cap 64 need not be the same.

Semiconductor chip assembly 400 is a second-level single-chip module.

The semiconductor chip assemblies and thermal boards described above are merely exemplary. Numerous other embodiments are contemplated. In addition, the embodiments described above can be mixed-and-matched with one another and with other embodiments depending on design and reliability considerations. For instance, the substrate can include single-level conductive traces and multi-level conductive traces. The thermal board can include multiple bumps arranged in an array for multiple semiconductor devices and can include additional conductive traces to accommodate the additional semiconductor devices. The thermal board can also include a conductive trace that contacts only the adhesive and provides vertical signal routing. The thermal board can also include a conductive trace that contacts only the adhesive and a filler in the cavity. The thermal board can also include a conductive trace that provides vertical signal routing and a filler in the cavity. The thermal board can also include a conductive trace that provides vertical signal routing with a plated through-hole at a peripheral edge. The thermal board can also include a rim mounted on the solder mask and a filler in the cavity. The semiconductor device can be covered in the first vertical direction by a transparent, translucent or opaque encapsulant and/or a transparent, translucent or opaque lid. For instance, the semiconductor device can be an LED chip that emits blue light and is covered by a transparent encapsulant or lid so that the assembly is a blue light source or a color-shifting encapsulant or lid so that the assembly is a green, red or white light source. Likewise, the semiconductor device can be an LED package with multiple LED chips and the thermal board can include additional conductive traces to accommodate the additional LED chips.

The semiconductor device can share or not share the heat spreader with other semiconductor devices. For instance, a single semiconductor device can be mounted on the heat spreader. Alternatively, numerous semiconductor devices can mounted on the heat spreader. For instance, four small chips in a 2×2 array can be attached to the cap and the thermal board can include additional conductive traces to receive and route additional wire bonds to the chips. This may be more cost effective than providing a miniature bump for each chip.

The semiconductor chip can be optical or non-optical. For instance, the chip can be an LED, an IR detector, a solar cell, a microprocessor, a controller, a DRAM or an RF power amplifier. Likewise, the semiconductor package can be an LED package or an RF module. Thus, the semiconductor device can be a packaged or unpackaged optical or non-optical chip. Furthermore, the semiconductor device can be mechanically, electrically and thermally connected to the thermal board using a wide variety of connection media including solder and electrically and/or thermally conductive adhesive.

The heat spreader can provide rapid, efficient and essentially uniform heat spreading and dissipation for the semiconductor device to the next level assembly without heat flow through the adhesive, the substrate or elsewhere in the thermal board. As a result, the adhesive can have low thermal conductivity which drastically reduces cost. The heat spreader can include a bump and a base that are integral with one another and a cap that is metallurgically bonded and thermally connected to the bump, thereby enhancing reliability and reducing cost. The cap can be coplanar with the pad, thereby facilitating the electrical, thermal and mechanical connections with the semiconductor device.

The cap can be customized for the semiconductor device and the base can be customized for the next level assembly, thereby enhancing the thermal connection from the semiconductor device to the next level assembly. For instance, the cap can have a square or rectangular shape in a lateral plane with the same or similar topography as the thermal contact of the semiconductor device and the base can have a square or rectangular shape in a lateral plane with the same or similar topography as a heat sink. Moreover, if the opening and the aperture are punched rather than drilled so that they have a square or rectangular shape rather than a circular shape then the bump can have a square or rectangular shape in a lateral plane with not only a similar topography to the opening and the aperture but also the same or similar topography as the thermal contact of the semiconductor device. In any case, the heat spreader can be a wide variety of thermally conductive structures.

The heat spreader can be electrically connected to or isolated from the conductive trace. For instance, a routing line that extends beyond the adhesive and the dielectric layer in the first vertical direction can electrically connect the pad and the cap, a routing line that extends beyond the adhesive and the dielectric layer in the second vertical direction can electrically connect the base and the terminal or the pad and the cap can be merged. Thereafter, the terminal can be electrically connected to ground, thereby electrically connecting the cap to ground.

The bump can be integral with the base when they are a single-piece metal such as copper or aluminum. The bump can also be integral with the base when they include a single-piece metal such as copper at their interface as well as additional metal elsewhere such as a plated contact. The bump can also be integral with the base when they share single-piece metals at their interface such as a copper coating on a nickel buffer layer on an aluminum core.

The base can provide mechanical support for the bump, the substrate and the adhesive. For instance, the base can prevent the substrate from warping during metal grinding, chip mounting, wire bonding and encapsulant molding. Furthermore, the base can include fins at its backside that protrude in the second vertical direction. For instance, the base can be cut at its exposed lateral surface by a routing machine to form lateral grooves that define the fins. The fins can increase the surface area of the base, thereby increasing the thermal conductivity of the base by thermal convection when it remains exposed to the air rather than mounted on a heat sink.

The cap can be formed by numerous deposition techniques including electroplating, electroless plating, evaporating and sputtering as a single layer or multiple layers after the adhesive is solidified. The cap can be the same metal as or a different metal than the bump. Furthermore, the cap can extend across the aperture to the substrate or reside within the periphery of the aperture. Thus, the cap may contact or be spaced from the substrate. In any case, the cap is adjacent to the bump, extends vertically from the bump opposite the cavity and extends laterally from the bump.

The adhesive can provide a robust mechanical bond between the heat spreader and the substrate. For instance, the adhesive can extend laterally from the bump beyond the conductive trace to a peripheral edge of the assembly, the adhesive can fill the space between the heat spreader and the substrate and the adhesive can be void-free with consistent bond lines. The adhesive can also absorb thermal expansion mismatch between the heat spreader and the substrate. The adhesive can also be the same material as or a different material than the dielectric layer. Furthermore, the adhesive can be a low cost dielectric that need not have high thermal conductivity. Moreover, the adhesive is not prone to delamination.

The adhesive thickness can be adjusted so that the adhesive essentially fills the gap and essentially all the adhesive is within structure once it is solidified and/or grinded. For instance, the optimal prepreg thickness can be established through trial and error. Likewise, the dielectric layer thickness can be adjusted to achieve this result.

The substrate can be a low cost laminated structure that need not have high thermal conductivity. Furthermore, the substrate can include a single conductive layer or multiple conductive layers. Moreover, the substrate can include or consist of the conductive layer.

The conductive layer alone can be mounted on the adhesive. For instance, the aperture can be formed in the conductive layer and then the conductive layer can be mounted on the adhesive so that the conductive layer contacts the adhesive and is exposed in the first vertical direction and the bump extends into and is exposed in the first vertical direction by the aperture. In this instance, the conductive layer can have a thickness of 100 to 200 microns such as 150 microns which is thick enough to handle without warping and wobbling yet thin enough to pattern without excessive etching.

The conductive layer and the dielectric layer can be mounted on the adhesive. For instance, the conductive layer can be provided on the dielectric layer, then the aperture can be formed in the conductive layer and the dielectric layer, and then the conductive layer and the dielectric layer can be mounted on the adhesive so that the conductive layer is exposed in the first vertical direction, the dielectric layer contacts and is sandwiched between and separates the conductive layer and the adhesive and the bump extends into and is exposed in the first vertical direction by the aperture. In this instance, the conductive layer can have a thickness of 10 to 70 microns such as 50 microns which is thick enough for reliable signal transfer yet thin enough to reduce weight and cost. Furthermore, the dielectric layer is a permanent part of the thermal board.

The conductive layer and a carrier can be mounted on the adhesive. For instance, the conductive layer can be attached to a carrier such biaxially-oriented polyethylene terephthalate polyester (Mylar) by a thin film, then the aperture can be formed in the conductive layer but not the carrier, then the conductive layer and the carrier can be mounted on the adhesive so that the carrier covers the conductive layer and is exposed in the first vertical direction, the thin film contacts and is sandwiched between the carrier and the conductive layer, the conductive layer contacts and is sandwiched between the thin film and the adhesive, and the bump is aligned with the aperture and covered in the first vertical direction by the carrier. After the adhesive is solidified, the thin film can be decomposed by UV light so that the carrier can be peeled off the conductive layer, thereby exposing the conductive layer in the first vertical direction, and then the conductive layer can be grinded and patterned for the pad and the cap. In this instance, the conductive layer can have a thickness of 10 to 70 microns such as 50 microns which is thick enough for reliable signal transfer yet thin enough to reduce weight and cost, and the carrier can have a thickness of 300 to 500 microns which is thick enough to handle without warping and wobbling yet thin enough to reduce weight and cost. Furthermore, the carrier is a temporary fixture and not a permanent part of the thermal board.

The pad and the terminal can have a wide variety of packaging formats as required by the semiconductor device and the next level assembly.

The pad and the terminal can be formed by numerous deposition techniques including electroplating, electroless plating, evaporating and sputtering as a single layer or multiple layers, either before or after the substrate is mounted on the adhesive. For instance, the conductive layer can be patterned on the substrate to provide the conductive trace before it is mounted on the adhesive or after it is attached to the bump and the ledge by the adhesive. Likewise, the ledge can be patterned to provide the base and the terminal before the plated through-hole is formed.

The plated contact surface finish can be formed before or after the pad and the terminal are formed. For instance, the plated contacts can be deposited on the structure before or after the conductive layer is etched to form the pad and the terminal.

The pad and the cap can be coplanar at a first surface that faces in the first vertical direction, thereby enhancing solder joints between the semiconductor device and the thermal board by controlling solder ball collapse. Likewise, the base and the terminal can be coplanar at a second surface that faces in the second vertical direction, thereby enhancing solder joints between the thermal board and the next level assembly by controlling solder ball collapse.

The rim can be reflective or non-reflective and transparent or non-transparent. For instance, the rim can include a highly reflective metal such as silver or aluminum with a slanted inner surface which reflects the light directed at it in the first vertical direction, thereby increasing light output in the first vertical direction. Likewise, the rim can include a transparent material such as glass or a non-reflective, non-transparent low cost material such as epoxy. Furthermore, a reflective rim can be used regardless of whether it contacts or confines the encapsulant.

The encapsulant can be numerous transparent, translucent or opaque materials and have various shapes and sizes. For instance, the encapsulant can be transparent silicone, epoxy or combinations thereof. Silicone has higher thermal and color-shifting stability than epoxy but also higher cost and lower rigidity and adhesion than epoxy.

The lid can cover or replace the encapsulant. The lid can provide environmental protection such as moisture resistance and particle protection for the chip and the wire bond in a sealed enclosure. The lid can be numerous transparent, translucent or opaque materials and have various shapes and sizes. For instance, the lid can be transparent glass or silica.

A lens can cover or replace the encapsulant. The lens can provide environmental protection such as moisture resistance and particle protection for the chip and the wire bond in a sealed enclosure. The lens can also provide a convex refractive surface that focuses the light in the first vertical direction. The lens can be numerous transparent, translucent or opaque materials and have various shapes and sizes. For instance, a glass lens with a hollow hemisphere dome can be mounted on the thermal board and spaced from the encapsulant, or a plastic lens with a solid hemisphere dome can be mounted on the encapsulant and spaced from the thermal board.

The conductive trace can include additional pads, terminals, routing lines, plated through-holes and vias as well as passive components and have different configurations. The conductive trace can function as a signal, power or ground layer depending on the purpose of the corresponding semiconductor device pad. The conductive trace can also include various conductive metals such as copper, gold, nickel, silver, palladium, tin, combinations thereof, and alloys thereof. The preferred composition will depend on the nature of the external connection media as well as design and reliability considerations. Furthermore, those skilled in the art will understand that in the context of a semiconductor chip assembly, the copper material can be pure elemental copper but is typically a copper alloy that is mostly copper such as copperzirconium (99.9% copper), copper-silver-phosphorus-magnesium (99.7% copper) and copper-tin-iron-phosphorus (99.7% copper) to improve mechanical properties such as tensile strength and elongation.

The cap, routing line, plated through-hole, dielectric layer, filler, plated layers, plated contacts, solder mask and encapsulant are generally desirable but may be omitted in some embodiments. For instance, if a large pad is used then the routing line can be omitted. If single-level signal routing is used then the plated through-hole can be omitted. If a thick adhesive is used then the dielectric layer can be omitted. If the bump is shaped and sized to accommodate a thermal contact surface of the semiconductor device then the cap can be omitted.

The thermal board can include a thermal via that is spaced from the bump, extends through the adhesive and the dielectric layer outside the opening and the aperture and is adjacent to and thermally connects the base and the cap to improve heat dissipation from the cap to the base and heat spreading in the base.

The assembly can provide horizontal or vertical single-level or multi-level signal routing.

Horizontal single-level signal routing with the pad, the terminal and the routing line above the dielectric layer is disclosed in U.S. application Ser. No. 12/616,773 filed Nov. 11, 2009 by Charles W. C. Lin et al. entitled "Semiconductor Chip Assembly with Post/Base Heat Spreader and Substrate" which is incorporated by reference.

Horizontal single-level signal routing with the pad, the terminal and the routing line above the adhesive and no dielectric layer is disclosed in U.S. application Ser. No. 12/616,775 filed Nov. 11, 2009 by Charles W. C. Lin et al. entitled "Semiconductor Chip Assembly with Post/Base Heat Spreader and Conductive Trace" which is incorporated by reference.

Horizontal multi-level signal routing with the pad and the terminal above the dielectric layer electrically connected by first and second vias through the dielectric layer and a routing line beneath the dielectric layer is disclosed in U.S. application Ser. No. 12/557,540 filed Sep. 11, 2009 by Chia-Chung Wang et al. entitled "Semiconductor Chip Assembly with Post/Base Heat Spreader and Horizontal Signal Routing" which is incorporated by reference.

Vertical multi-level signal routing with the pad above the dielectric layer and the terminal beneath the adhesive electrically connected by a first via through the dielectric layer, a routing line beneath the dielectric layer and a second via through the adhesive is disclosed in U.S. application Ser. No. 12/557,541 filed Sep. 11, 2009 by Chia-Chung Wang et al. entitled "Semiconductor Chip Assembly with Post/Base Heat Spreader and Vertical Signal Routing" which is incorporated by reference.

The working format for the thermal board can be a single thermal board or multiple thermal boards based on the manufacturing design. For instance, a single thermal board can be manufactured individually. Alternatively, numerous thermal boards can be simultaneously batch manufactured using a single metal plate, a single adhesive, a single substrate and a single solder mask and then separated from one another. Likewise, numerous sets of heat spreaders and conductive traces that are each dedicated to a single semiconductor device can be simultaneously batch manufactured for each thermal board in the batch using a single metal plate, a single adhesive, a single substrate and a single solder mask.

For example, multiple bumps can be stamped in the metal plate, then the non-solidified adhesive with openings corresponding to the bumps can be mounted on the ledge such that each bump extends through an opening, then the substrate (with a single conductive layer, a single dielectric layer and apertures corresponding to the bumps) can be mounted on the adhesive such that each bump extends through an opening into an aperture, then the ledge and the substrate can be moved towards one another by platens to force the adhesive into the gaps in the apertures between the bumps and the substrate, then the adhesive can be cured and solidified, then the bumps, the adhesive and the conductive layer can be grinded to form a lateral surface, then the plated layers can be plated on the structure, then the conductive layer and the plated layer thereon can be etched to form the pads, the routing lines, the terminals and the caps corresponding to the bumps, then the solder mask can be deposited on the structure and patterned to expose the pads, the terminals and the caps, then the plated contact surface finish can be formed on the bumps, the base, the pads, the terminals and the caps and then the base, the adhesive, the dielectric layer and the solder mask can be cut or cracked at the desired locations of the peripheral edges of the thermal boards, thereby separating the individual thermal boards from one another.

The working format for the semiconductor chip assembly can be a single assembly or multiple assemblies based on the manufacturing design. For instance, a single assembly can be manufactured individually. Alternatively, numerous assemblies can be simultaneously batch manufactured before the thermal boards are separated from one another. Likewise, multiple semiconductor devices can be electrically, thermally and mechanically connected to each thermal board in the batch.

For example, die attach paste portions can be deposited on the caps, then the chips can be placed on the die attach paste portions, then the die attach paste portions can be simultaneously heated and hardened to provide the die attaches, then the chips can be wired bonded to the corresponding pads, then the encapsulants can be simultaneously molded on the chips and the wire bonds and then the thermal boards can be separated from one another.

The thermal boards can be detached from one another in a single step or multiple steps. For instance, the thermal boards can be batch manufactured as a panel, then the semiconductor devices can be mounted on the panel and then the semiconductor chip assemblies of the panel can be detached from one another. Alternatively, the thermal boards can be batch manufactured as a panel, then the thermal boards of the panel can be singulated into strips of multiple thermal boards, then the semiconductor devices can be mounted on the thermal boards of a strip and then the semiconductor chip assemblies of the strip can be detached from one another. Furthermore, the thermal boards can be detached by mechanical sawing, laser sawing, cleaving or other suitable techniques.

The term "adjacent" refers to elements that are integral (single-piece) or in contact (not spaced or separated from) with one another. For instance, the bump is adjacent to the base and the cap but not the dielectric layer.

The term "overlap" refers to above and extending within a periphery of an underlying element. Overlap includes extending inside and outside the periphery or residing within the periphery. For instance, in the cavity-down position, the semiconductor device overlaps the bump since an imaginary vertical line intersects the semiconductor device and the bump, regardless of whether another element such as the die attach is between the semiconductor device and the bump and is intersected by the line, and regardless of whether another imaginary vertical line intersects the bump but not the semiconductor device (outside the periphery of the semiconductor device). Likewise, the cap overlaps the bump and the pad overlaps the adhesive. Moreover, overlap is synonymous with over and overlapped by is synonymous with under or beneath.

The term "contact" refers to direct contact. For instance, the dielectric layer contacts the pad but does not contact the bump.

The term "cover" refers to complete coverage in a vertical and/or lateral direction. For instance, in the cavity-down position, the cap covers the bump in the upward direction but the bump does not cover the cap in the downward direction.

The term "layer" refers to patterned and unpatterned layers. For instance, the conductive layer can be an unpatterned blanket sheet on the dielectric layer when the substrate is mounted on the adhesive, and the conductive layer can be a patterned circuit with spaced traces on the dielectric layer when the semiconductor device is mounted on the heat spreader. Furthermore, a layer can include stacked layers.

The term "pad" in conjunction with the conductive trace refers to a connection region that is adapted to contact and/or bond to external connection media (such as solder or a wire bond) that electrically connects the conductive trace to the semiconductor device.

The term "terminal" in conjunction with the conductive trace refers to a connection region that is adapted to contact and/or bond to external connection media (such as solder or a wire bond) that electrically connects the conductive trace to an external device (such as a PCB or a wire thereto) associated with the next level assembly.

The term "plated through-hole" in conjunction with the conductive trace refers to an electrical interconnect that is formed in a hole using plating. For instance, the plated through-hole exists regardless of whether it remains intact in the hole and spaced from peripheral edges of the assembly or is subsequently split or trimmed such that the hole is converted into a groove and the remaining portion is in the groove at a peripheral edge of the assembly.

The term "cavity" in conjunction with the bump refers to a sealed or unsealed chamber in the bump. For instance, the cavity is in the bump regardless of whether the cavity is a sealed chamber that is covered by the base in the second vertical direction or an unsealed chamber that is exposed in the second vertical direction. Likewise, the cavity is in the bump regardless of whether the cavity is hollow or contains a filler such as epoxy, polyimide or solder.

The term "about" in conjunction with an angle refers to ±2 degrees.

The terms "opening" and "aperture" and "hole" refer to a through-hole and are synonymous. For instance, in the cavity-down position, the bump is exposed by the adhesive in the upward direction when it is inserted into the opening in the adhesive. Likewise, the bump is exposed by the substrate in the upward direction when it is inserted into the aperture in the substrate.

The term "inserted" refers to relative motion between elements. For instance, the bump is inserted into the aperture regardless of whether the substrate is stationary and the ledge moves towards the substrate, the ledge is stationary and the substrate moves towards the ledge or the substrate and the ledge both approach the other. Furthermore, the bump is inserted (or extends) into the aperture regardless of whether it goes through (enters and exits) or does not go through (enters without exiting) the aperture.

The phrase "move towards one another" also refers to relative motion between elements. For instance, the substrate and the ledge move towards one another regardless of whether the substrate is stationary and the ledge moves towards the substrate, the ledge is stationary and the substrate moves towards the ledge or the substrate and the ledge both approach the other.

The phrase "aligned with" refers to relative position between elements. For instance, in the cavity-down position, the bump is aligned with the aperture when the adhesive is mounted on the ledge, the substrate is mounted on the adhesive, the bump is inserted into and aligned with the opening and the aperture is aligned with the opening regardless of whether the bump is inserted into the aperture or is below and spaced from the aperture.

The phrase "mounted on" includes contact and non-contact with a single or multiple support element(s). For instance, the semiconductor device is mounted on the cap regardless of whether it contacts the cap or is separated from the cap by a die attach.

The phrase "adhesive . . . in the gap" refers to the adhesive in the gap. For instance, adhesive that extends across the dielectric layer in the gap refers to the adhesive in the gap that extends across the dielectric layer. Likewise, adhesive that contacts and is sandwiched between the bump and the dielectric layer in the gap refers to the adhesive in the gap that contacts and is sandwiched between the bump at the inner sidewall of the gap and the dielectric layer at the outer sidewall of the gap.

The term "above" refers to upward extension and includes adjacent and non-adjacent elements as well as overlapping and non-overlapping elements. For instance, in the cavity-down position, the cap extends above, is adjacent to, overlaps and protrudes from the bump. Likewise, the bump extends above the dielectric layer even though it is not adjacent to or overlap the dielectric layer.

The term "below" refers to downward extension and includes adjacent and non-adjacent elements as well as overlapping and non-overlapping elements. For instance, in the cavity-down position, the bump extends below, is adjacent to and is overlapped by the cap and protrudes from the cap in the downward direction. Likewise, the bump extends below the pad even though it is not adjacent to or overlapped by the pad.

The "first vertical direction" and "second vertical direction" do not depend on the orientation of the semiconductor chip assembly (or the thermal board), as will be readily apparent to those skilled in the art. For instance, the bump extends vertically beyond the base in the first vertical direction and vertically beyond the cap in the second vertical direction regardless of whether the assembly is inverted and/or mounted on a heat sink. Likewise, the cap extends "laterally" from the bump in a lateral plane regardless of whether the assembly is inverted, rotated or slanted. Thus, the first and second vertical directions are opposite one another and orthogonal to the lateral directions, and laterally aligned elements are coplanar with one another at a lateral plane orthogonal to the first and second vertical directions. Furthermore, the first vertical direction is the upward direction and the second vertical direction is the downward direction in the cavity-down position, and the first vertical direction is the downward direction and the second vertical direction is the upward direction in the cavity-up position.

The semiconductor chip assembly of the present invention has numerous advantages. The assembly is reliable, inexpensive and well-suited for high volume manufacture. The assembly is especially well-suited for high power semiconductor devices such as LED chips and large semiconductor chips as well as multiple semiconductor devices such as small semiconductor chips in arrays which generate considerable heat and require excellent heat dissipation in order to operate effectively and reliably.

The manufacturing process is highly versatile and permits a wide variety of mature electrical, thermal and mechanical connection technologies to be used in a unique and improved manner. The manufacturing process can also be performed without expensive tooling. As a result, the manufacturing process significantly enhances throughput, yield, performance and cost effectiveness compared to conventional packaging techniques. Moreover, the assembly is well-suited for copper chip and lead-free environmental requirements.

The embodiments described herein are exemplary and may simplify or omit elements or steps well-known to those skilled in the art to prevent obscuring the present invention. Likewise, the drawings may omit duplicative or unnecessary elements and reference labels to improve clarity.

Various changes and modifications to the embodiments described herein will be apparent to those skilled in the art. For instance, the materials, dimensions, shapes, sizes, steps and arrangement of steps described above are merely exemplary. Such changes, modifications and equivalents may be made without departing from the spirit and scope of the present invention as defined in the appended claims.

We Claim

1. A method of making a semiconductor chip assembly, comprising:
providing a bump, a ledge, an adhesive and a conductive layer, wherein
the bump is adjacent to and integral with the ledge, extends vertically from the ledge in a first vertical direction, extends into an opening in the adhesive and is aligned with an aperture in the conductive layer,
the ledge extends laterally from the bump in lateral directions orthogonal to the first vertical direction,
a cavity in the bump faces in a second vertical direction opposite the first vertical direction and is covered by the bump in the first vertical direction,
the adhesive is mounted on the ledge, is sandwiched between the ledge and the conductive layer and is non-solidified, and
the conductive layer is mounted on the adhesive; then
flowing the adhesive in the first vertical direction into a gap located in the aperture between the bump and the conductive layer;
solidifying the adhesive; then
providing a conductive trace that includes a pad, a terminal and a selected portion of the conductive layer; then
mounting a semiconductor device on the bump, wherein a heat spreader includes the bump and a base, the bump is adjacent to the base and extends vertically from the base in the first vertical direction, the base includes a portion of the ledge that is adjacent to and integral with and extends laterally from the bump and the semiconductor device extends beyond the bump in the first vertical direction, is located outside the cavity and extends laterally within a periphery of the cavity;
electrically connecting the semiconductor device to the pad, thereby electrically connecting the semiconductor device to the terminal; and
thermally connecting the semiconductor device to the bump, thereby thermally connecting the semiconductor device to the base,
wherein providing the base includes removing selected portions of the ledge after solidifying the adhesive.

2. The method of claim 1, wherein providing the bump includes mechanically stamping a metal plate.

3. The method of claim 1, wherein:
providing the adhesive includes providing a prepreg with uncured epoxy;
flowing the adhesive includes melting the uncured epoxy and compressing the uncured epoxy between the ledge and the conductive layer; and
solidifying the adhesive includes curing the uncured epoxy.

4. The method of claim 1, wherein flowing the adhesive includes filling the gap with the adhesive.

5. The method of claim 1, wherein mounting the conductive layer includes mounting the conductive layer alone on the adhesive.

6. The method of claim 1, wherein providing the pad includes removing selected portions of the conductive layer after solidifying the adhesive.

7. The method of claim 1, wherein providing the terminal includes removing selected portions of the conductive layer after solidifying the adhesive.

8. The method of claim 1, wherein providing the pad and the terminal includes removing selected portions of the conductive layer after solidifying the adhesive.

9. The method of claim 1, wherein providing the pad includes:
grinding the bump, the adhesive and the conductive layer such that the bump, the adhesive and the conductive layer are laterally aligned with one another at a lateral surface that faces in the first vertical direction; and then
removing selected portions of the conductive layer using an etch mask that defines the pad.

10. The method of claim 1, wherein the cavity contains a filler that extends across most of the bump in the vertical and lateral directions and fills most or all of the cavity before mounting the semiconductor device.

11. The method of claim 10, wherein providing the filler includes depositing the filler into the cavity after solidifying the adhesive and before providing the conductive trace.

12. The method of claim 10, wherein providing the filler includes depositing the filler into the cavity and then grinding the filler such that the filler is laterally aligned at a lateral surface that faces in the second vertical direction.

13. The method of claim 1, wherein mounting the semiconductor device includes providing a die attach between the semiconductor device and the bump, electrically connecting the semiconductor device includes providing a wire bond between the semiconductor device and the pad, and thermally connecting the semiconductor device includes providing the die attach between the semiconductor device and the bump.

14. A method of making a semiconductor chip assembly, comprising:
providing a bump and a ledge, wherein the bump is adjacent to and integral with the ledge and extends vertically from the ledge in a first vertical direction, the ledge extends laterally from the bump in lateral directions orthogonal to the first vertical direction and a cavity in the bump faces in a second vertical direction opposite the first vertical direction, is covered by the bump in the first vertical direction and extends across most of the bump in the vertical and lateral directions;
providing an adhesive, wherein an opening extends through the adhesive;
providing a conductive layer, wherein an aperture extends through the conductive layer;
mounting the adhesive on the ledge, including inserting the bump into the opening, wherein the bump and the cavity extend into the opening;
mounting the conductive layer on the adhesive, including aligning the bump with the aperture, wherein the adhesive is sandwiched between the ledge and the conductive layer and is non-solidified; then applying heat to melt the adhesive;
moving the ledge and the conductive layer towards one another, thereby moving the bump in the first vertical direction in the aperture and applying pressure to the molten adhesive between the ledge and the conductive layer, wherein the pressure forces the molten adhesive to flow in the first vertical direction into a gap located in the aperture between the bump and the conductive layer;
applying heat to solidify the molten adhesive, thereby mechanically attaching the bump and the ledge to the conductive layer; then
providing a conductive trace that includes a pad, a terminal and a selected portion of the conductive layer; then
mounting a semiconductor device on the bump, wherein a heat spreader includes the bump and a base, the bump is adjacent to the base and extends vertically from the base in the first vertical direction, the base includes a portion of the ledge that is adjacent to and integral with and extends laterally from the bump and the semiconductor device extends beyond the bump in the first vertical direction, is located outside the cavity and extends laterally within a periphery of the cavity;
electrically connecting the semiconductor device to the pad, thereby electrically connecting the semiconductor device to the terminal; and
thermally connecting the semiconductor device to the bump, thereby thermally connecting the semiconductor device to the base,
wherein providing the base includes removing selected portions of the ledge using an etch mask after solidifying the adhesive.

15. The method of claim 14, wherein providing the bump includes mechanically stamping a metal plate, 16. The method of claim 14, wherein:
providing the adhesive includes providing a prepreg with uncured epoxy;
flowing the adhesive includes melting the uncured epoxy and compressing the uncured epoxy between the ledge and the conductive layer; and
solidifying the adhesive includes curing the uncured epoxy.

17. The method of claim 14, wherein flowing the adhesive includes filling the gap with the adhesive.

18. The method of claim 14, wherein mounting the conductive layer includes mounting the conductive layer alone on the adhesive.

19. The method of claim 14, wherein providing the pad includes removing selected portions of the conductive layer using an etch mask after solidifying the adhesive.

20. The method of claim 14, wherein providing the terminal includes removing selected portions of the conductive layer using an etch mask after solidifying the adhesive.

21. The method of claim 14, wherein providing the pad and the terminal includes removing selected portions of the conductive layer using an etch mask after solidifying the adhesive.

22. The method of claim 14, wherein providing the pad includes:
grinding the bump, the adhesive and the conductive layer such that the bump, the adhesive and the conductive layer are laterally aligned with one another at a lateral surface that faces in the first vertical direction; and then
removing selected portions of the conductive layer using an etch mask that defines the pad.

23. The method of claim 14, wherein the cavity contains a filler that extends across most of the bump in the vertical and lateral directions and fills most or all of the cavity before mounting the semiconductor device.

24. The method of claim 23, wherein providing the filler includes depositing the filler into the cavity after solidifying the adhesive and before providing the conductive trace.

25. The method of claim 23, wherein providing the filler includes depositing the filler into the cavity and then grinding the filler such that the filler is laterally aligned at a lateral surface that faces in the second vertical direction.

26. The method of claim 14, wherein mounting the semiconductor device includes providing a die attach between the semiconductor device and the bump, electrically connecting the semiconductor device includes providing a wire bond between the semiconductor device and the pad, and thermally connecting the semiconductor device includes providing the die attach between the semiconductor device and the bump.

27. A method of making a semiconductor chip assembly, comprising:
providing a bump, a ledge, an adhesive and a conductive layer, wherein
the bump is adjacent to and integral with the ledge, extends vertically from the ledge in a first vertical direction, extends into an opening in the adhesive and is aligned with an aperture in the conductive layer,
the ledge extends laterally from the bump in lateral directions orthogonal to the first vertical direction,
a cavity in the bump faces in a second vertical direction opposite the first vertical direction and is covered by the bump in the first vertical direction,
the adhesive is mounted on the ledge, is sandwiched between the ledge and the conductive layer and is non-solidified, and
the conductive layer is mounted on the adhesive; then
flowing the adhesive in the first vertical direction into a gap located in the aperture between the bump and the conductive layer;
solidifying the adhesive; then
providing a conductive trace that includes a pad, a terminal and a selected portion of the conductive layer; then
mounting a semiconductor device on the bump, wherein a heat spreader includes the bump and a base, the bump is adjacent to the base and extends vertically from the base in the first vertical direction, the base includes a portion of the ledge that is adjacent to and integral with and extends laterally from the bump and the semiconductor device extends beyond the bump in the first vertical direction, is located outside the cavity and extends laterally within a periphery of the cavity;
electrically connecting the semiconductor device to the pad, thereby electrically connecting the semiconductor device to the terminal; and
thermally connecting the semiconductor device to the bump, thereby thermally connecting the semiconductor device to the base,
wherein providing the pad includes:
grinding the bump, the adhesive and the conductive layer such that the bump, the adhesive and the conductive layer are laterally aligned with one another at a lateral surface that faces in the first vertical direction; and then
removing selected portions of the conductive layer using an etch mask that defines the pad.

28. A method of making a semiconductor chip assembly, comprising:
providing a bump, a ledge, an adhesive and a conductive layer, wherein
the bump is adjacent to and integral with the ledge, extends vertically from the ledge in a first vertical direction, extends into an opening in the adhesive and is aligned with an aperture in the conductive layer, the ledge extends laterally from the bump in lateral directions orthogonal to the first vertical direction, a cavity in the bump faces in a second vertical direction opposite the first vertical direction and is covered by the bump in the first vertical direction, the adhesive is mounted on the ledge, is sandwiched between the ledge and the conductive layer and is non-solidified, and the conductive layer is mounted on the adhesive; then flowing the adhesive in the first vertical direction into a gap located in the aperture between the bump and the conductive layer;

solidifying the adhesive; then providing a conductive trace that includes a pad, a terminal and a selected portion of the conductive layer; then mounting a semiconductor device on the bump, wherein a heat spreader includes the bump and a base, the bump is adjacent to the base and extends vertically from the base in the first vertical direction, the base includes a portion of the ledge that is adjacent to and integral with and extends laterally from the bump and the semiconductor device extends beyond the bump in the first vertical direction, is located outside the cavity and extends laterally within a periphery of the cavity;

electrically connecting the semiconductor device to the pad, thereby electrically connecting the semiconductor device to the terminal; and thermally connecting the semiconductor device to the bump, thereby thermally connecting the semiconductor device to the base, wherein the cavity contains a filler that extends across most of the bump in the vertical and lateral directions and fills most or all of the cavity before mounting the semiconductor device, wherein providing the filler includes depositing the filler into the cavity after solidifying the adhesive and before providing the conductive trace.

29. A method of making a semiconductor chip assembly, comprising:

providing a bump, a ledge, an adhesive and a conductive layer, wherein the bump is adjacent to and integral with the ledge, extends vertically from the ledge in a first vertical direction, extends into an opening in the adhesive and is aligned with an aperture in the conductive layer, the ledge extends laterally from the bump in lateral directions orthogonal to the first vertical direction, a cavity in the bump faces in a second vertical direction opposite the first vertical direction and is covered by the bump in the first vertical direction, the adhesive is mounted on the ledge, is sandwiched between the ledge and the conductive layer and is non-solidified, and the conductive layer is mounted on the adhesive; then flowing the adhesive in the first vertical direction into a gap located in the aperture between the bump and the conductive layer;

solidifying the adhesive; then providing a conductive trace that includes a pad, a terminal and a selected portion of the conductive layer; then mounting a semiconductor device on the bump, wherein a heat spreader includes the bump and a base, the bump is adjacent to the base and extends vertically from the base in the first vertical direction, the base includes a portion of the ledge that is adjacent to and integral with and extends laterally from the bump and the semiconductor device extends beyond the bump in the first vertical direction, is located outside the cavity and extends laterally within a periphery of the cavity;

electrically connecting the semiconductor device to the pad, thereby electrically connecting the semiconductor device to the terminal; and thermally connecting the semiconductor device to the bump, thereby thermally connecting the semiconductor device to the base, wherein the cavity contains a filler that extends across most of the bump in the vertical and lateral directions and fills most or all of the cavity before mounting the semiconductor device, wherein providing the filler includes depositing the filler into the cavity and then grinding the filler such that the filler is laterally aligned at a lateral surface that faces in the second vertical direction.

30. A method of making a semiconductor chip assembly, comprising:

providing a bump and a ledge, wherein the bump is adjacent to and integral with the ledge and extends vertically from the ledge in a first vertical direction, the ledge extends laterally from the bump in lateral directions orthogonal to the first vertical direction and a cavity in the bump faces in a second vertical direction opposite the first vertical direction, is covered by the bump in the first vertical direction and extends across most of the bump in the vertical and lateral directions;

providing an adhesive, wherein an opening extends through the adhesive;

providing a conductive layer, wherein an aperture extends through the conductive layer;

mounting the adhesive on the ledge, including inserting the bump into the opening, wherein the bump and the cavity extend into the opening;

mounting the conductive layer on the adhesive, including aligning the bump with the aperture, wherein the adhesive is sandwiched between the ledge and the conductive layer and is non-solidified; then applying heat to melt the adhesive;

moving the ledge and the conductive layer towards one another, thereby moving the bump in the first vertical direction in the aperture and applying pressure to the molten adhesive between the ledge and the conductive layer, wherein the pressure forces the molten adhesive to flow in the first vertical direction into a gap located in the aperture between the bump and the conductive layer;

applying heat to solidify the molten adhesive, thereby mechanically attaching the bump and the ledge to the conductive layer; then providing a conductive trace that includes a pad, a terminal and a selected portion of the conductive layer; then mounting a semiconductor device on the bump, wherein a heat spreader includes the bump and a base, the bump is adjacent to the base and extends vertically from the base in the first vertical direction, the base includes a portion of the ledge that is adjacent to and integral with and extends laterally from the bump and the semiconductor device extends beyond the bump in the first vertical direction, is located outside the cavity and extends laterally within a periphery of the cavity;

electrically connecting the semiconductor device to the pad, thereby electrically connecting the semiconductor device to the terminal; and thermally connecting the semiconductor device to the bump, thereby thermally connecting the semiconductor device to the base,
wherein providing the pad includes:
grinding the bump, the adhesive and the conductive layer such that the bump, the adhesive and the conductive layer are laterally aligned with one another at a lateral surface that faces in the first vertical direction; and then removing selected portions of the conductive layer using an etch mask that defines the pad.

31. A method of making a semiconductor chip assembly, comprising:
providing a bump and a ledge, wherein the bump is adjacent to and integral with the ledge and extends vertically from the ledge in a first vertical direction, the ledge extends laterally from the bump in lateral directions orthogonal to the first vertical direction and a cavity in the bump faces in a second vertical direction opposite the first vertical direction, is covered by the bump in the first vertical direction and extends across most of the bump in the vertical and lateral directions;
providing an adhesive, wherein an opening extends through the adhesive;
providing a conductive layer, wherein an aperture extends through the conductive layer;
mounting the adhesive on the ledge, including inserting the bump into the opening, wherein the bump and the cavity extend into the opening;
mounting the conductive layer on the adhesive, including aligning the bump with the aperture, wherein the adhesive is sandwiched between the ledge and the conductive layer and is non-solidified; then
applying heat to melt the adhesive;
moving the ledge and the conductive layer towards one another, thereby moving the bump in the first vertical direction in the aperture and applying pressure to the molten adhesive between the ledge and the conductive layer, wherein the pressure forces the molten adhesive to flow in the first vertical direction into a gap located in the aperture between the bump and the conductive layer;
applying heat to solidify the molten adhesive, thereby mechanically attaching the bump and the ledge to the conductive layer; then
providing a conductive trace that includes a pad, a terminal and a selected portion of the conductive layer; then
mounting a semiconductor device on the bump, wherein a heat spreader includes the bump and a base, the bump is adjacent to the base and extends vertically from the base in the first vertical direction, the base includes a portion of the ledge that is adjacent to and integral with and extends laterally from the bump and the semiconductor device extends beyond the bump in the first vertical direction, is located outside the cavity and extends laterally within a periphery of the cavity;
electrically connecting the semiconductor device to the pad, thereby electrically connecting the semiconductor device to the terminal; and
thermally connecting the semiconductor device to the bump, thereby thermally connecting the semiconductor device to the base,
wherein the cavity contains a filler that extends across most of the bump in the vertical and lateral directions and fills most or all of the cavity before mounting the semiconductor device,
wherein providing the filler includes depositing the filler into the cavity after solidifying the adhesive and before providing the conductive trace.

32. A method of making a semiconductor chip assembly, comprising:
providing a bump and a ledge, wherein the bump is adjacent to and integral with the ledge and extends vertically from the ledge in a first vertical direction, the ledge extends laterally from the bump in lateral directions orthogonal to the first vertical direction and a cavity in the bump faces in a second vertical direction opposite the first vertical direction, is covered by the bump in the first vertical direction and extends across most of the bump in the vertical and lateral directions;
providing an adhesive, wherein an opening extends through the adhesive;
providing a conductive layer, wherein an aperture extends through the conductive layer;
mounting the adhesive on the ledge, including inserting the bump into the opening, wherein the bump and the cavity extend into the opening;
mounting the conductive layer on the adhesive, including aligning the bump with the aperture, wherein the adhesive is sandwiched between the ledge and the conductive layer and is non-solidified; then
applying heat to melt the adhesive;
moving the ledge and the conductive layer towards one another, thereby moving the bump in the first vertical direction in the aperture and applying pressure to the molten adhesive between the ledge and the conductive layer, wherein the pressure forces the molten adhesive to flow in the first vertical direction into a gap located in the aperture between the bump and the conductive layer;
applying heat to solidify the molten adhesive, thereby mechanically attaching the bump and the ledge to the conductive layer; then
providing a conductive trace that includes a pad, a terminal and a selected portion of the conductive layer; then
mounting a semiconductor device on the bump, wherein a heat spreader includes the bump and a base, the bump is adjacent to the base and extends vertically from the base in the first vertical direction, the base includes a portion of the ledge that is adjacent to and integral with and extends laterally from the bump and the semiconductor device extends beyond the bump in the first vertical direction, is located outside the cavity and extends laterally within a periphery of the cavity;
electrically connecting the semiconductor device to the pad, thereby electrically connecting the semiconductor device to the terminal; and
thermally connecting the semiconductor device to the bump, thereby thermally connecting the semiconductor device to the base,
wherein the cavity contains a filler that extends across most of the bump in the vertical and lateral directions and fills most or all of the cavity before mounting the semiconductor device,
wherein providing the filler includes depositing the filler into the cavity and then grinding the filler such that the filler is laterally aligned at a lateral surface that faces in the second vertical direction.

\* \* \* \* \*